(12) United States Patent
Yamazaki et al.

(10) Patent No.: US 7,943,287 B2
(45) Date of Patent: May 17, 2011

(54) METHOD FOR MANUFACTURING DISPLAY DEVICE

(75) Inventors: Shunpei Yamazaki, Tokyo (JP);
Koichiro Tanaka, Kanagawa (JP);
Hironobu Shoji, Tokyo (JP); Yasuyuki Arai, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 959 days.

(21) Appl. No.: 11/881,232

(22) Filed: Jul. 26, 2007

(65) Prior Publication Data
US 2008/0182207 A1 Jul. 31, 2008

(30) Foreign Application Priority Data
Jul. 28, 2006 (JP) .................................. 2006-205624

(51) Int. Cl.
*G03F 7/00* (2006.01)
(52) U.S. Cl. ........... 430/319; 430/321; 430/945; 445/24
(58) Field of Classification Search .................. None
See application file for complete search history.

(56) References Cited

U.S. PATENT DOCUMENTS

| | | |
|---|---|---|
| 4,594,471 A | 6/1986 | Yamazaki |
| 4,603,470 A | 8/1986 | Yamazaki |
| 4,725,558 A | 2/1988 | Yamazaki et al. |
| 4,752,455 A | 6/1988 | Mayer |
| 4,861,964 A | 8/1989 | Sinohara |
| 4,895,735 A | 1/1990 | Cook |
| 4,927,493 A | 5/1990 | Yamazaki et al. |
| 4,937,129 A | 6/1990 | Yamazaki |
| 4,954,217 A | 9/1990 | Yamazaki et al. |
| 4,970,196 A | 11/1990 | Kim et al. |
| 4,970,368 A | 11/1990 | Yamazaki et al. |
| 4,975,145 A | 12/1990 | Yamazaki et al. |

(Continued)

FOREIGN PATENT DOCUMENTS

DE 4228274 A1 * 3/1994
(Continued)

OTHER PUBLICATIONS

Yamazaki, S. et al, "Mask-Less Fabrication of A-Si Solar Cell Using Laser Scribe Process," 17th IEEE Photovoltaic Specialists Conference, May 1-4, 1984, IEEE, 1984, pp. 206-211.

(Continued)

*Primary Examiner* — John A. McPherson
(74) *Attorney, Agent, or Firm* — Husch Blackwell LLP

(57) ABSTRACT

An object is to provide a display device that can be manufactured with increased use efficiency of a material by a simplified manufacturing process and a manufacturing technique thereof. A light-absorbing layer is formed, an insulating layer is formed over the light-absorbing layer, the light-absorbing layer and the insulating layer are selectively irradiated with laser light, so that an irradiated region of the light-absorbing layer and an irradiated region of the insulating layer are removed, and accordingly an opening is formed in the light-absorbing layer and the insulating layer, and a conductive film is formed in the opening so as to be in contact with the light-absorbing film. The conductive film is formed in the opening so as to be in contact with the exposed light-absorbing layer, so that the light-absorbing layer and the conductive film are electrically connected to each other with the insulating layer interposed therebetween.

12 Claims, 36 Drawing Sheets

U.S. PATENT DOCUMENTS

| | | | |
|---|---|---|---|
| 4,987,006 A | 1/1991 | Williams et al. | |
| 5,035,202 A | 7/1991 | Nishikawa et al. | |
| 5,089,426 A | 2/1992 | Yamazaki et al. | |
| 5,171,650 A | 12/1992 | Ellis et al. | |
| 5,173,441 A | 12/1992 | Yu et al. | |
| 5,187,601 A | 2/1993 | Yamazaki et al. | |
| 5,292,559 A | 3/1994 | Joyce, Jr. et al. | |
| 5,292,686 A | 3/1994 | Riley et al. | |
| 5,313,043 A | 5/1994 | Yamagishi | |
| 5,373,627 A | 12/1994 | Grebe | |
| 5,480,097 A | 1/1996 | Carter, Jr. et al. | |
| 5,501,938 A | 3/1996 | Ellis et al. | |
| 5,567,336 A | 10/1996 | Tatah | |
| 5,585,949 A | 12/1996 | Yamazaki et al. | |
| 5,683,601 A | 11/1997 | Tatah | |
| 5,708,252 A | 1/1998 | Shinohara et al. | |
| 5,866,444 A | 2/1999 | Yamazaki et al. | |
| 5,935,462 A | 8/1999 | Tatah | |
| 5,958,268 A | 9/1999 | Engelsberg et al. | |
| 6,048,588 A | 4/2000 | Engelsberg | |
| 6,149,988 A | 11/2000 | Shinohara et al. | |
| 6,159,832 A | 12/2000 | Mayer | |
| 6,177,151 B1 | 1/2001 | Chrisey et al. | |
| 6,261,856 B1 | 7/2001 | Shinohara et al. | |
| 6,335,151 B1 | 1/2002 | Ausschnitt et al. | |
| 6,445,005 B1 | 9/2002 | Yamazaki et al. | |
| 6,600,534 B1 | 7/2003 | Tanaka et al. | |
| 6,641,933 B1 | 11/2003 | Yamazaki et al. | |
| 6,670,637 B2 | 12/2003 | Yamazaki et al. | |
| 6,690,081 B2 | 2/2004 | Bakir et al. | |
| 6,726,517 B2 | 4/2004 | Yamada et al. | |
| 6,762,124 B2 | 7/2004 | Kian et al. | |
| 6,894,312 B2 | 5/2005 | Yamazaki et al. | |
| 6,962,837 B2 | 11/2005 | Yamazaki | |
| 6,964,887 B2 | 11/2005 | Akagawa | |
| 7,062,849 B2 | 6/2006 | Ohashi et al. | |
| 7,112,115 B1 | 9/2006 | Yamazaki et al. | |
| 7,112,374 B2 | 9/2006 | Yamazaki et al. | |
| 7,176,069 B2 | 2/2007 | Yamazaki et al. | |
| 7,180,197 B2 | 2/2007 | Nishi et al. | |
| 7,199,516 B2 | 4/2007 | Seo et al. | |
| 7,202,155 B2 | 4/2007 | Fukuchi | |
| 7,226,819 B2 | 6/2007 | Maekawa et al. | |
| 7,542,301 B1 | 6/2009 | Liong et al. | |
| 2002/0056838 A1 | 5/2002 | Ogawa | |
| 2002/0089628 A1 | 7/2002 | Jang et al. | |
| 2002/0127844 A1 | 9/2002 | Grill et al. | |
| 2002/0158337 A1 | 10/2002 | Babich et al. | |
| 2003/0048399 A1* | 3/2003 | Okumura | 349/113 |
| 2005/0043186 A1 | 2/2005 | Maekawa et al. | |
| 2005/0185382 A1 | 8/2005 | Ooi et al. | |
| 2005/0275049 A1 | 12/2005 | Kirby et al. | |
| 2006/0046336 A1 | 3/2006 | Shoji et al. | |
| 2006/0099747 A1 | 5/2006 | Park | |
| 2006/0158482 A1 | 7/2006 | Nakamura et al. | |
| 2006/0163743 A1 | 7/2006 | Kuwabara et al. | |
| 2006/0214156 A1 | 9/2006 | Pan et al. | |
| 2006/0270175 A1 | 11/2006 | Aoki et al. | |
| 2007/0007515 A1 | 1/2007 | Suh et al. | |
| 2007/0051952 A1 | 3/2007 | Yamazaki et al. | |
| 2007/0085938 A1 | 4/2007 | Yamazaki et al. | |
| 2007/0117280 A1* | 5/2007 | Lee et al. | 438/149 |
| 2008/0026543 A1 | 1/2008 | Miyairi et al. | |
| 2008/0042288 A1 | 2/2008 | Yamazaki et al. | |
| 2008/0044744 A1 | 2/2008 | Yamazaki et al. | |
| 2008/0050851 A1 | 2/2008 | Tanaka et al. | |
| 2008/0057618 A1 | 3/2008 | Honda et al. | |
| 2008/0057632 A1 | 3/2008 | Arai et al. | |
| 2008/0057718 A1 | 3/2008 | Omata et al. | |
| 2008/0182349 A1 | 7/2008 | Yamazaki et al. | |
| 2008/0227232 A1 | 9/2008 | Yamazaki et al. | |
| 2009/0152743 A1 | 6/2009 | Jomaa et al. | |

FOREIGN PATENT DOCUMENTS

| | | |
|---|---|---|
| JP | 2000-133636 | 5/2000 |
| JP | 2002-164591 | 6/2002 |
| JP | 2004-286466 | 10/2004 |

OTHER PUBLICATIONS

Yamazki, S. et al, "Fabrication of the Large-Area Integrated a-Si Solar Cells," The Materials Research Society, Mat. Res. Symp. Proc., vol. 70, Apr. 1986, pp. 487-492.

Office Action re Chinese appliction No. CN 200710137128.2, dated Apr. 23, 2010 (with English translation).

* cited by examiner

126

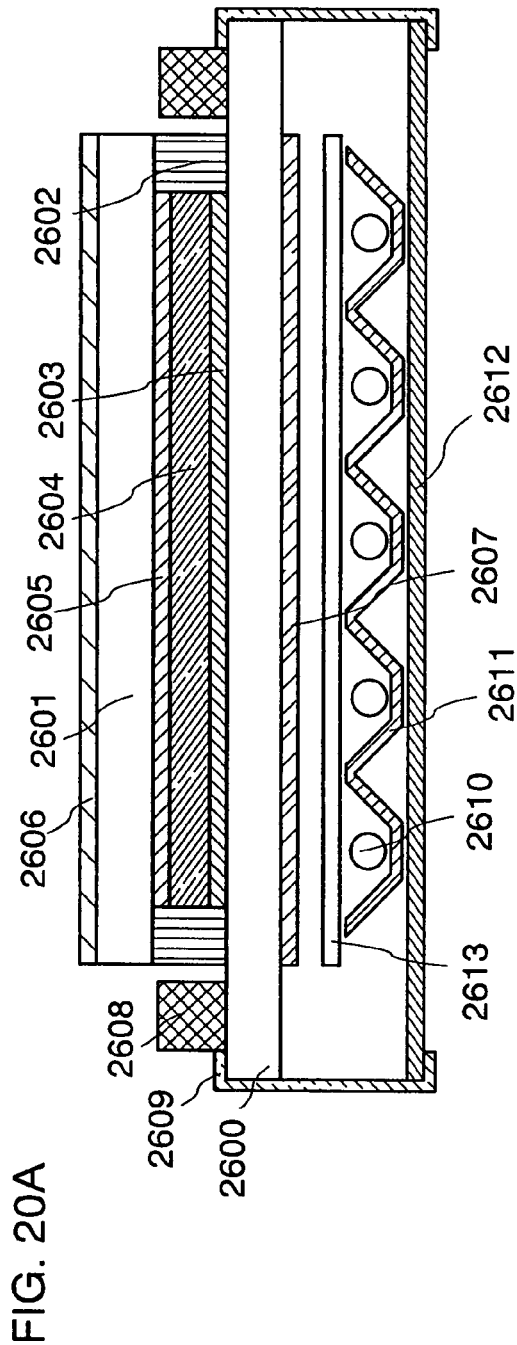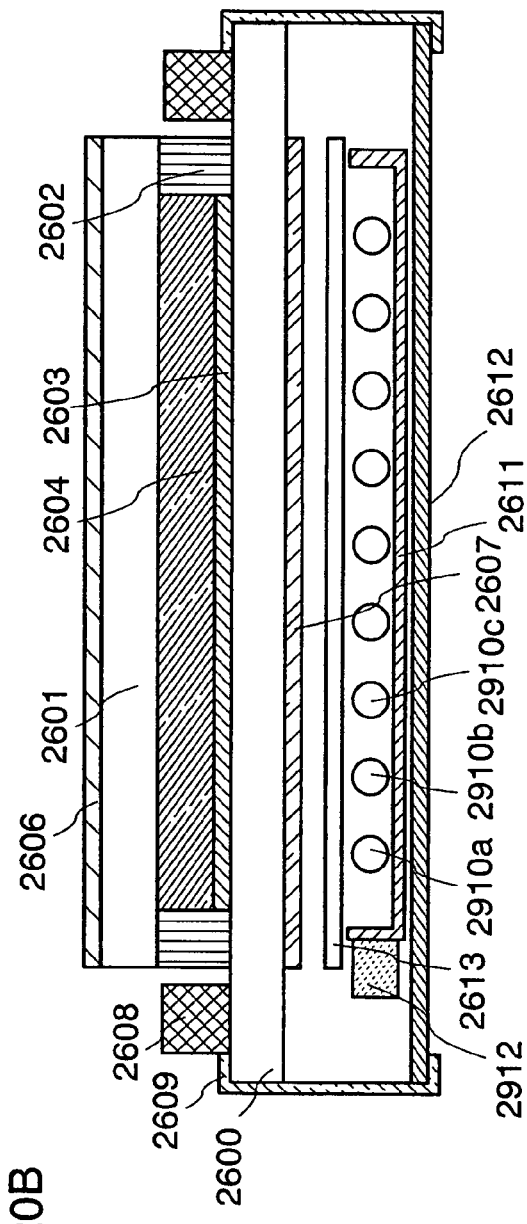
FIG. 20A
FIG. 20B 8500
8501
8502

METHOD FOR MANUFACTURING DISPLAY DEVICE

BACKGROUND OF THE INVENTION

1. Field of the Invention

The present invention relates to a method for manufacturing a display device having a stacked-layer structure including thin films. In particular, the present invention relates to a step of forming an opening in the thin films in a manufacturing process of the display device.

2. Description of the Related Art

A thin film transistor (hereinafter, also referred to as a "TFT") and an electronic circuit using the thin film transistor are manufactured in such a manner that various thin films such as a semiconductor film, an insulating film, and a conductive film are stacked over a substrate and a predetermined pattern is appropriately formed by a photolithography technique. The photolithography technique is a technique in which a pattern of a circuit or the like which is formed of a material that does not transmit light over a transparent flat plate, which is referred to as a photomask, is transferred to an aimed substrate with the use of light. The photolithography technique has been widely used in a manufacturing process of a semiconductor integrated circuit or the like.

A conventional manufacturing process using the photolithography technique needs multiple steps such as exposure, development, baking, and peeling only for treating a mask pattern formed of a photosensitive organic resin material that is referred to as a photoresist. Therefore, manufacturing cost is inevitably increased as the number of the photolithography steps is increased. In order to solve such a problem, manufacture of a TFT, using reduced number of photolithography steps has been attempted (for example, see Patent Document 1: Japanese Published Patent Application No. 2000-133636). In Patent Document 1, a resist mask formed by a photolithography step is once used, and then the volume of the resist mask is expanded by swelling, so that the resist mask is used again as a resist mask with a different shape.

SUMMARY OF THE INVENTION

It is an object of the present invention to provide a technique in which, in a manufacturing process of a TFT, an electronic circuit using the TFT, and a display device including the TFT, the manufacturing process is simplified by reduction in the number of photolithography steps, so that they can be manufactured over a large-area substrate with over 1 m on a side at low cost with high yield.

In the present invention, in the case where thin films (conductive layers or semiconductor layers) that are stacked with an insulating layer interposed therebetween are electrically connected to each other, an opening (a so-called contact hole) is formed in the insulating layer. In this case, an opening is selectively formed by laser light irradiation without forming a mask layer over the insulating layer. After a light-absorbing layer having a function of absorbing irradiated light is formed and an insulating layer is stacked over the light-absorbing layer, a region in the stacked layer formed of the light-absorbing layer and the insulating layer, where an opening is to be formed, is selectively irradiated with laser light from the insulating layer side. Although the laser light is transmitted through the insulating layer, the laser light is absorbed in the light-absorbing layer. The light-absorbing layer is heated by the energy of the absorbed laser light to be evaporated, so that the insulating layer stacked thereover is destroyed. Accordingly, the opening is formed in the light-absorbing layer and the insulating layer, and part of the light-absorbing layer under the insulating layer is exposed at a sidewall and bottom (or only at the sidewall) of the opening.

As long as the light-absorbing layer is formed of a conductive material such as a conductive layer using a conductive material or a semiconductor layer using a semiconductor material, by formation of a conductive film in the opening so as to be in contact with the exposed light-absorbing layer, the light-absorbing layer and the conductive film can be electrically connected to each other with the insulating layer interposed therebetween. That is, in the present invention, the opening is formed in the insulating layer that is formed over the light-absorbing layer serving as a conductive layer or a semiconductor layer, in such a manner that the light-absorbing layer is irradiated with laser light, and a laser light irradiated region of the light-absorbing layer is evaporated by laser ablation.

Since the opening can be selectively formed by the laser light, it is not necessary to form a mask layer; thus, the number of steps and materials can be reduced. In addition, since the laser light can be condensed into an extremely small spot, the light-absorbing layer and the insulating layer to be processed can be processed into a predetermined shape with a high degree of accuracy and can be heated instantaneously at short times; thus, there is an advantage in that the region except for the region to be processed does not have to be heated so much.

In addition, a conductive layer, a semiconductor layer, or the like which is used in processing a thin film into a desired pattern is selectively formed so as to have a desired shape without using a photolithography step. A light-absorbing film such as a conducive film or a semiconductor film is formed over a light-transmitting transfer substrate and the light-absorbing film is selectively irradiated with laser light from the transfer substrate side, so that the light-absorbing film corresponding to a laser light irradiated region is transferred to a substrate to which the light-absorbing film is transferred, and a conductive layer or a semiconductor layer that is a light-absorbing layer is formed with a predetermined shape (pattern). In this specification, the substrate over which the conductive film or the semiconductor film that is the light-absorbing film is formed in the first step and irradiated with laser light is referred to as the transfer substrate, and the substrate over which, lastly, the conductive layer or the semiconductor layer that is the light-absorbing layer is selectively formed is referred to as the substrate to which the light-absorbing film is transferred. The conductive layer or the semiconductor layer can be selectively formed so as to have a desired shape without using a photolithography step; thus, a simplified process, reduction in cost, and the like can be achieved.

According to one feature of a method for manufacturing a display device of the present invention, a light-absorbing layer is formed; an insulating layer is formed over the light-absorbing layer; the light-absorbing layer and the insulating layer are selectively irradiated with laser light to remove an irradiated region of the light-absorbing layer and an irradiated region of the insulating layer, so that an opening is formed in the light-absorbing layer and the insulating layer; and a conductive film is formed in the opening so as to be in contact with the light-absorbing layer.

According to another feature of a method for manufacturing a display device of the present invention, a light-absorbing layer is formed; an insulating layer is formed over the light-absorbing layer; the light-absorbing layer and the insulating layer are selectively irradiated with laser light to remove part of an irradiated region of the light-absorbing layer and an irradiated region of the insulating layer, so that an opening is formed in the light-absorbing layer and the insulating layer; and a conductive film is formed in the opening so as to be in contact with the light-absorbing layer.

According to another feature of a method for manufacturing a display device of the present invention, a conductive layer is formed; a light-absorbing layer is formed over the conductive layer; an insulating layer is formed over the light-absorbing layer; the light-absorbing layer and the insulating layer are selectively irradiated with laser light to remove an irradiated region of the light-absorbing layer and an irradiated region of the insulating layer, so that an opening is formed in the light-absorbing layer and the insulating layer; and a conductive film is formed in the opening so as to be in contact with the light-absorbing layer and the conductive layer.

According to another feature of a method for manufacturing a display device of the present invention, a conductive layer is formed; a light-absorbing layer is formed over the conductive layer; an insulating layer is formed over the light-absorbing layer; the light-absorbing layer and the insulating layer are selectively irradiated with laser light to remove part of an irradiated region of the light-absorbing layer and an irradiated region of the insulating layer, so that an opening is formed in the light-absorbing layer and the insulating layer; and a conductive film is formed in the opening so as to be in contact with the light-absorbing layer.

According to another feature of a method for manufacturing a display device of the present invention, a conductive layer is formed; a light-absorbing layer is formed over the conductive layer; an insulating layer is formed over the light-absorbing layer; the light-absorbing layer and the insulating layer are selectively irradiated with laser light to remove part of the conductive layer, an irradiated region of the light-absorbing layer, and an irradiated region of the insulating layer, so that an opening is formed in the conductive layer, the light-absorbing layer, and the insulating layer; and a conductive film is formed in the opening so as to be in contact with the light-absorbing layer and the conductive layer.

The light-absorbing layer formed in the above-described method is acceptable as long as it absorbs irradiated laser light. The light-absorbing layer can be a conductive layer when a conductive material is used and it can be a semiconductor layer when a semiconductor material is used. The light-absorbing layer can be used for any conductive or semiconductor layer that is included in a display device. For example, the conductive layer can be used for a wiring layer, a gate electrode layer, a source electrode layer, a drain electrode layer, a pixel electrode layer, or the like.

In the above-described structure, a conductive material can be used for the light-absorbing layer. For example, one or more kinds of chromium, tantalum, silver, molybdenum, nickel, titanium, cobalt, copper, and aluminum can be used for forming the light-absorbing layer. In addition, a semiconductor material can also be used for the light-absorbing layer. For example, an inorganic semiconductor material such as silicon, germanium, silicon germanium, gallium arsenic, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Moreover, hydrogen or an inert gas (such as helium (He), argon (Ar), krypton (Kr), neon (Ne), or xenon (Xe)) may be added to the light-absorbing layer. The insulating layer in which the opening is formed can be formed of a material that transmits laser light, for example, a light-transmitting inorganic insulating material, an organic resin, or the like.

The present invention can also be used for a display device that is a device with a display function. As an example of a display device using the present invention, the following is given: a light-emitting display device in which a TFT is connected to a light-emitting element in which a layer containing an organic matter or an inorganic matter performing light emission that is referred to as electroluminescence (hereinafter, also referred to as "EL") or a layer containing a mixture of the organic matter and the inorganic matter is interposed between electrodes, a liquid crystal display device using a liquid crystal element having a liquid crystal material as a display element, or the like. In the present invention, a display device means a device having a display element (such as a liquid crystal element or a light-emitting element). It is to be noted that the display device may mean a display panel itself in which a plurality of pixels including a display element such as a liquid crystal element or an EL element and a peripheral driver circuit for driving these pixels are formed over a substrate. In addition, an IC, a resistance element, a capacitor, an inductor, a transistor, or the like to which a flexible printed circuit (FPC) or a printed wiring board (PWB) is attached may also be included. Moreover, an optical sheet such as a polarizing plate or a retardation film may also be included. Furthermore, a backlight (which may include a light guide plate, a prism sheet, a diffusion sheet, a reflection sheet, or a light source (such as an LED or a cold cathode tube) may also be included.

It is to be noted that the display element or the display device can use various modes and have various elements. For example, the following can be applied: a display medium in which contrast is changed by an electromagnetic effect, such as an EL element (an organic EL element, an inorganic EL element, or an EL element containing an organic matter and an inorganic matter), an electron-emitting element, a liquid crystal element, an electronic ink, a grating light valve (GLV), a plasma display (PDP), a digital micromirror device (DMD), a piezoelectric ceramic display, or a carbon nanotube. It is to be noted that a display device using an EL element includes an EL display; a display device using an electron-emitting element includes a field emission display (FED), an SED type flat panel display (SED: Surface-conduction Electron-emitter Display), and the like; a display device using a liquid crystal element includes a liquid crystal display, a transmissive liquid crystal display, a semi-transmissive liquid crystal display, and a reflective liquid crystal display; and a display device using electronic ink includes an electronic paper.

In addition, with the use of the present invention, a device having a circuit including a semiconductor element (such as a transistor, a memory element, or a diode), and a semiconductor device such as a chip including a processor circuit can be manufactured. It is to be noted that, in the present invention, the semiconductor device includes a device that can operate utilizing semiconductor characteristics.

By the present invention, components such as a wiring that are included in a display device or the like and a contact hole that electrically connects the components with an insulting layer interposed therebetween can be formed with a complicated photolithography step reduced. Therefore, a display device can be manufactured by a simplified process. Thus, materials are seldom wasted and reduction in cost can be achieved. A high-performance and highly reliable display device can be manufactured with high yield.

BRIEF DESCRIPTION OF DRAWINGS

In the accompanying drawings:

FIGS. 20A and 20B are cross-sectional views each explaining a structural example of a display module of the present invention;

DETAILED DESCRIPTION OF THE INVENTION

Embodiment Mode

Figure 1A:
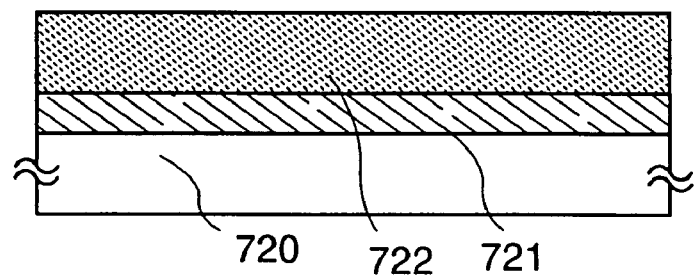
FIGS. 1A to 1D are conceptual diagrams explaining the present invention.

Embodiment modes of the present invention will be hereinafter explained with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention should not be interpreted as being limited to the description of Embodiment Mode. It is to be noted that, in the drawings hereinafter shown, the same portions or portions having similar functions are denoted by the same reference numerals, and repeated explanation thereof will be omitted.

Embodiment Mode 1

In this embodiment mode, a method for forming a contact hole for the purpose of formation by a highly reliable and more-simplified process at low cost will be explained with reference to FIGS. 1A to 1D and FIGS. 2A to 2D.

When thin films (conductive layers or semiconductor layers) that are stacked with an insulating layer interposed therebetween are electrically connected to each other, an opening (a so-called contact hole) is formed in the insulating layer. In this case, the opening is selectively formed by laser light irradiation without forming a mask layer over the insulating layer. A light-absorbing layer having a function of absorbing irradiated light is formed and the insulating layer is stacked over the light-absorbing layer, and thereafter, a region in the stacked layer formed of the light-absorbing layer and the insulating layer, where the opening is to be formed, is selectively irradiated with laser light from the insulating layer side. Although the laser light is transmitted through the insulating layer, the laser light is absorbed in the light-absorbing layer. The light-absorbing layer is heated by the energy of the absorbed laser light to be evaporated, so that the insulating layer stacked thereover is destroyed. Accordingly, the opening is formed in the light-absorbing layer and the insulating layer and part of the light-absorbing layer under the insulating layer is exposed at a sidewall and bottom (or only at the sidewall) of the opening.

If the light-absorbing layer is formed of a conductive material such as a conductive layer using a conductive material or a semiconductor layer using a semiconductor material, by formation of a conductive film in the opening so as to be in contact with the exposed light-absorbing layer, the light-absorbing layer and the conductive film can be electrically connected to each other with the insulating layer interposed therebetween. That is, in the present invention, the light-absorbing layer is irradiated with laser light, so that the opening is formed in the insulating layer that is formed over the light-absorbing layer serving as the conductive layer or the semiconductor layer, and the opening is formed in the insulating layer over a laser light irradiated region of the light-absorbing layer by laser ablation.

Since the opening can be selectively formed by the laser light, it is not necessary to form a mask layer; thus the number of steps and materials can be reduced. In addition, since the laser light can be condensed into an extremely small spot, the insulating layer to be processed can be processed into a predetermined shape with a high degree of accuracy and can be heated instantaneously at short times; thus, there is an advantage in that the region except for the region to be processed does not have to be heated so much.

A specific explanation is given with reference to FIGS. 1A to 1D. In this embodiment mode, as shown in FIGS. 1A to 1D, a light-absorbing layer 721 and an insulating layer 722 are formed over a substrate 720. In this embodiment mode, a conductive material is used for the light-absorbing layer 721, so that the light-absorbing layer 721 can serve as a conductive layer. In this embodiment mode, chromium is used for the light-absorbing layer 721.

Figure 1B:
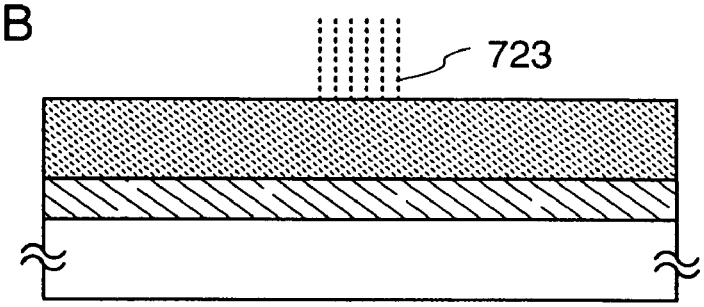
Figure 1C:
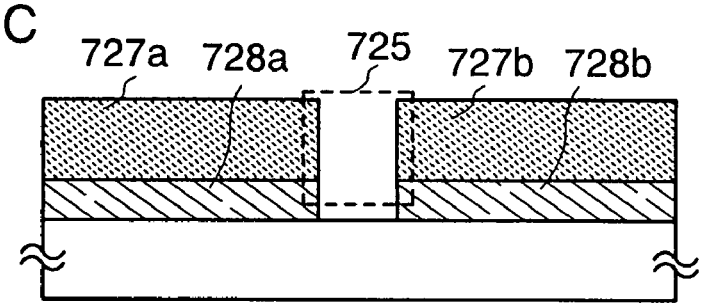
Figure 1D:
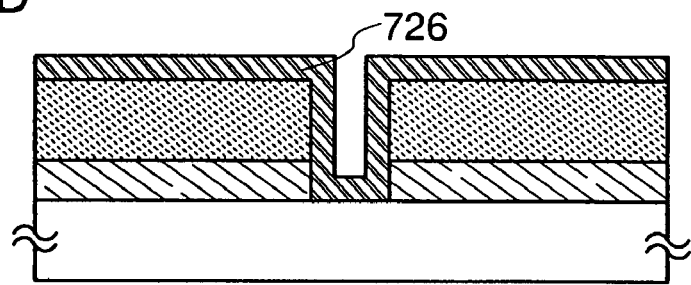

As shown in FIG. 1B, the light-absorbing layer 721 is selectively irradiated with laser light 723 from the insulating layer 722 side. An irradiated region of the light-absorbing layer 721 is evaporated by the energy of the irradiated light, and the insulating layer 722 over the irradiated region of the light-absorbing layer 721 is removed. Accordingly, an opening 725 can be formed. The light-absorbing layer 721 is separated into light-absorbing layers 728a and 728b and the insulating layer 722 is separated into insulating layers 727a and 727b (see FIG. 1C). A conductive film 726 is formed in the opening 725 where the light-absorbing layer 721 and the substrate 720 are exposed, so that the light-absorbing layer 721 and the conductive film 726 can be electrically connected to each other (see FIG. 1D).

Figure 30:
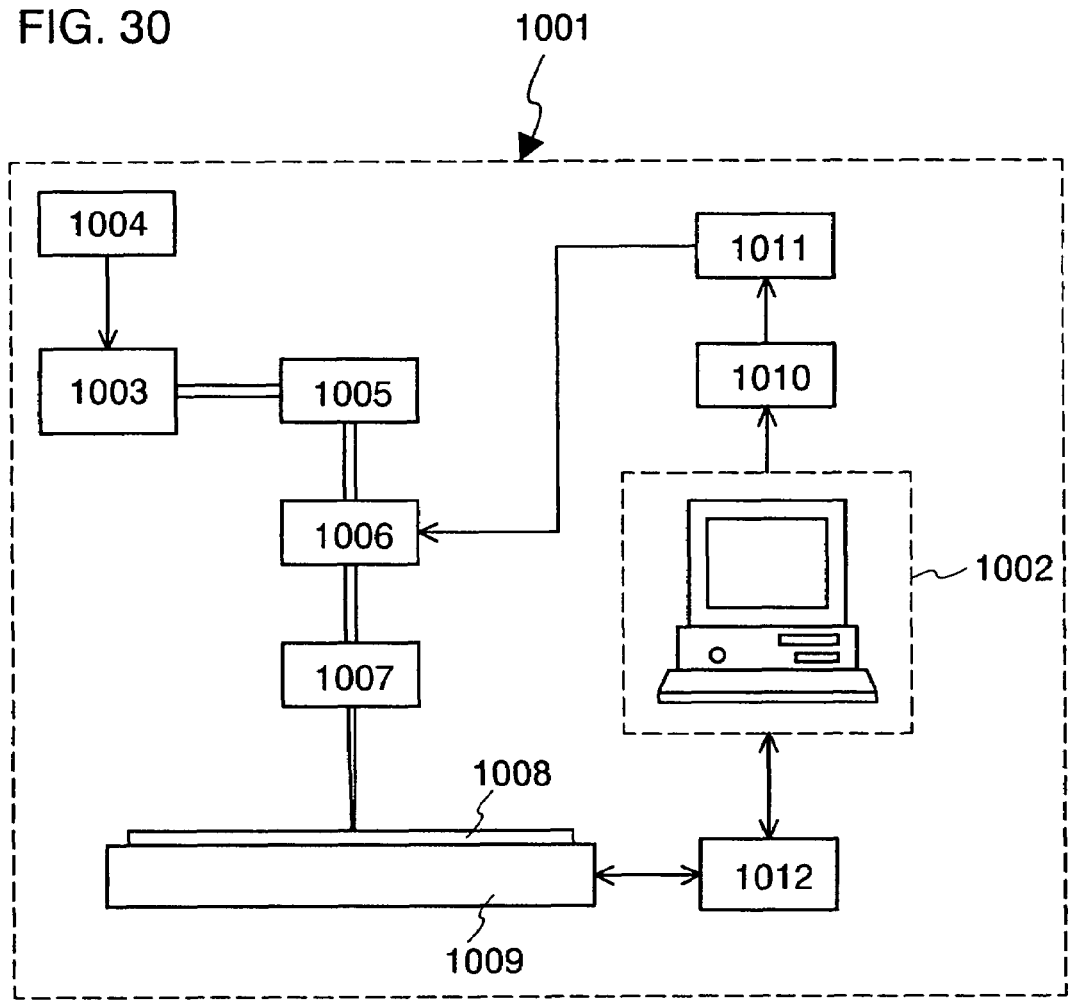
FIG. 30 is a view explaining a structure of a laser beam direct writing system which can be applied to the present invention.

A laser beam direct writing system for emitting laser light (also referred to as a laser beam) to a region to be processed is explained with reference to FIG. 30. In this embodiment mode, a laser beam is directly emitted to the region to be processed; therefore, the laser beam direct writing system is used. As shown in FIG. 30, a laser beam direct writing system 1001 is provided with a personal computer (hereinafter, denoted by PC) 1002 that performs various controls in emitting a laser beam; a laser oscillator 1003 that outputs the laser beam; a power supply 1004 of the laser oscillator 1003; an optical system (an ND filter) 1005 for attenuating the laser beam; an acousto-optic modulator (AOM) 1006 for modulating the intensity of the laser beam; an optical system 1007 that includes a lens for increasing and reducing the size of a cross-section of the laser beam, a mirror for changing an optical path, and the like; a substrate transfer mechanism 1009 having an X-axis stage and a Y-axis stage; a D/A converter portion 1010 for digital-analog conversion of control data outputted from the PC; a driver 1011 that controls the acousto-optic modulator 1006 in accordance with analog voltage outputted from the D/A converter portion; and a driver 1012 that outputs a driving signal for driving the substrate transfer mechanism 1009.

As the laser oscillator 1003, a laser oscillator capable of oscillating ultraviolet light, visible light, or infrared light can be used. As the laser oscillator, an excimer laser oscillator of KrF, ArF, XeCl, Xe, or the like; a gas laser oscillator of He, He—Cd, Ar, He—Ne, HF, or the like; a solid-state laser oscillator using a crystal of YAG, $GdVO_4$, $YVO_4$, YLF, $YAlO_3$ or the like doped with Cr, Nd, Er, Ho, Ce, Co, Ti, or Tm; or a semiconductor laser oscillator of GaN, GaAs, GaAlAs, InGaAsP, or the like can be used. Further, as for the solid-state laser oscillator, the fundamental wave or any of the second to fifth harmonics is preferably employed. In order to adjust a shape and path of laser light emitted from the laser oscillator, an optical system including a reflector such as a shutter, a mirror, or a half mirror; a cylindrical lens; a convex lens; or the like may be provided.

Laser crystallization may be performed using pulsed laser light with a repetition rate of greater than or equal to 0.5 MHz and using a frequency band that is much higher than a generally used frequency band of several tens to several hundreds Hz. A pulsed laser having a pulse width on the order of picoseconds or on the order of femtoseconds ($10^{-15}$ seconds) may also be used.

Moreover, laser light irradiation may be performed in an inert gas atmosphere of a rare gas, nitrogen, or the like, or may be performed under reduced pressure.

Next, modification treatment of a film with the use of the laser beam direct writing system is described. When a substrate 1008 is attached to the substrate transfer mechanism 1009, the PC 1002 detects the location of a marker attached to the substrate by a camera that is not shown in the drawing. Then, the PC 1002 generates transfer data for transferring the substrate transfer mechanism 1009 based on detected location data of the marker and exposure pattern data that is inputted in advance. Thereafter, the PC 1002 controls the amount of output light of the acousto-optic modulator 1006 through the driver 1011, so that a laser beam outputted from the laser oscillator 1003 is attenuated by the optical system 1005, and then the light amount thereof is controlled by the acousto-optic modulator 1006 so as to be predetermined light amount. On the other hand, a laser beam outputted from the acousto-optic modulator 1006 changes its optical path and beam shape with the optical system 1007, and is condensed by the lens, and then, emitted to a base film formed over the substrate, so that modification treatment of the film is performed. At this time, in accordance with the transfer data generated by the PC 1002, the substrate transfer mechanism 1009 is controlled to transfer in the X direction and Y direction. Consequently, the laser beam is emitted to a predetermined place and the modification treatment of the film is performed.

When a wavelength of laser light is shorter, the laser beam can be condensed into a smaller beam diameter; therefore, in order to process a region with a minute width, a laser beam with a short wavelength is preferably emitted.

In addition, a spot shape of the laser beam on a surface of the film is processed so as to be point-like, circular, oblong, rectangular, or liner (elongated rectangle, to be exact) by the optical system.

Although the example in which the system shown in FIG. 30 performs exposure in such a manner that the laser light is emitted from a surface side of the substrate is described, a laser beam direct writing system in which the optical system or the substrate transfer mechanism is appropriately changed and the laser light is emitted from the rear surface side of the substrate may be employed.

It is to be noted that, although a laser beam is selectively emitted while the substrate is moved here, the present invention is not limited thereto. The laser beam can be emitted while scanning the laser beam in the X- and Y-axis directions.

In this case, a polygon mirror or a galvanometer mirror is preferably used for the optical system 1007.

The light-absorbing layer 721 can be formed by an evaporation method, a sputtering method, a PVD method (Physical Vapor Deposition), a CVD method (Chemical Vapor Deposition) such as a low-pressure CVD method (an LPCVD method) or a plasma CVD method, or the like. In addition, a method by which a component can be transferred or drawn into a desired pattern, for example, various printing methods (a method by which a component can be formed with a desired pattern, such as screen (mimeograph) printing, offset (planography) printing, relief printing, or gravure (intaglio) printing), a dispenser method, a selective coating method, or the like can be used.

The light-absorbing layer 721 can be formed of one or more kinds of chromium, molybdenum, nickel, titanium, cobalt, copper, tungsten, and aluminum. In addition, a semiconductor material can also be used as the light-absorbing layer. For example, the following inorganic semiconductor material can be used: silicon, germanium, silicon germanium, gallium arsenic, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate. Also, hydrogen or an inert gas (such as helium (He), argon (Ar), krypton (Kr), neon (Ne), or xenon (Xe)) may be added to the light-absorbing layer.

In FIGS. 1A to 1D, an example is shown, in which the light-absorbing layer 721 is evaporated by irradiation of the laser light 723, so that the opening 725 is formed in the insulating layer 722, and the light-absorbing layer under the insulating layer is removed by laser ablation until the substrate 720 is exposed. Another example in which an opening reaching a light-absorbing layer formed under an insulating layer is formed is shown in FIGS. 2A to 2D.

In FIGS. 2A to 2D, an example is shown, in which laser ablation is performed by laser light to only an upper portion of a light-absorbing layer under an insulating layer, and the light-absorbing layer remains at a bottom surface of an opening. As shown in FIGS. 2A to 2D, a light-absorbing layer 701 and an insulating layer 702 are formed over a substrate 700. In this embodiment mode, a conductive material is used for the light-absorbing layer 701, so that the light-absorbing layer 701 can serve as a conductive layer. In this embodiment mode, chromium is used for the light-absorbing layer 701.

Figure 2A:
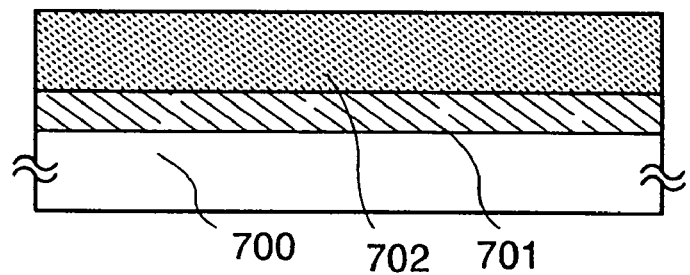
FIGS. 2A to 2D are conceptual diagrams explaining the present invention.
Figure 2B:
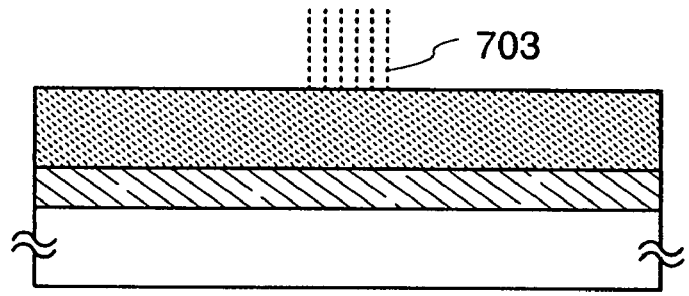
Figure 2C:
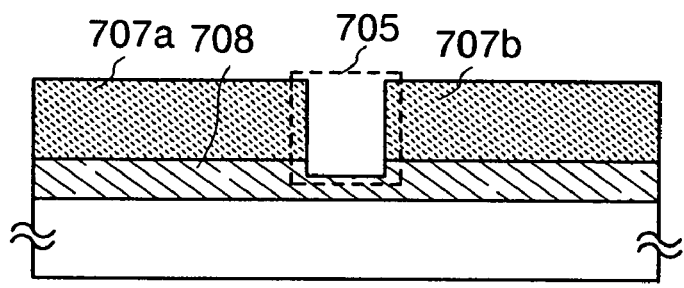
Figure 2D:
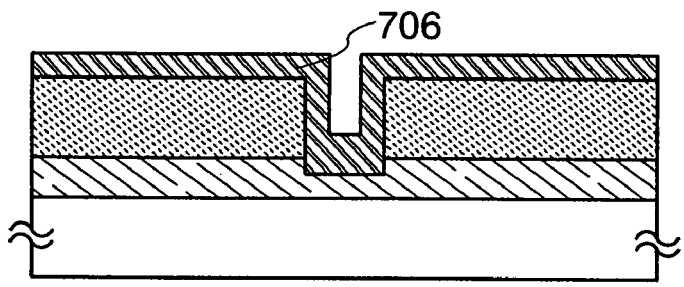

As shown in FIG. 2B, the light-absorbing layer 701 is selectively irradiated with laser light 703 from the insulating layer 702 side. Part of an irradiated region of the light-absorbing layer 701 is evaporated by the irradiated energy, so that the insulating layer 702 over the irradiated region of the light-absorbing layer 701 is removed. Accordingly, an opening 705 can be formed. The light-absorbing layer 701 is processed into a light-absorbing layer 708 and the insulating layer 702 is separated into insulating layers 707a and 707b (see FIG. 2C). A conductive film 706 is formed in the opening 705 where the light-absorbing layer 701 is exposed, so that the light-absorbing layer 701 and the conductive film 706 can be electrically connected to each other (see FIG. 2D).

As for a shape of the opening serving as a contact hole, a side surface does not have to be perpendicular to a bottom surface, and a side of the opening may have a tapered shape. For example, the opening may have a mortar shape in which the side thereof has a tapered shape with respect to the bottom surface.

In this manner, the light-absorbing layer under the insulating layer and the conductive film over the insulating layer are electrically connected to each other in the opening provided in the insulating layer. The size and shape of the opening formed in the insulating layer can be controlled by irradiation conditions of laser light (such as energy density and irradiation time) and characteristics (such as heat conductivity, melting point, and boiling point) of materials for the insulating layer and the conductive layer.

The size of the opening with respect to an irradiated region that is determined by a diameter of laser light depends on the amount of energy of the laser light. When the energy of the laser light is sufficiently large, the energy reaches a periphery of the irradiated region, so that an opening that is larger than the irradiated region of the laser light is formed in the insulating layer. On the other hand, when the energy of the laser light is small, an opening with the size that is about the same as that of the irradiated region is formed in the insulating layer.

As described above, by control of the energy of the laser light, the size of the opening formed in the insulating layer can be appropriately controlled.

After the opening is formed by the laser light irradiation, a conductive material or an insulating material (a residue in a removed portion in the conductive layer or the insulating layer) that remains around the opening may be washed with liquid, so that the residue is removed. In this case, a nonreactive substance such as water may be used for washing, or alternatively, a chemical solution such as etchant that reacts to (dissolves) the insulating layer may be used. When etchant is used, the opening is overetched and dust or the like is removed, so that the surface is more planarized. In addition, the opening can be expanded.

Since the opening can be selectively formed by laser light, it is not necessary to form a mask layer; thus the number of steps and materials can be reduced. In addition, since laser light can be condensed into an extremely small spot, the conductive layer and the insulating layer to be processed can be processed into a predetermined shape with a high degree of accuracy and can be heated instantaneously at short times; thus, there is an advantage in that the region except for the region to be processed does not have to be heated so much.

As described above, the opening (the contact hole) in which the conductive layers are electrically connected to each other can be formed in the insulating layer without a complicated photolithography step and formation of a mask layer.

Therefore, when a display device is manufactured by the present invention, a process can be simplified. Thus, materials are seldom wasted and cost reduction can be achieved. Therefore, the display device can be manufactured with high yield.

Embodiment Mode 2

In this embodiment mode, a method for forming a contact hole for the purpose of formation by a highly reliable and more-simplified process at low cost will be explained with reference to FIGS. 34A to 34D, FIGS. 35A to 35D, and FIGS. 36A to 36D.

In this embodiment mode, an example is shown, in which a conductive film is electrically connected to a stacked layer formed of a light-absorbing layer and a conductive layer, with an insulating layer interposed therebetween in Embodiment Mode 1.

A specific explanation is given with reference to FIGS. 34A to 34D. In this embodiment mode, as shown in FIGS. 34A to 34D, a conductive layer 739, a light-absorbing layer 731, and an insulating layer 732 are formed over a substrate 730. In this embodiment mode, a conductive material is used for the light-absorbing layer 731, so that the light-absorbing layer 731 can serve as a conductive layer. In addition, the conductive layer 739 may be formed using a material that absorbs laser light, so that the conductive layer 739 serves as a light-absorbing layer.

The conductive layer 739 and the light-absorbing layer 731 form a stacked layer. In this embodiment mode, a low melting point metal that is comparatively easy to be evaporated (chromium in this embodiment) is used for the light-absorbing layer 731, and a high melting point metal that is not easily evaporated in comparison with that used for the light-absorbing layer 731 (tungsten in this embodiment mode) is used for the conductive layer 739.

Figure 34A:
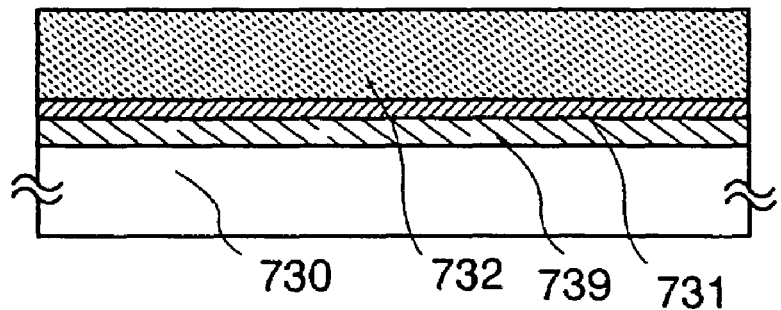
FIGS. 34A to 34D are conceptual diagrams explaining the present invention.
Figure 34B:
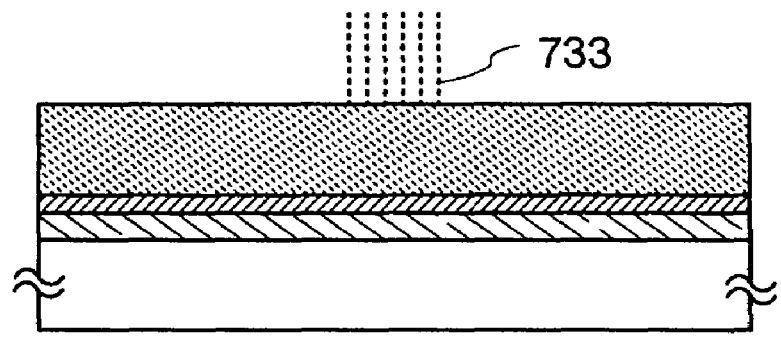
Figure 34C:
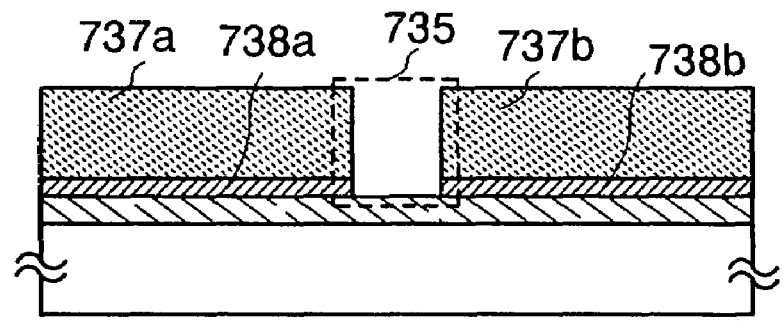
Figure 34D:
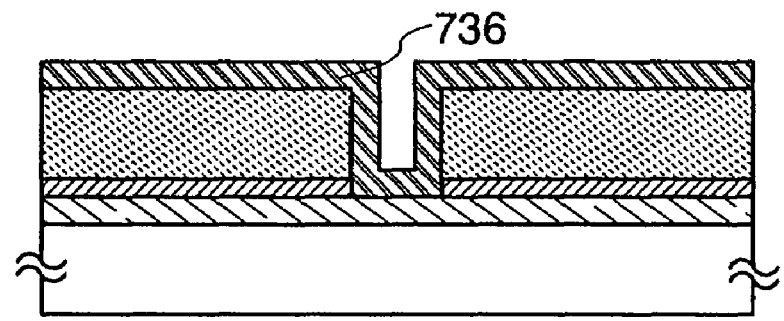

As shown in FIG. 34B, the light-absorbing layer 731 is selectively irradiated with laser light 733 from the insulating layer 732 side. An irradiated region of the light-absorbing layer 731 is evaporated by the irradiated energy, so that the insulating layer 732 over the irradiated region of the light-absorbing layer 731 is removed. Accordingly, an opening 735 reaching the conductive layer 739 can be formed. The light-absorbing layer 731 is separated into light-absorbing layers 738a and 738b and the insulating layer 732 is separated into insulating layers 737a and 737b (see FIG. 34C). A conductive film 736 is formed in the opening 735 where the conductive layer 739 and the light-absorbing layer 731 are exposed, so that the conductive layer 739, the light-absorbing layer 731, and the conductive film 736 can be electrically connected to each other (see FIG. 34D).

In FIGS. 34A to 34D, an example is shown, in which the light-absorbing layer 731 is evaporated by irradiation of the laser light 733, so that the opening 735 is formed in the insulating layer 732, and the light-absorbing layer under the insulating layer is removed by laser ablation until the conductive layer 739 is exposed. Another example in which an opening reaching a light-absorbing layer formed under an insulating layer is formed is shown in FIGS. 35A to 35D.

In FIGS. 35A to 35D, an example is shown, in which laser ablation is performed to only an upper portion of a light-absorbing layer under an insulating layer, and the light-absorbing layer remains at a bottom surface of an opening. As shown in FIGS. 35A to 35D, a conductive layer 719, a light-absorbing layer 711, and an insulating layer 712 are formed over a substrate 710. In this embodiment mode, a conductive material is used for the light-absorbing layer 711, so that the light-absorbing layer 711 can serve as a conductive layer. In addition, the conductive layer 719 may be formed using a material that absorbs laser light, so that the conductive layer 719 serves as a light-absorbing layer.

The conductive layer 719 and the light-absorbing layer 711 form a stacked layer. In this embodiment mode, a low melting point metal that is comparatively easy to be evaporated (chromium in this embodiment mode) is used for the light-absorbing layer 711, and a high melting point metal that is not easily evaporated in comparison with that used for the light-absorbing layer 711 (tungsten in this embodiment mode) is used for the conductive layer 719.

Figure 35A:
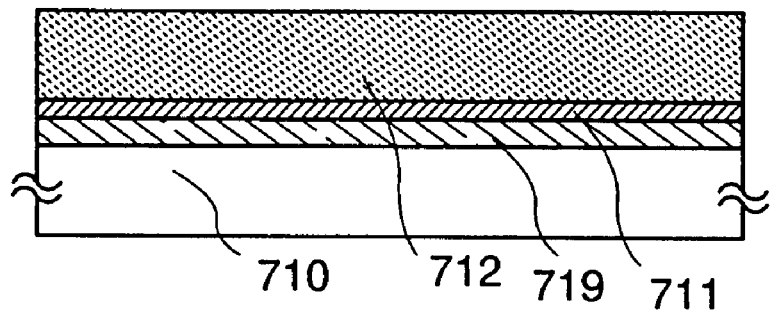
FIGS. 35A to 35D are conceptual diagrams explaining the present invention.
Figure 35B:
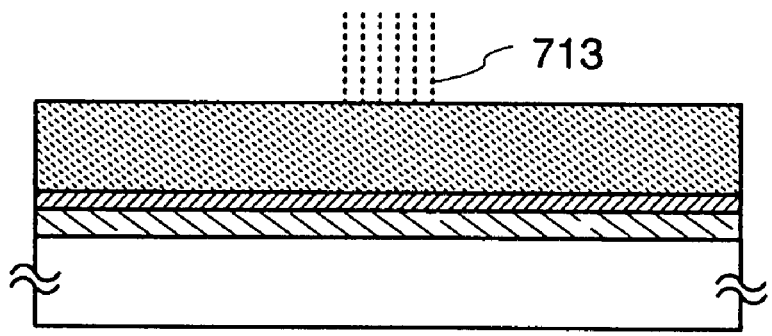
Figure 35C:
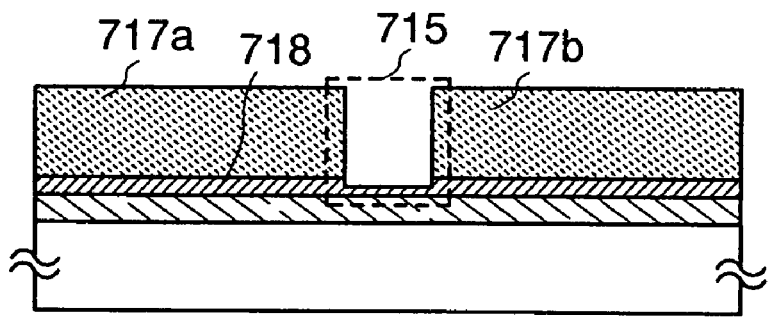
Figure 35D:
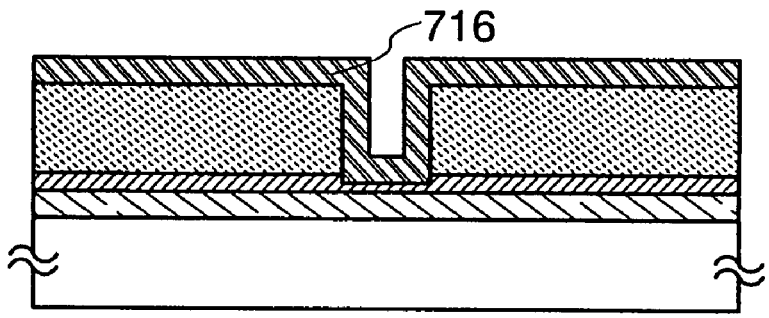

As shown in FIG. 35B, the light-absorbing layer 711 is selectively irradiated with laser light 713 from the insulating layer 712 side. Part of an irradiated region of the light-absorbing layer is evaporated by the irradiated energy, so that the insulating layer 712 over the irradiated region of the light-absorbing layer 711 is removed. Accordingly, an opening 715 can be formed. The light-absorbing layer 711 is processed into a light-absorbing layer 718 and the insulating layer 712 is separated into insulating layers 717a and 717b (see FIG. 35C). A conductive film 716 is formed in the opening 715 where the light-absorbing layer 718 is exposed, so that the conductive layer 719, the light-absorbing layer 711, and the conductive film 716 can be electrically connected to each other (see FIG. 35D).

In addition, the conductive layer under the light-absorbing layer may be removed by laser light irradiation, so that an opening is formed. The opening formed in the conductive layer may be formed until the substrate is exposed, or may be formed in such a manner that only an upper portion of the conductive layer is removed and the other portion of the conductive layer remains on a bottom surface of the opening. In FIGS. 36A to 36D, an example is shown, in which an opening is formed by removal of a conductive layer under a light-absorbing layer.

As shown in FIGS. 36A to 36D, a conductive layer 749, a light-absorbing layer 741, and an insulating layer 742 are formed over a substrate 740. In this embodiment mode, a conductive material is used for the light-absorbing layer 741, so that the light-absorbing layer 741 can serve as a conductive layer. In addition, the conductive layer 749 may be formed of a material that absorbs laser light, so that the conductive layer 749 serves as a light-absorbing layer.

The conductive layer 749 and the light-absorbing layer 741 form a stacked layer. In this embodiment mode, a low melting point metal that is comparatively easy to be evaporated (chromium in this embodiment mode) is used for the light-absorbing layer 741, and a high melting point metal that is not easily evaporated in comparison with that used for the light-absorbing layer 741 (tungsten in this embodiment mode) is used for the conductive layer 749.

Figure 36A:
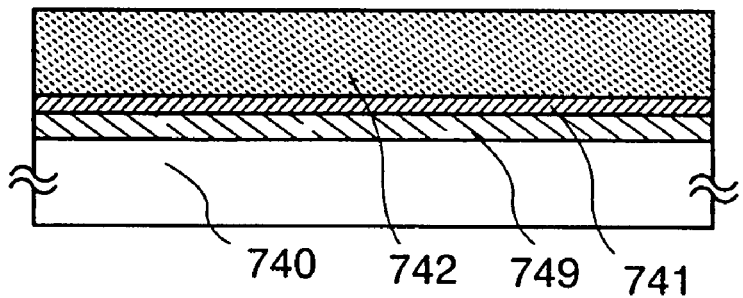
FIGS. 36A to 36D are conceptual diagrams explaining the present invention.
Figure 36B:
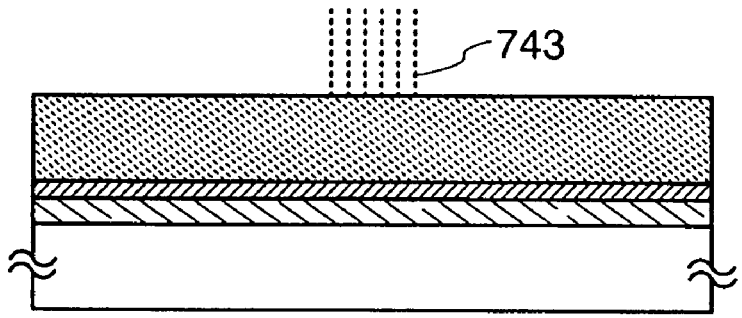
Figure 36C:
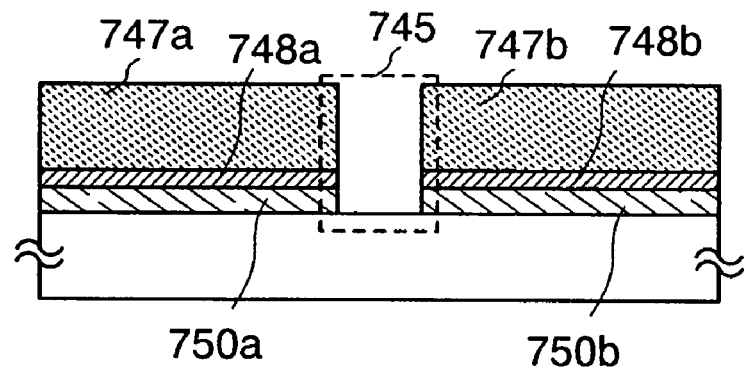
Figure 36D:
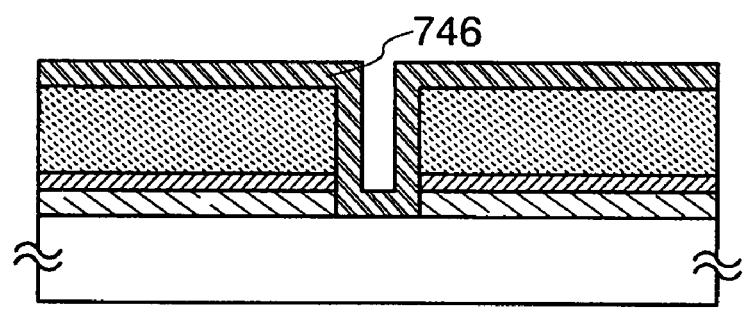

As shown in FIG. 36B, the light-absorbing layer 741 is selectively irradiated with laser light 743 from the insulating layer 742 side. Irradiated regions of the conductive layer and the light-absorbing layer are evaporated by the irradiated energy, so that the insulating layer 742 over the irradiated region of the light-absorbing layer 741 is removed. Accordingly, an opening 745 reaching the substrate 740 can be formed. The conductive layer 749 is separated into conductive layers 750a and 750b, the light-absorbing layer 741 is separated into light-absorbing layers 748a and 748b, and the insulating layer 742 is separated into insulating layers 747a and 747b (see FIG. 36C). A conductive film 746 is formed in the opening 745 where the conductive layers 750a and 750b and the light-absorbing layers 748a and 748b are exposed, so that the conductive layers 750a and 750b, the light-absorbing layer 748a and 748b, and the conductive film 746 can be electrically connected to each other (see FIG. 36D).

As described above, a conductive layer (or a semiconductor layer) may be stacked over a light-absorbing layer. In addition, a plurality of light-absorbing layers and/or a plurality of conductive layers may be stacked.

After the opening is formed by the laser light irradiation, a conductive material or an insulating material (a residue in a removed portion in the conductive layer or the insulating layer) that remains around the opening may be washed with liquid, so that the residue is removed. In this case, a non-responsive substance such as water may be used for washing, or alternatively, a chemical such as etchant that is reactive with (dissolves) the insulating layer may be used. When etchant is used, the opening is overetched and dust or the like is removed, so that the surface is more planarized. In addition, the opening can be expanded.

As described above, in the opening provided in the insulating layer, the light-absorbing layer under the insulating layer and the conductive film over the insulating layer are electrically connected to each other. In this embodiment, the light-absorbing layer formed of a metal with a high sublimation property is formed over the conductive layer and the energy by laser light is given to the light-absorbing layer, so that the opening is formed in the insulating layer formed over the light-absorbing layer and the conductive layer. The size and shape of the opening formed in the insulating layer can be controlled by irradiation conditions of laser light (such as energy density and irradiation time) and characteristics (such as heat conductivity, melting point, and boiling point) of materials for the insulating layer and the conductive layer. An example of the size of laser light and the opening to be formed is shown in FIGS. 4A to 4D.

Conductive layer 309 (309a, 309b, and 309c) and a light-absorbing layer 301 are stacked to be formed over a substrate 300 and an insulating layer 302 is formed so as to cover the conductive layer 309 (309a, 309b, and 309c) and the light-absorbing layer 301. In FIGS. 4A to 4D, the conductive layer 309 (309a, 309b, and 309c) indicates a stacked-layer structure including a plurality of thin films. For example, titanium, aluminum, titanium, and chromium can be used for the conductive layer 309a, the conductive layer 309b, the conductive layer 309c, and the light-absorbing layer 301, respectively. Alternatively, tungsten or molybdenum can be used for the conductive layer 309 (309a, 309b, and 309c). Needless to say, the light-absorbing layer 301 may have a stacked-layer structure, and a stacked layer formed of copper and chromium, or the like can be used.

Figure 4A:
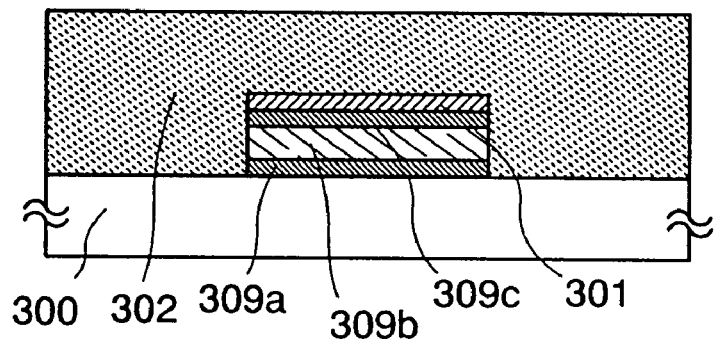
FIGS. 4A to 4D are conceptual diagrams explaining the present invention.
Figure 4B:
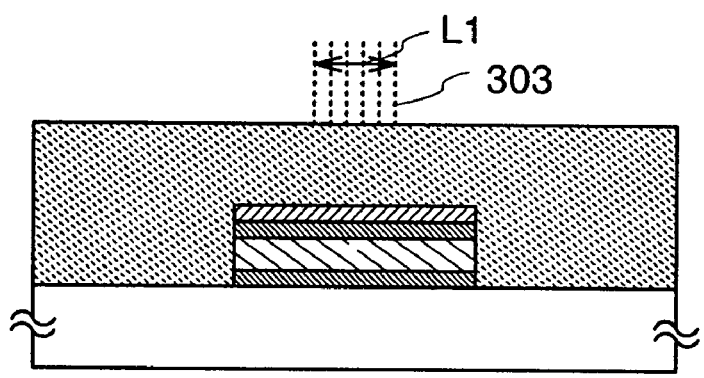
Figure 4C:
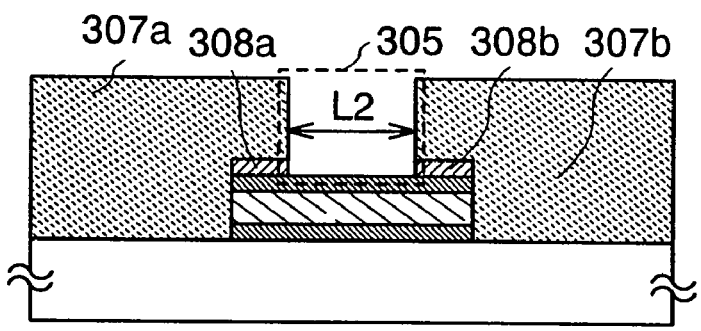
Figure 4D:
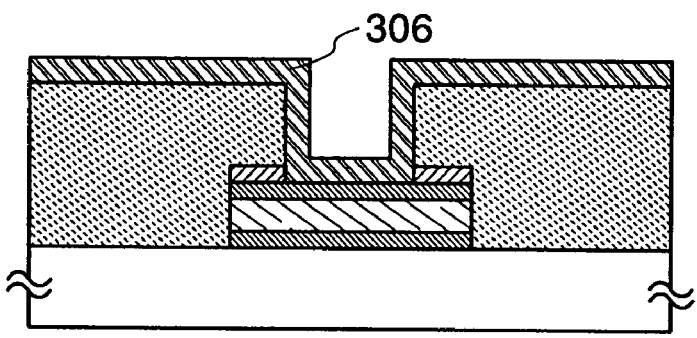

The insulating layer 302 and the light-absorbing layer 301 are selectively irradiated with laser light 303 with a laser diameter L1. As shown in FIG. 4C, when the energy of the laser light 303 is large, the energy given to the light-absorbing layer 301 becomes large, and heat is conducted to an irradiated region of the light-absorbing layer 301 and a periphery thereof. Accordingly, in the light-absorbing layer 301 and the insulating layer 302 formed thereover, an opening 305 with a diameter L2 that is larger than the diameter L1 of the laser light 303 is formed. As described above, the light-absorbing layer 301 is separated into light-absorbing layers 308a and 308b and the insulating layer 302 is separated into insulating layers 307a and 307b, so that the opening 305 is formed. A conductive film 306 is formed in the opening 305 where the conductive layer 309c and the light-absorbing layers 308a and 308b are exposed, so that the conductive layer 309 (309a, 309b, and 309c), the light-absorbing layers 308a and 308b, and the conductive film 306 are electrically connected to each other (see FIG. 4D).

The size of the opening with respect to an irradiated region that is determined by a diameter of laser light depends on the amount of energy of the laser light. When the energy of the laser light is sufficiently large, the energy reaches a periphery of the irradiated region, so that an opening that is larger than the irradiated region of the laser light is formed in the insulating layer. On the other hand, when the energy of the laser light is small, an opening with the size that is about the same as that of the irradiated region is formed in the insulating layer.

As described above, by control of the energy of the laser light, the size of the opening formed in the insulating layer can be appropriately controlled.

Since the opening can be selectively formed by laser light, it is not necessary to form a mask layer; thus the number of steps and materials can be reduced. In addition, since laser light can be condensed into an extremely small spot, the insulating layer to be processed can be processed into a predetermined shape with a high degree of accuracy and can be heated instantaneously at short times; thus, there is an advantage in that the region except for the region to be processed does not have to be heated so much.

As described above, the opening (the contact hole) in which the conductive layers are electrically connected to each other can be formed in the insulating layer without a complicated photolithography step and formation of a mask layer.

Therefore, when a display device is manufactured by the present invention, a process can be simplified. Thus, materials are seldom wasted and cost reduction can be achieved. Therefore, the display device can be manufactured with high yield.

Embodiment Mode 3

Figure 3A:
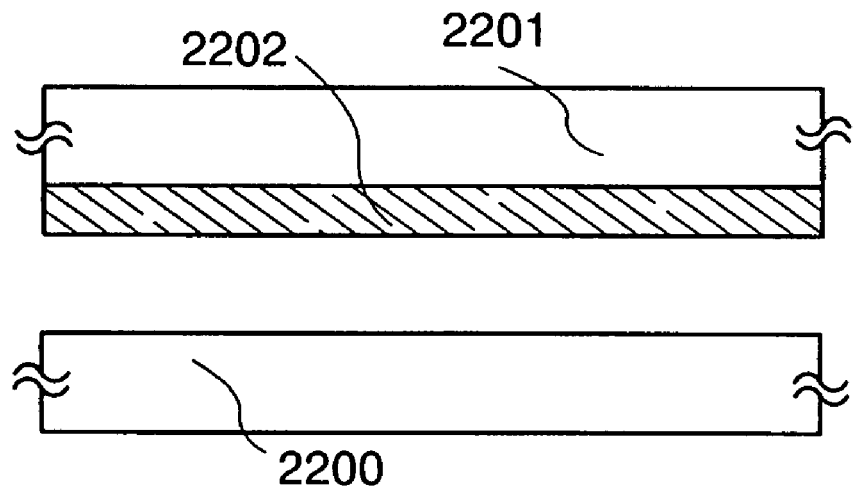
FIGS. 3A to 3C are conceptual diagrams explaining the present invention.
Figure 3B:
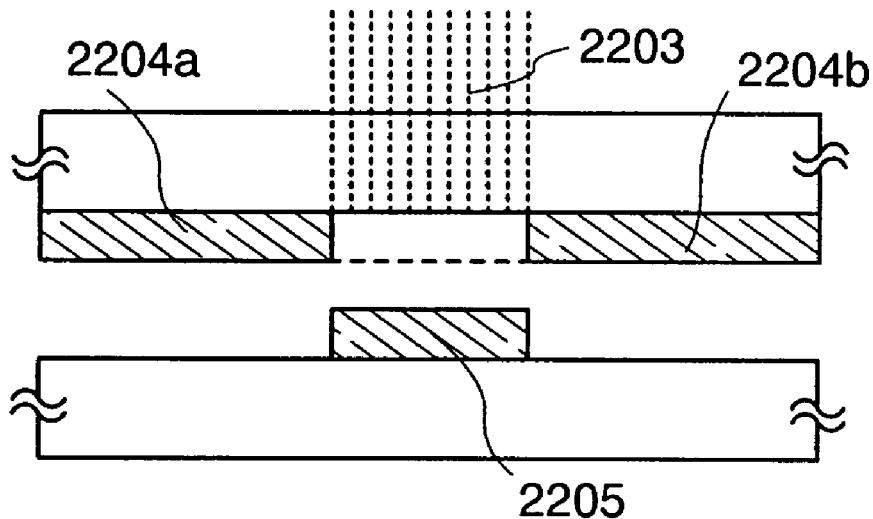
Figure 3C:
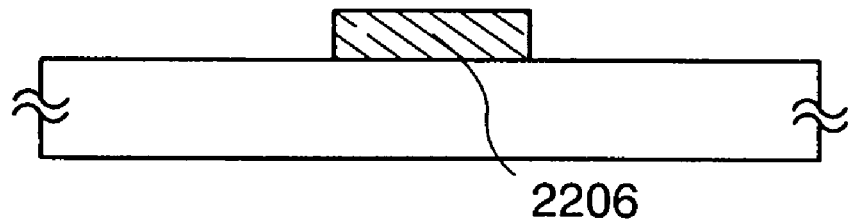

In this embodiment mode, a method for manufacturing a display device for the purpose of manufacture by a highly reliable and more-simplified process at low cost will be explained with reference to FIGS. 3A to 3C.

In this embodiment mode, a component (also referred to as a pattern) such as a conductive layer or a semiconductor layer is selectively formed so as to have a desired shape without using a photolithography step in processing a thin film into a desired pattern. In the present invention, the component (also referred to as the pattern) means a conductive layer such as a wiring layer, a gate electrode layer, a source electrode layer, or a drain electrode layer; a semiconductor layer; a mask layer; an insulating layer; and the like which are included in a thin film transistor or a display device, and all component elements formed with a predetermined shape are included.

In this embodiment mode, a light-absorbing film such as a conductive film or a semiconductor film is formed over a light-transmitting transfer substrate and laser light is selectively emitted from the transfer substrate, so that the light-absorbing film corresponding to an irradiated region of the laser light is transferred to a substrate to which the light-absorbing film is transferred and the conductive layer or the semiconductor layer which is the light-absorbing layer is formed with a desired shape (pattern). In this specification, the substrate over which the conductive film or the semiconductor film which is the light-absorbing film is formed in the first step and which is irradiated with the laser light is referred to as the transfer substrate, and the substrate over which, lastly, the conductive layer or the semiconductor layer which is the light-absorbing layer is selectively formed is also referred to as the substrate to which the light-absorbing layer is transferred. Since the light-absorbing layer can be selectively formed into a desired shape without using a photolithography step, a simplified-process and reduction in cost can be achieved.

A method for forming a thin film described in this embodiment mode is explained in detail with reference to FIGS. 3A to 3C. In FIGS. 3A to 3C, a light-absorbing film 2202 is formed over a first substrate 2201 that is a transfer substrate, and the first substrate 2201 and a second substrate 2200 that is a substrate to which the light-absorbing film 2202 is transferred are provided to face each other so that the light-absorbing film 2202 is interposed therebetween.

Laser light 2203 is transmitted through the substrate 2201, so that the light-absorbing film 2202 is selectively irradiated with the laser light 2203 from the substrate 2201 side. The light-absorbing film 2202 in a region irradiated with the laser light 2203 absorbs the laser light 2203 and is transferred to the second substrate 2200 side as a light-absorbing layer 2205 by the energy of heat of the laser light 2203. On the other hand, the other region of the light-absorbing film 2202, which is not irradiated with the laser light 2203 remains as light-absorbing films 2204a and 2204b on the first substrate 2201 side. In this manner, the component (also referred to as the pattern) such as the conductive layer or the semiconductor layer is selectively formed so as to have a desired shape without using a photolithography step in processing a thin film that is a light-absorbing layer 2206 into a desired pattern.

The laser light can be similar to the laser light explained in Embodiment Mode 1 and can be emitted in a similar manner, and the laser direct writing system shown in FIG. 30 may be used. Therefore, a detailed explanation is omitted here.

After the transfer by the laser light, heat treatment may be performed to the light-absorbing layer, or laser light may be emitted thereto.

A material which absorbs emitted light is used for the light-absorbing film 2202 that is transferred and a light-transmitting substrate which transmits emitted light is used for the first substrate 2201. When the present invention is used, the light-absorbing film can be freely transferred to various substrates; thus, the range of selectable materials for the substrate is expanded. In addition, an inexpensive material can be selected for the substrate, and the display device not only can have various functions for its application, but also can be manufactured at low cost.

A method for forming a thin film of this embodiment mode can be used for formation of a conductive layer such as a wiring layer, a gate electrode layer, a source electrode layer, or a drain electrode layer; a semiconductor layer; a mask layer; an insulating layer; and the like which are included in a thin film transistor or a display device. A film using a desired material is formed as a light-absorbing layer and light absorbed in the film is selected to be emitted.

For example, a conductive material can be used for the light-absorbing film to be transferred. For example, the light-absorbing film can be formed using one or more kinds of chromium, tantalum, silver, molybdenum, nickel, titanium, cobalt, copper, and aluminum. Alternatively, a semiconductor material can be used for the light-absorbing film. For example, the following inorganic semiconductor material can be used: silicon, germanium, silicon germanium, gallium arsenic, molybdenum oxide, tin oxide, bismuth oxide, vanadium oxide, nickel oxide, alloy oxide, gallium arsenide, gallium nitride, indium oxide, indium phosphide, indium nitride, cadmium sulfide, cadmium telluride, strontium titanate, or the like. In addition, hydrogen or an inert gas (such as helium (He), argon (Ar), krypton (Kr), neon (Ne), or xenon (Xe)) may be added to the light-absorbing film.

By the present invention, a component such as a wiring included in a display device can be formed with a desired shape. Moreover, the display device can be manufactured with a complicated photolithography step reduced, by a simplified process; therefore, materials are seldom wasted and reduction in cost can be achieved. Thus, a high-performance and highly reliable display device can be manufactured with high yield.

Embodiment Mode 4

Figure 25A:
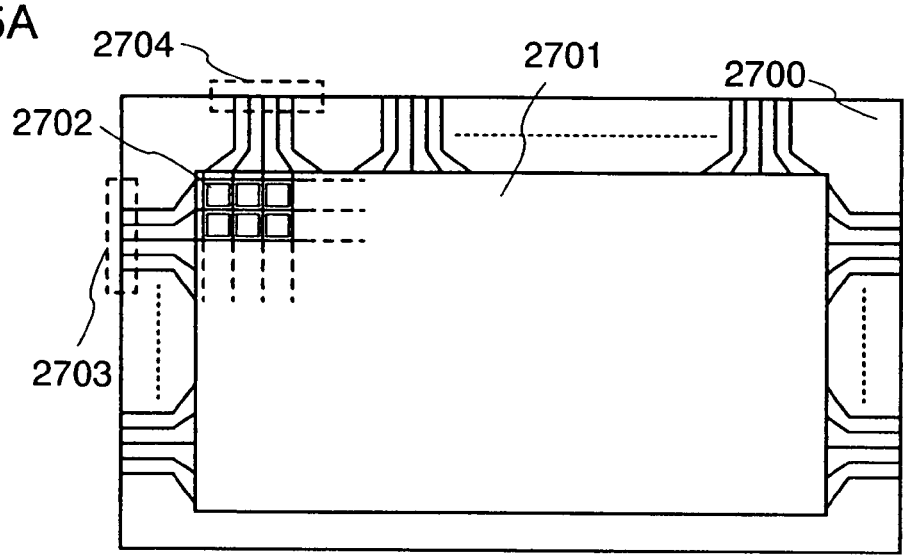
FIGS. 25A to 25C are top views each illustrating a display device of the present invention.

FIG. 25A is a top view illustrating a structure of a display panel of the present invention, in which a pixel portion 2701 in which pixels 2702 are arranged in matrix over a substrate 2700 with an insulating surface, a scanning line input terminal 2703, and a signal line input terminal 2704 are formed. The number of pixels may be determined in accordance with various standards. For example, 1024×768×3 (RGB) in the case of XGA and an RGB full-color display; 1600×1200×3 (RGB) in the case of UXGA and an RGB full-color display; and 1920×1080×3 (RGB) in the case of full-spec high vision and an RGB full-color display.

The pixels 2702 are arranged in matrix at intersections of scanning lines extending from the scanning line input terminal 2703 and signal lines extending from the signal line input terminal 2704. Each of the pixels 2702 is provided with a switching element and a pixel electrode connected to the switching element. A typical example of the switching element is a TFT. A gate electrode side of the TFT is connected to the scanning line, and a source or drain side of the TFT is connected to the signal line, so that each pixel can be controlled independently by a signal inputted from the outside.

Figure 26A:
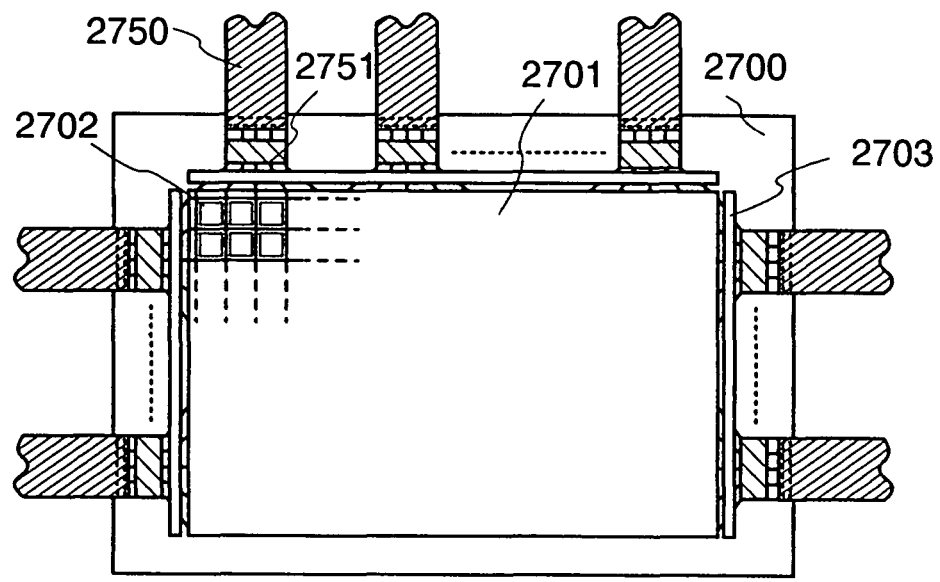
FIGS. 26A and 26B are top views each illustrating a display device of the present invention.
Figure 26B:
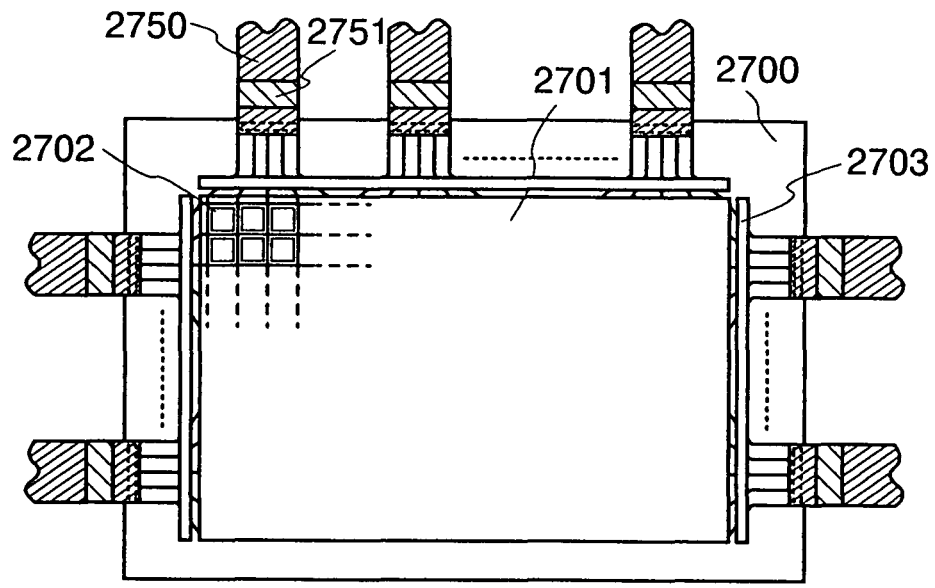

Although FIG. 25A illustrates the structure of the display panel in which signals to be inputted to the scanning line and the signal line are controlled by an external driver circuit, a driver IC 2751 may be mounted on the substrate 2700 by a COG (Chip On Glass) method as shown in FIG. 26A. As another mounting mode, a TAB (Tape Automated Bonding) method as shown in FIG. 26B may also be employed. A driver IC may be formed over a single crystal semiconductor substrate or a glass substrate with the use of a TFT. In FIGS. 26A and 26B, the driver IC 2751 is connected to an FPC 2750.

Figure 25B:
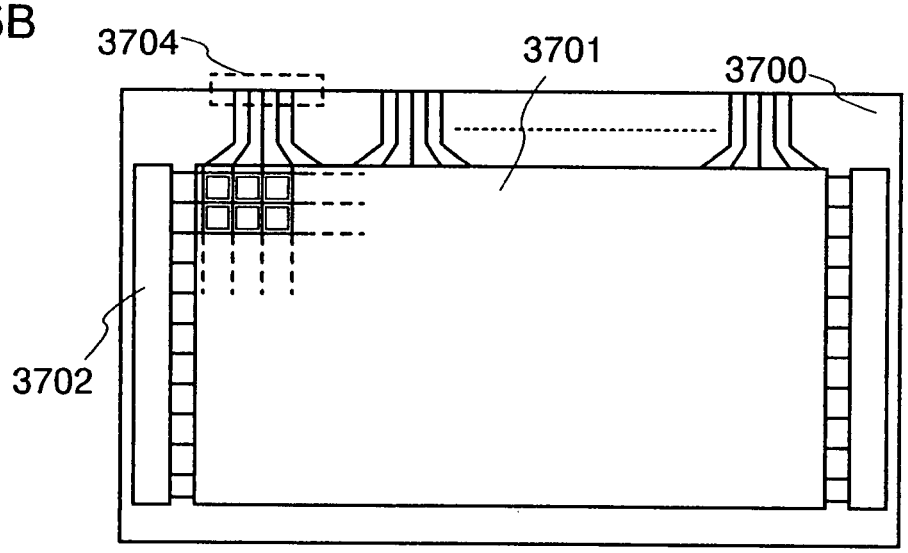

In addition, in the case where a TFT provided in a pixel is formed using a polycrystalline (microcrystalline) semiconductor with high crystallinity, a scanning line driver circuit 3702 can be formed over a substrate 3700 as shown in FIG. 25B. In FIG. 25B, reference numeral 3701 denotes a pixel portion and a signal line driver circuit is controlled by an external driver circuit in a similar manner to FIG. 25A. As in the TFT formed in the present invention, in the case where the TFT provided in the pixel is formed using a polycrystalline (microcrystalline) semiconductor, a single crystal semiconductor, or the like, in FIG. 25C, a scanning line driver circuit 4702 and a signal line driver circuit 4704 can be formed over the same substrate 4700 as a pixel portion.

Figure 14A:
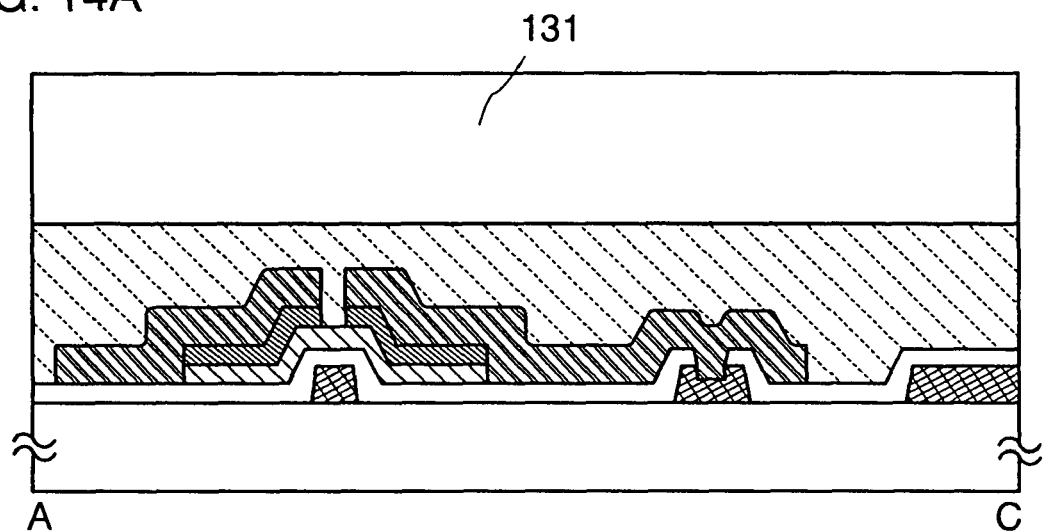
FIGS. 14A and 14B are views explaining a method for manufacturing a display device of the present invention.
Figure 14B:
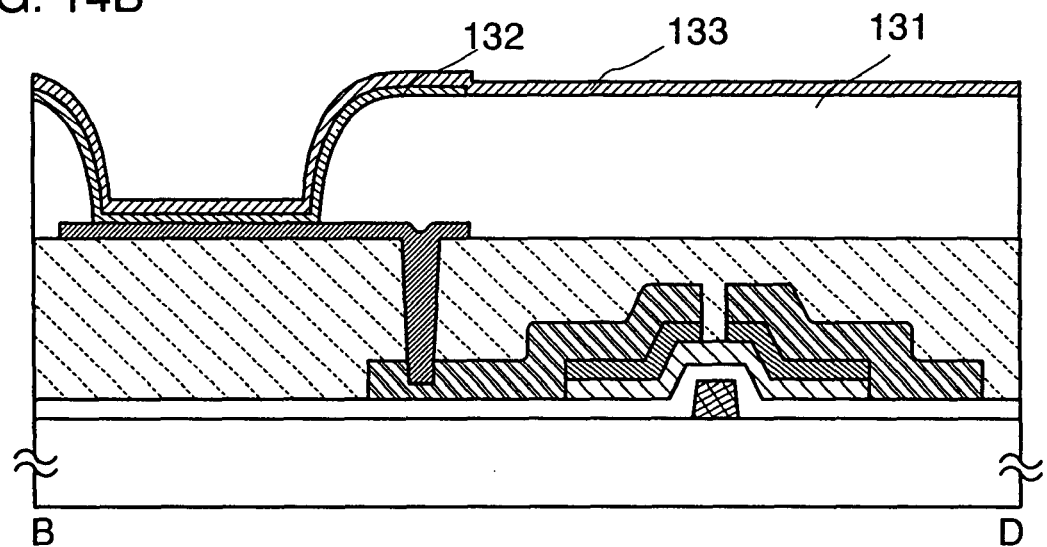

Embodiment modes of the present invention are explained with reference to FIGS. 8A to 8C, 9A to 9C, 10A to 10C, 11A to 11C, 12A to 12C, 13A to 13C, and 14A and 14B. More specifically, a method for manufacturing a display device having an inversely staggered thin film transistor, to which the present invention is applied is explained. Each of FIGS. 8A, 9A, 10A, 11A, 12A, and 13A is a top view of a pixel portion of a display device, each of FIGS. 8B, 9B, 10B, 11B, 12B, and 13B is a cross-sectional view taken along a line A-C in each of FIGS. 8A, 9A, 10A, 11A, 12A, and 13A, respectively, and each of FIGS. 8C, 9C, 10C, 11C, 12C, and 13C is a cross-sectional view taken along a line B-D in FIGS. 8A, 9A, 10A, 11A, 12A, and 13A, respectively. Each of FIGS. 14A and 14B is also a cross-sectional view of a display device.

As a substrate 100, a glass substrate formed from barium borosilicate glass, aluminoborosilicate glass, or the like; a quartz substrate; a metal substrate; or a heat-resistant plastic substrate which can withstand a treatment temperature of the manufacturing process. Also, the substrate 100 may be polished by a CMP method so that a surface of the substrate 100 is processed. Further, an insulating layer may be formed over the substrate 100. The insulating layer is formed of a single layer or a stacked layer using an oxide material containing silicon or a nitride material containing silicon by various methods such as a CVD method including a plasma CVD method, a sputtering method, and a spin coating method. This insulating layer is not necessarily formed; however, the insulating layer has an effect of shielding the substrate 100 from contaminants.

Gate electrode layers 103 (103*a* and 103*b*) and 104 (104*a* and 104*b*) are formed over the substrate 100. Each of the gate electrode layers 103 (103*a* and 103*b*) and 104 (104*a* and 104*b*) may be formed of an element selected from Ag, Au, Ni, Pt, Pd, Ir, Rh, Ta, W, Ti, Mo, Al, and Cu, or an alloy material or a compound material containing the element as its main component. Alternatively, a semiconductor film typified by a polycrystalline silicon film doped with an impurity element such as phosphorus or an AgPdCu alloy may be used. Moreover, each of the gate electrode layers may have a single layer structure or a structure including a plurality of layers. For example, a two-layered structure formed of a tungsten nitride film and a molybdenum (Mo) film or a three-layered structure formed of a 50-nm-thick tungsten film, a 500-nm-thick alloy film of aluminum and silicon (Al—Si), and a 30-nm-thick titanium nitride film, which are sequentially stacked. In the case of a three-layered structure, tungsten nitride may be used instead of the tungsten film that is the first conductive film, an alloy film of aluminum and titanium (Al—Ti) may be used instead of the alloy film of aluminum and silicon (Al—Si) that is the second conductive film, and a titanium film may be used instead of the titanium nitride film that is the third conductive film.

Each of the gate electrodes 103a, 103b, 104a, and 104b can be formed by a sputtering method, a PVD method (Physical Vapor Deposition), a CVD method (Chemical Vapor Deposition) such as a low-pressure CVD method (an LPCVD method) or a plasma CVD method, or the like and can be processed using a mask layer. In addition, a method by which a component can be transferred or drawn into a desired pattern, for example, various printing methods (a method by which a component can be formed with a desired pattern, such as screen (mimeograph) printing, offset (planography) printing, relief printing, or gravure (intaglio) printing), a droplet discharging method, a dispenser method, a selective coating method, or the like can be used.

In processing a conductive film, etching process by dry etching or wet etching may be used. An ICP (Inductively Coupled Plasma) etching method is used and etching conditions (such as electric energy applied to a coiled electrode, electric energy applied to an electrode on a substrate side, an electrode temperature on the substrate side, and the like) are appropriately controlled, so that the electrode layer can be etched into a tapered shape. Further, as an example of an etching gas, the following can be appropriately used: a chlorine-based gas typified by $Cl_2$, $BCl_3$, $SiCl_4$, or $CCl_4$; a fluorine-based gas typified by $CF_4$, $SF_6$, or $NF_3$; or $O_2$.

In this embodiment mode, a gate electrode is formed in such a manner that a conductive film that is a light-absorbing film is formed over a transfer substrate, and then is processed into a desired shape by laser light to be selectively formed over a substrate to which the light-absorbing film is transferred. The light-absorbing film is formed over a substrate 101 by a sputtering method, a PVD method (Physical Vapor Deposition), a CVD method (Chemical Vapor Deposition) such as a low-pressure CVD method (an LPCVD method) or a plasma CVD method, or the like.

The light-absorbing film is formed over the substrate 101 that is the transfer substrate, and the substrate 101 and the substrate 100 that is a substrate to which the light-absorbing film is transferred are provided to face each other so that the light-absorbing film is interposed therebetween.

Laser light 112a, 112b, 112c, and 112d are transmitted through the substrate 101 side, so that the light-absorbing film is selectively irradiated with the laser light 112a, 112b, 112c, and 112d from the substrate 101 side. The light-absorbing film in regions irradiated with the respective laser light 112a, 112b, 112c, and 112d absorb the laser light 112a, 112b, 112c, and 112d and the light-absorbing film is transferred to the substrate 100 side, as the gate electrode layers 103 (103a and 103b) and 104 (104a and 104b), by the energy of heat or the like of the laser light. On the other hand, the other regions which are not irradiated with the laser light 112a, 112b, 112c, and 112d remain as light-absorbing films 102a, 102b, 102c, and 102d at the substrate 101 side. In this manner, the light-absorbing films are selectively transferred, and the gate electrode layers 103 (103a and 103b) and 104 (104a and 104b) are selectively formed so as to have a desired shape without using a photolithography step (see FIGS. 8A to 8C).

After the transfer by the laser light, heat treatment may be performed to the light-absorbing layer, or laser light may be emitted thereto.

A material which absorbs emitted light is used for the light-absorbing film that is transferred and a light-transmitting substrate which transmits emitted light is used for the substrate 101. When the present invention is used, the light-absorbing film can be freely transferred to various substrates, the range of selectable materials for the substrate is expanded. In addition, an inexpensive material can be selected for the substrate, and the display device not only can have various functions for its application, but also can be manufactured at low cost.

Next, a gate insulating layer 105 is formed over the gate electrode layers 103 (103a and 103b) and 104 (104a and 104b). The gate insulating layer 105 may be formed of an oxide material containing silicon or a nitride material containing silicon and may be a stacked layer or a single layer. In this embodiment mode, a stacked layer formed of a silicon nitride film and a silicon oxide film is used. Alternatively, a single layer of the silicon nitride film, the silicon oxide film, or a silicon oxynitride film, or a stacked layer formed of three or more layers may be used. A silicon nitride film with dense film quality is preferably used. In the case of using silver or copper for a conductive film formed by a droplet discharging method, a silicon nitride film or a NiB film may be formed thereover as a barrier film, so that an effect of preventing diffusion of impurities and planarizing a surface is obtained. It is to be noted that, in order to form a dense insulating film with little gate leak current at a low film formation temperature, it is preferable that a rare gas element such as argon be contained in a reactive gas and the gas containing argon be mixed into an insulating film that is to be formed.

Next, an opening 107 is formed in the gate insulating layer 105. A mask is formed of an insulating material such as a resist or polyimide by a droplet discharging method and the opening 107 is formed in part of the gate insulating layer 105 by etching process with the use of the mask layer, so that part of the gate electrode layer 104 provided under the gate insulating layer can be exposed. Although either one of plasma etching (dry etching) and wet etching may be employed for the etching process, plasma etching is suitable for processing a large-area substrate. As an etching gas, a fluorine-based gas or chlorine-based gas such as $CF_4$, $NF_3$, $Cl_2$, or $BCl_3$ is used, and an inter gas such as He or Ar may be appropriately added to the etching gas. In addition, when etching process is performed by atmospheric discharge plasma, local discharge process becomes possible; therefore, it is not necessary that the mask layer is formed over an entire surface of the substrate.

Figure 9A:
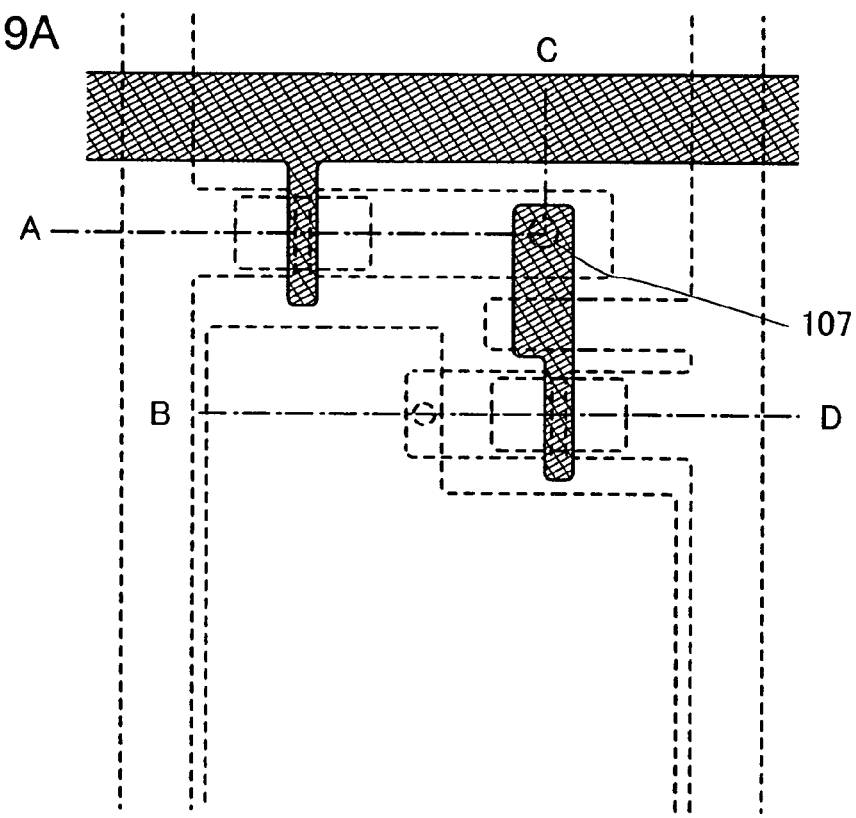
FIGS. 9A to 9C are views explaining a method for manufacturing a display device of the present invention.
Figure 9B:
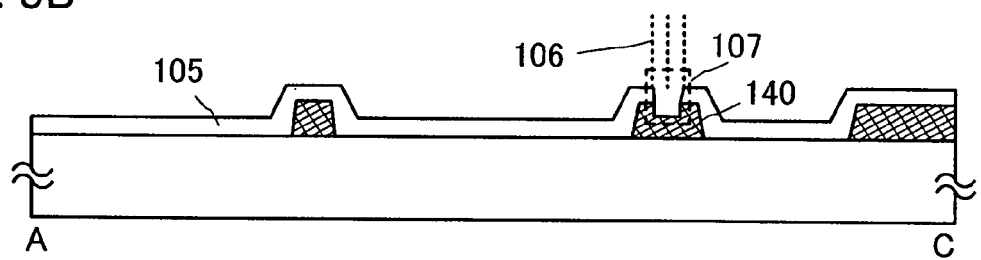
Figure 9C:
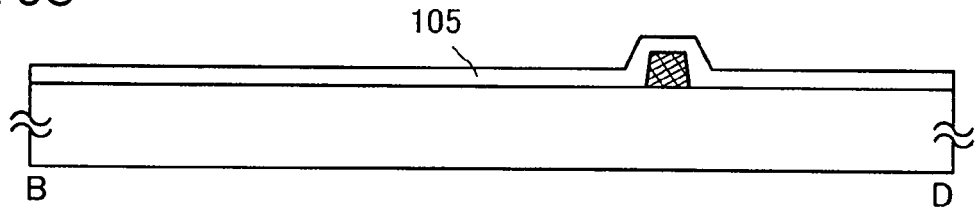
Figure 10A:
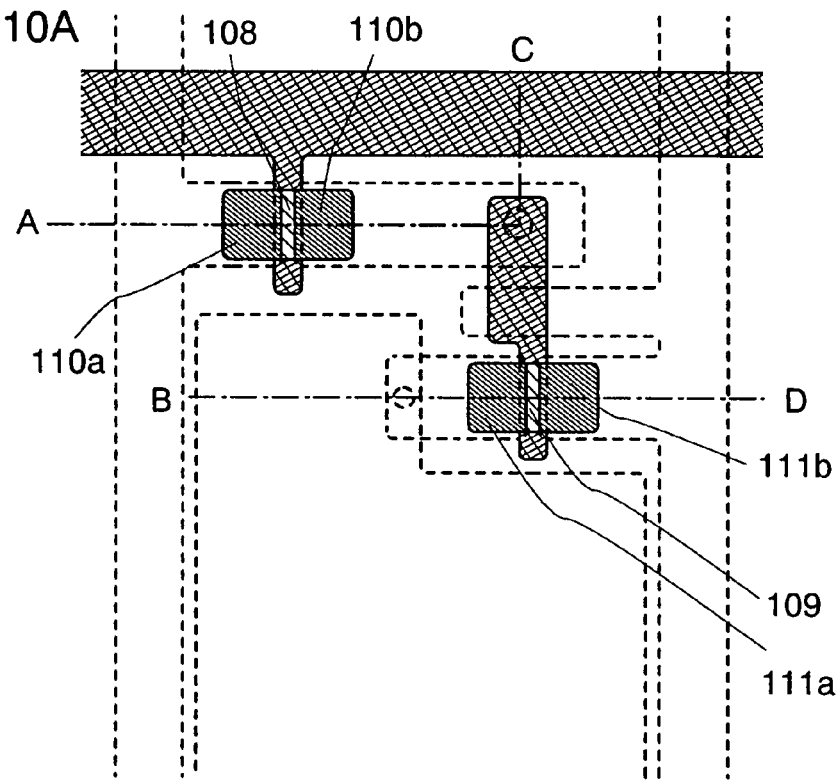
FIGS. 10A to 10C are views explaining a method for manufacturing a display device of the present invention.
Figure 10B:
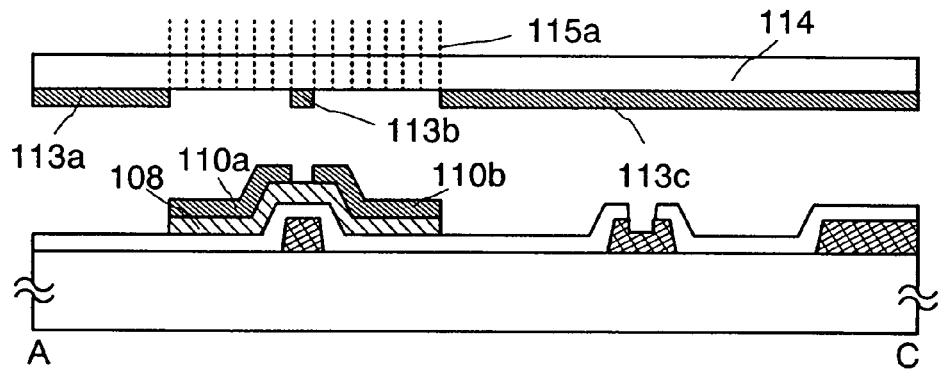
Figure 10C:
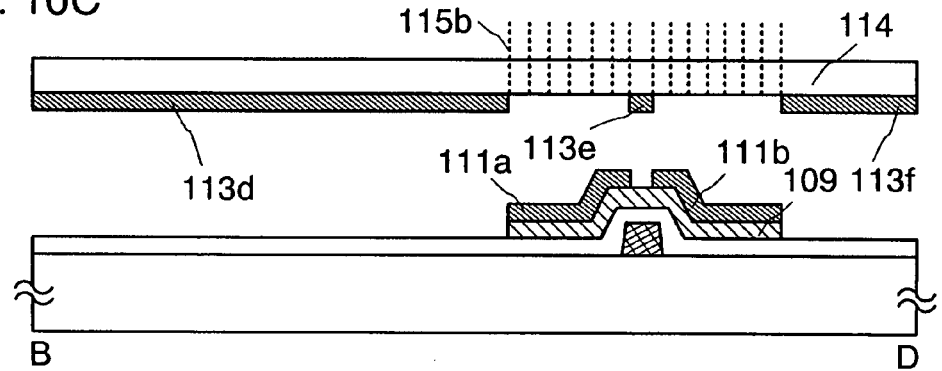

In this embodiment mode, the opening 107 is formed by laser light as described in Embodiment Mode 1 (see FIGS. 9A to 9C). The gate electrode layer 104 is selectively irradiated with laser light 106 from the gate insulating layer 105 side, and part of an irradiated region of the gate electrode layer 104 is evaporated by the irradiated energy, so that a gate electrode layer 140 is formed. The gate insulating layer 105 over the gate electrode layer 140 is removed, so that the opening 107 can be formed. A conductive film which forms a source or a drain electrode layer is formed in the opening 107 where the gate electrode layer 140 is exposed, so that the gate electrode layer 140 and the source or drain electrode layer can be electrically connected to each other. The opening 107 may be formed after a semiconductor layer is formed.

Next, the semiconductor layer is formed. A semiconductor layer with one conductivity type may be formed as needed. An NMOS structure of an n-channel TFT in which a semiconductor layer with n-type conductivity is formed, a PMOS structure of a p-channel TFT in which a semiconductor layer with p-type conductivity is formed, or a CMOS structure of an n-channel TFT and a p-channel TFT can be manufactured. In addition, an impurity region may be formed in the semiconductor layer by addition of an element imparting a conductivity type by doping in order to impart the conductivity type, so that an n-channel TFT or a p-channel TFT can be formed. Instead of forming the n-type semiconductor layer, conductivity type may be imparted to the semiconductor layer by plasma treatment with a $PH_3$ gas.

As a material for forming the semiconductor layer, an amorphous semiconductor (hereinafter, also referred to as an "AS") formed by a vapor deposition method or a sputtering method, using a semiconductor gas typified by silane or germane, a polycrystalline semiconductor formed in such a mariner that the amorphous semiconductor is crystallized using light energy or heat energy, a semi-amorphous (referred to as microcrystal) semiconductor (hereinafter, also referred to as a "SAS"), or the like can be used. The semiconductor layer can be formed by various methods (such as a sputtering method, an LPCVD method, or a plasma CVD method).

The semi-amorphous semiconductor (SAS) has an intermediate structure between an amorphous structure and a crystalline structure (including a single crystal and a polycrystal) and a third state that is stable in terms of free energy, and includes a crystalline region with short-range order and lattice distortion. At least part of a region in a film includes a crystalline region of 0.5 to 20 nm. When silicon is contained as a main component, Raman spectrum shifts to a wave number side lower than 520 $cm^{-1}$. The diffraction peaks of (111) and (220) which are thought to be derived from a silicon crystalline lattice are observed by X-ray diffraction. Hydrogen or halogen of at least 1 atomic % or more is contained as a material for terminating dangling bonds. A SAS is formed by glow discharge decomposition (plasma CVD) of a gas containing silicon. As the gas containing silicon, $Si_2H_6$, $SiH_2Cl_2$, $SiHCl_3$, $SiCl_4$, $SiF_4$, or the like can be used as well as $SiH_4$. Also, $F_2$ or $GeF_4$ may be mixed. The gas containing silicon may be diluted with $H_2$ or $H_2$ and one or more kinds of rare gas elements selected from He, Ar, Kr, and Ne. A dilution ratio is in the range of 2 to 1000 times, pressure is in the range of approximately 0.1 to 133 Pa, a power supply frequency is 1 to 120 MHz, preferably, 13 to 60 MHz. A substrate heating temperature is preferably less than or equal to 300° C., and the SAS can also be formed at substrate heating temperatures of 100 to 200° C. Here, as an impurity element that is introduced mainly in forming a film, an impurity which is derived from an atmospheric component, such as oxygen, nitrogen, or carbon, is desirably contained at less than or equal to $1 \times 10^{20}$ $cm^{-3}$. In particular, an oxygen concentration is preferably less than or equal to $5 \times 10^{19}$ $cm^{-3}$, more preferably, less than or equal to $1 \times 10^{19}$ $cm^{-3}$. Moreover, when a rare gas element such as helium, argon, krypton, or neon is contained to further increase the lattice distortion, stability can be enhanced, and a favorable SAS can be obtained. In addition, as the semiconductor film, a stack of a SAS layer formed using a fluorine-based gas and a SAS layer formed using a hydrogen-based gas may be used.

The amorphous semiconductor is typified by hydrogenated amorphous silicon. The crystalline semiconductor is typified by polysilicon. Polysilicon (polycrystalline silicon) includes so-called high-temperature polysilicon formed using polysilicon as a main material at a process temperature of greater than or equal to 800° C., so-called low-temperature polysilicon formed using polysilicon as a main material at a process temperature of less than or equal to 600° C., polysilicon crystallized by adding an element which promotes crystallization, and the like. It is needless to say that a semi-amorphous semiconductor or a semiconductor containing a crystal phase partially in the layer may also be used as described above.

In the case of using a crystalline semiconductor layer as the semiconductor layer, the crystalline semiconductor layer may be formed by any known method (such as a laser crystallization method, a thermal crystallization method, or a thermal crystallization method using an element that promotes crystallization such as nickel). Further, a microcrystalline semiconductor which is a SAS may be crystallized by laser irradiation, so that crystallinity can be enhanced. In the case where the element which promotes crystallization is not introduced, the amorphous silicon film is heated for one hour in a nitrogen atmosphere at 500° C. to release hydrogen contained in the amorphous silicon film until the hydrogen concentration becomes less than or equal to $1 \times 10^{20}$ atoms/$cm^3$ before irradiating the amorphous silicon film with laser light. This is because if the amorphous silicon film containing a large amount of hydrogen is irradiated with laser light, the amorphous silicon film would be broken.

A method for introducing a metal element into the amorphous semiconductor layer is not particularly limited as long as the metal element can exist in a surface or inside the amorphous semiconductor layer. For example, a sputtering method, a CVD method, a plasma treatment method (including a plasma CVD method), an adsorption method, or a method of applying a solution of metal salt can be used. Out of these, the method of using the solution is easy and advantageous in that the concentration of the metal element can be easily controlled. At this time, it is preferable to form an oxide film by UV light irradiation in an oxygen atmosphere, a thermal oxidation method, a treatment using ozone water containing hydroxyl radicals or using hydrogen peroxide, or the like, in order to improve surface wettability of the amorphous semiconductor layer to diffuse the aqueous solution over the entire surface of the amorphous semiconductor layer.

The amorphous semiconductor layer may be crystallized by a combination of heat treatment and laser light irradiation. Alternatively, either one of the heat treatment and the laser light irradiation may be performed several times.

Also, a crystalline semiconductor layer may be directly formed over a substrate by a plasma method. Alternatively, the crystalline semiconductor layer may be selectively formed over the substrate by a linear plasma method.

A semiconductor may be formed using an organic semiconductor material by a printing method, a dispersion method, a spraying method, a spin coating method, a droplet discharging method, or the like. In this case, since the above described etching step is not required, the number of steps can be reduced. As an organic semiconductor, a low molecular weight material such as pentacene, a high molecular weight material, an organic pigment, a conductive high molecular weight material, or the like can be used. Preferably, a π-conjugated system high molecular weight material with skeletons including conjugated double bonds is used as the organic semiconductor material used in the present invention. Typically, a soluble high molecular weight material such as polythiophene, polyfluorene, poly(3-alkylthiophene), or a polythiophene derivative, or the like can be used.

As another organic semiconductor material that can be used in the present invention, there is a material by which a semiconductor layer can be formed by depositing a soluble precursor to form a film and processing the soluble precursor. For example, polyethylene vinylene, poly(2,5-thienylene vinylene), polyacetylene, a polyacetylene derivative, polyarylene vinylene, or the like, is given as an example of the organic semiconductor material.

In converting the precursor into an organic semiconductor, a reactive catalyst such as hydrochloric gas is added to the precursor, in addition to heat treatment. As a typical solvent for dissolving such a soluble organic semiconductor material, the following can be applied: toluene, xylene, chlorobenzene, dichlorobenzene, anisole, chloroform, dichloromethane, γ butyl lactone, butyl cellsolve, cyclohexane, NMP (N-methyl-2-pyrrolidone), cyclohexanone, 2-butanone, dioxane, dimethylformamide (DMF), THF (tetrahydrofuran), or the like.

In this embodiment mode, the semiconductor layer and the semiconductor layer with one conductivity type are formed in such a manner that the semiconductor film that is the light-absorbing film is formed over the transfer substrate, and then is processed into a desired shape by laser light to be transferred to the substrate to which the light-absorbing film is transferred to be selectively formed. A semiconductor film that is a light-absorbing film is formed over a substrate 114 by a sputtering method, a PVD method (Physical Vapor Deposition), a CVD method such as a low-pressure CVD method (an LPCVD method) or a plasma CVD method, or the like.

The light-absorbing film is formed over the substrate 114 that is the transfer substrate, and the substrate 114 and the substrate 100 that is the substrate to which the light-absorbing film is transferred are provided to face each other so that the light-absorbing film is interposed therebetween.

Laser light 115a and 115b are transmitted through the substrate 114, so that the light-absorbing film is selectively irradiated with the laser light 115a and 115b from the substrate 114 side. The light-absorbing film in regions irradiated with the laser light 115a and 115b absorbs the laser light 115a and 115b, and the light-absorbing film is transferred to the substrate 100 side, as semiconductor layers 110a, 110b, 111a, and 111b with one conductivity type, by the energy such as heat of the laser light 115a and 115b. On the other hand, the other regions which are not irradiated with the laser light 115a and 115b remain at the substrate 114 side as light-absorbing films 113a to 113f. Semiconductor layers 108 and 109 can be formed by a transfer method using laser light in a similar manner to the semiconductor layer with one conductivity type. In this manner, the light-absorbing film is selectively transferred, so that the semiconductor layers 108 and 109, and the semiconductor layers 110a, 110b, 111a, and 111b with one conductivity type can be selectively formed so as to have a desired shape without using a photolithography step (see FIGS. 10A to 10C).

After the transfer by the laser light, heat treatment may be performed to the light-absorbing layer, or laser light may be emitted thereto.

A material which absorbs emitted light is used for the light-absorbing film and a light-transmitting substrate which transmits emitted light is used for the substrate 114. When the present invention is used, the light-absorbing film can be freely transferred to various substrates; thus, the range of selectable materials for the substrate is expanded. In addition, an inexpensive material can be selected for the substrate, and the display device not only can have various functions, but also can be manufactured at low cost.

In this embodiment mode, an amorphous semiconductor layer is formed as the semiconductor layers 108 and 109, and the semiconductor layers 110a, 110b, 111a, and 111b with one conductivity type. In this embodiment mode, as a semiconductor film with one conductivity type, an n-type semiconductor film containing phosphorus (P) that is an impurity element imparting n-type conductivity is formed. The semiconductor film with one conductivity type serves as a source region or a drain region. The semiconductor film with one conductivity type may be formed as needed, and an n-type semiconductor film having an impurity element (P or As) imparting n-type conductivity or a p-type semiconductor film having an impurity element (B) imparting p-type conductivity.

Source or drain electrode layers 116, 117, 118, and 119 are formed over the substrate 100. The source or drain electrode layers 116, 117, 118, and 119 can be formed of an element selected from Ag (silver), Au (gold), Cu (copper), W (tungsten), Al (aluminum), Mo (molybdenum), Ta (tantalum), and Ti (titanium), an alloy material or a compound material containing the element as its main component, or the like. In addition, indium tin oxide (ITO) with a light-transmitting property, indium tin oxide containing silicon oxide (ITSO), organic indium, organic tin, zinc oxide, titanium nitride, or the like may be combined.

Each of the source electrode layers or drain electrode layers 116, 117, 118, and 119 can be formed by a sputtering method, a PVD method (Physical Vapor Deposition), a CVD method (Chemical Vapor Deposition) such as a low-pressure CVD method (an LPCVD method) or a plasma CVD method, or the like, and can be processed using a mask layer. In addition, a method by which a component can be transferred or drawn into a desired pattern, for example, various printing methods (a method by which a component can be formed with a desired pattern, such as screen (mimeograph) printing, offset (planography) printing, relief printing, or gravure (intaglio) printing), a droplet discharging method, a dispenser method, a selective coating method, or the like can be used.

As process of a conductive film, etching process by dry etching or wet etching may be used. An ICP (Inductively Coupled Plasma) etching method is used and etching conditions (such as electric energy applied to a coiled electrode, electric energy applied to an electrode on a substrate side, an electrode temperature on the substrate side, and the like) are appropriately controlled, so that the electrode layer can be etched into a tapered shape. Further, as an example of an etching gas, the following can be appropriately used: a chlorine-based gas typified by $Cl_2$, $BCl_3$, $SiCl_4$, or $CCl_4$; a fluorine-based gas typified by $CF_4$, $SF_6$, or $NF_3$; or $O_2$.

In this embodiment mode, the source or drain electrode layers formed in such a manner that a conductive film that is a light-absorbing film is formed over a transfer substrate, and then is processed into a desired shape by laser light to be selectively formed over a substrate to which the light-absorbing film is transferred. The light-absorbing film is formed over a substrate 121 by a sputtering method, a PVD method (Physical Vapor Deposition), a CVD method (Chemical Vapor Deposition) such as a low-pressure CVD method (an LPCVD method) or a plasma CVD method, or the like.

The light-absorbing film is formed over the substrate 121 that is the transfer substrate, and the substrate 121 and the substrate 100 that is the substrate to which the light-absorbing film is transferred are provided to face each other so that the light-absorbing film is interposed therebetween.

Laser light 122a, 122b, 122c, and 122d are transmitted through the substrate 121, so that the light-absorbing film is selectively irradiated with the laser light 122a, 122b, 122c, and 122d from the substrate 121 side. The light-absorbing film in regions irradiated with the laser light 122a, 122b, 122c, and 122d absorbs the laser light 122a, 122b, 122c, and 122d, and then is transferred to the substrate 100 side, as the source or drain electrode layers 116, 117, 118, and 119, by the energy such as heat of the laser light 122a, 122b, 122c, and 122d. On the other hand, the other regions of the light-absorbing film, which are not irradiated with the laser light 122a, 122b, 122c, and 122d remain on the substrate 121 side as light-absorbing films 120a, 120b, 120c, 120d, 120e, and 120f. In this manner, the light-absorbing film is selectively transferred, so that the source or drain electrode layers 116, 117, 118, and 119 can be selectively formed so as to have a desired shape without using a photolithography step (see FIGS. 11A to 11C).

After the transfer by the laser light, heat treatment may be performed to the light-absorbing layer, or laser light may be emitted thereto.

A material which absorbs emitted light is used for the light-absorbing film that is transferred and a light-transmitting substrate which transmits emitted light is used for the first substrate 121. When the present invention is used, the light-absorbing film can be freely transferred to various substrates; thus, the range of selectable materials for the substrate is expanded. In addition, an inexpensive material can be selected for the substrate, and the display device not only can have various functions, but also can be manufactured at low cost.

The source or drain electrode layer 116 also serves as a source wiring layer, and the source or drain electrode layer 118 also serves as a power supply line.

In the opening 107 formed in the gate insulating layer 105, the source or drain electrode layer 117 and the gate electrode layer 140 are electrically connected to each other. Part of the source or drain electrode layer 118 forms a capacitor.

Figure 11A:
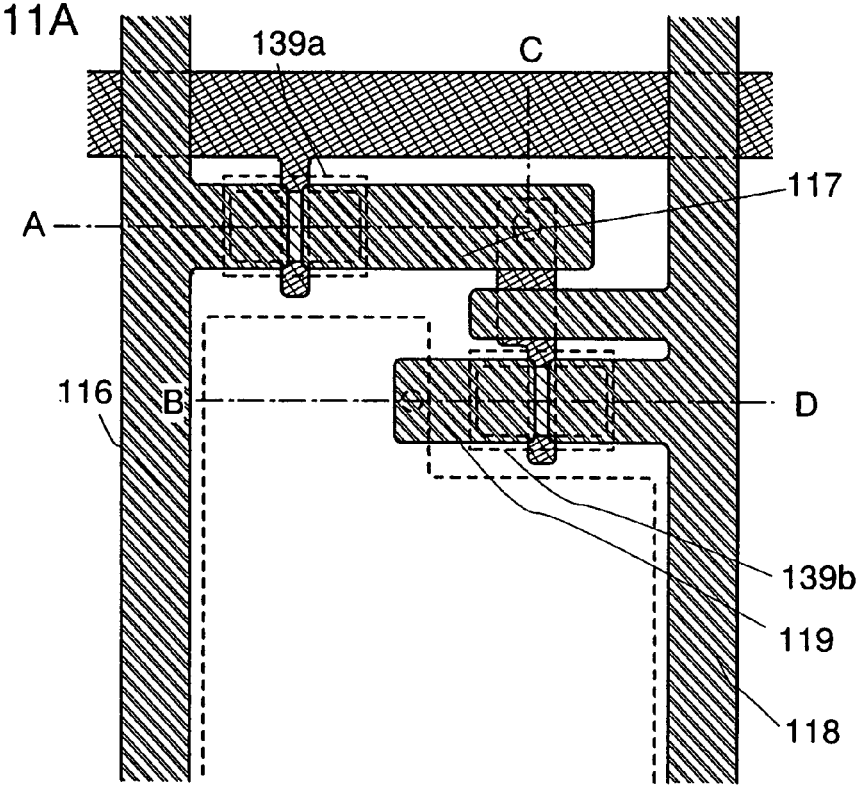
FIGS. 11A to 11C are views explaining a method for manufacturing a display device of the present invention.
Figure 11B:
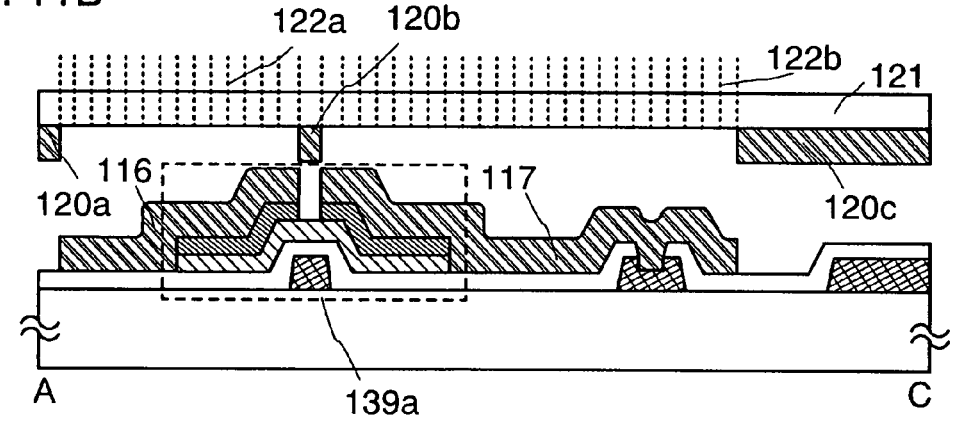
Figure 11C:
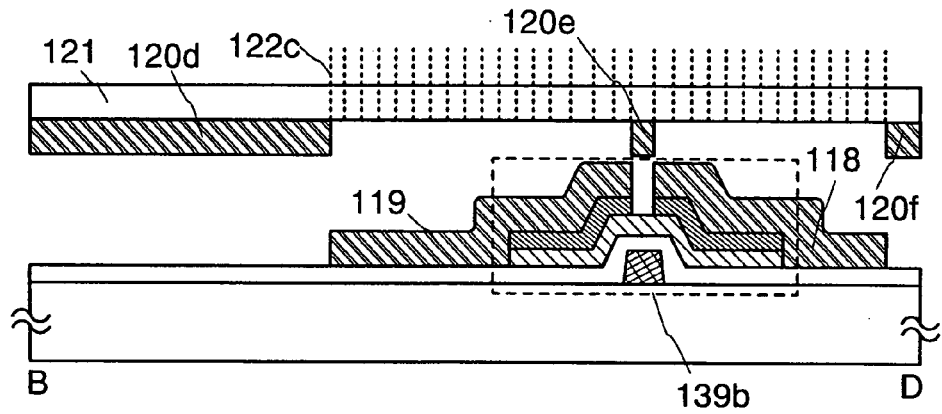
Figure 12A:
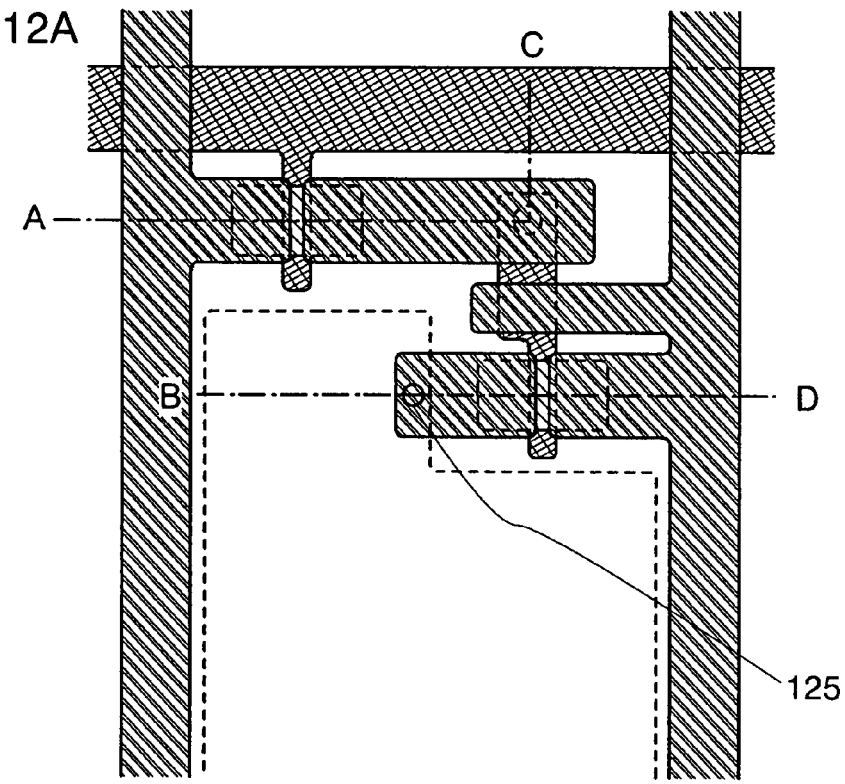
FIGS. 12A to 12C are views explaining a method for manufacturing a display device of the present invention.
Figure 12B:
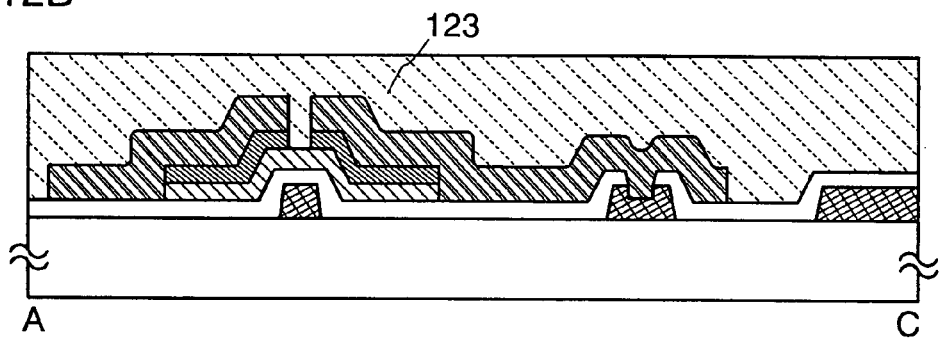
Figure 12C:
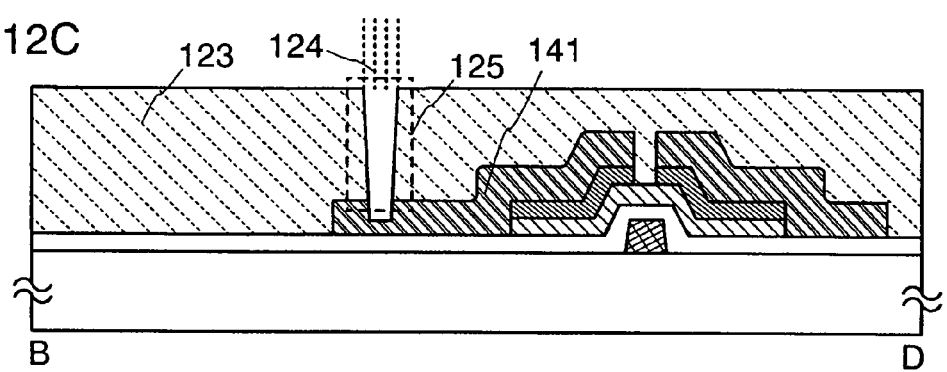
Figure 13A:
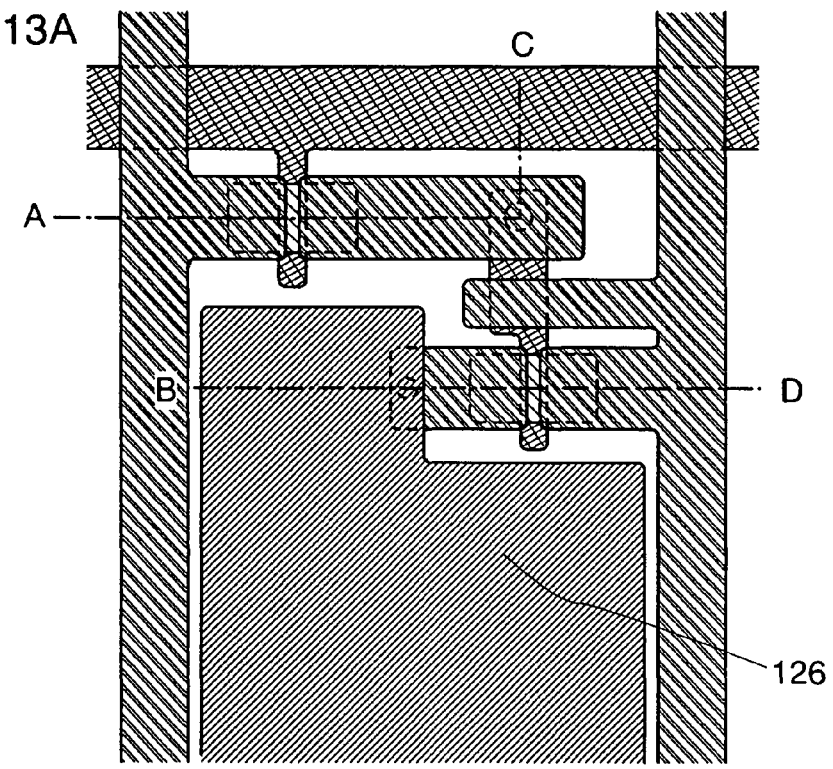
FIGS. 13A to 13C are views explaining a method for manufacturing a display device of the present invention.
Figure 13B:
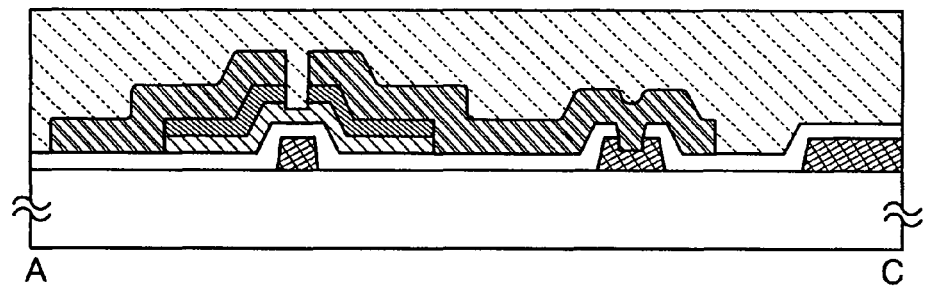
Figure 13C:
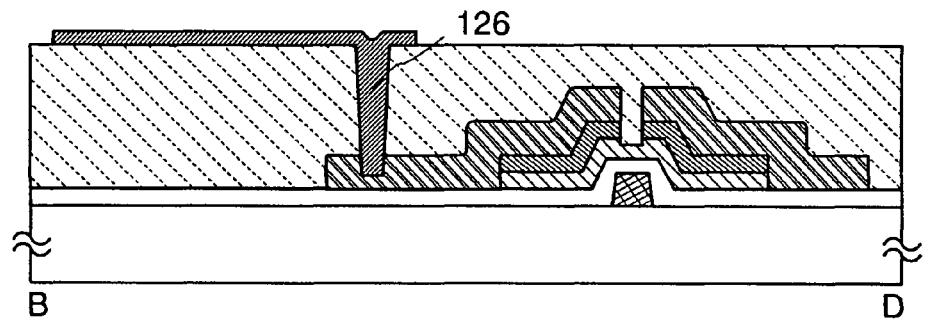

Through the above-described steps, transistors 139a and 139b that are inversely staggered TFTs are manufactured (see FIGS. 11A to 11C).

An insulating layer 123 is formed over the gate insulating layer 105 and the transistors 139a and 139b.

The insulating layer 123 can be formed by a sputtering method, a PVD method (Physical Vapor Deposition), a CVD method (Chemical Vapor Deposition) such as a low-pressure CVD method (an LPCVD method) or a plasma CVD method, or the like. In addition, a droplet discharging method, a printing method (a method by which a pattern is formed, such as screen printing or offset printing), a coating method such as a spin coating method, a dipping method, a dispenser method, or the like can be used.

The insulating layer 123 can be formed of a material selected from silicon oxide, silicon nitride, silicon oxynitride, aluminum oxide, aluminum nitride, aluminum oxynitirde, diamond-like carbon (DLC), nitrogen-containing carbon (CN), polysilazane, and another substance containing an inorganic insulating material. Alternatively, a material containing siloxane may be used. Alternatively, an organic insulating material may be used, and as an organic material, polyimide, acrylic, polyamide, polyimide amide, a resist, or benzocyclobuten can be used. Further alternatively, an oxazole resin can be used. For example, photo-curing polybenzoxazole or the like can be used.

Next, an opening 125 is formed in the insulating layer 123. In this embodiment mode, the opening 125 is formed using laser light as described in Embodiment Mode 1. The source or drain electrode layer 119 is selectively irradiated with laser light 124 from the insulating layer 123 side, and part of an irradiated region of the source or drain electrode layer 119 is evaporated, so that a source or drain electrode layer 141 is formed. The insulating layer 123 over the irradiated region of the source or drain electrode layer 119 is removed by the irradiated energy, so that the opening 125 can be formed (see FIGS. 12A to 12C).

A first electrode layer 126 of a light-emitting element, serving as a pixel electrode is formed in the opening 125 where the source or drain electrode layer 141 is exposed, so that the source or drain electrode layer 141 and the first electrode layer 126 can be electrically connected to each other.

As described in Embodiment Mode 3, the first electrode layer 126 may also be formed in such a manner that a conductive light-absorbing film is formed over a transfer substrate, and then is processed into a desired shape by laser light irradiation to be selectively formed over a substrate to which the light-absorbing film is transferred.

In this embodiment mode, the first electrode layer is formed in such a manner that a conductive film is formed, and then is processed into a desired shape with a mask layer.

The first electrode layer 126 can be formed by a sputtering method, a PVD method (Physical Vapor Deposition), a CVD method (Chemical Vapor Deposition) such as a low-pressure CVD method (an LPCVD method) or a plasma CVD method, or the like. As a conductive material for forming the first electrode layer 126, indium tin oxide (ITO), indium tin oxide containing silicon oxide (ITSO), zinc oxide (ZnO), or the like can be used. More preferably, indium tin oxide containing silicon oxide which is formed using a target in which silicon oxide is contained in ITO at 2 to 10 wt % by a sputtering method is used. Besides, a conductive material in which ZnO is doped with gallium (Ga) or indium zinc oxide (IZO) that is an oxide conductive material, which is formed using a target in which silicon oxide is contained and zinc oxide (ZnO) is contained in indium oxide at 2 to 20 wt % may also be used.

A resin material such as an epoxy resin, a phenol resin, a novolac resin, an acrylic resin, a melamine resin, or a urethane resin is used for the mask layer. The mask layer is formed using an organic material such as benzocyclobutene, parylene, fluorinated arylene ether, or polyimide having a light-transmitting property, a compound material formed by polymerization of siloxane-based polymer or the like, a composition material containing a water-soluble homopolymer and a water-soluble copolymer, or the like by a droplet discharging method. Alternatively, a commercial resist material including photosensitizer may be used. For example, a positive type resist or a negative type resist may be used. In the case of using any material, the surface tension and the viscosity are appropriately adjusted by adjustment of the concentration of a solvent or by addition of a surface-active agent or the like.

As process of the first electrode layer 126, etching process by either dry etching or wet etching may be used. An ICP (Inductively Coupled Plasma) etching method is used and etching conditions (such as electric energy applied to a coiled electrode, electric energy applied to an electrode on a substrate side, an electrode temperature on the substrate side, and the like) are appropriately controlled, so that the electrode layer can be etched into a tapered shape. Further, as an example of an etching gas, the following can be appropriately used: a chlorine-based gas typified by $Cl_2$, $BCl_3$, $SiCl_4$, or $CCl_4$; a fluorine-based gas typified by $CF_4$, $SF_6$, or $NF_3$; or $O_2$.

The first electrode layer 126 may be cleaned and polished by a CMP method or a polyvinyl alcohol-based porous body so that a surface of the first electrode layer 126 is planarized. In addition, after polishing by a CMP method, ultraviolet irradiation, oxygen plasma treatment, or the like may be performed to the surface of the first electrode layer 126.

Through the above steps, a TFT substrate for a display panel in which a bottom gate TFT and the first electrode layer 126 are connected to each other over the substrate 100 is completed. In addition, the TFT in this embodiment mode is an inversely staggered TFT.

Next, an insulating layer 131 (also referred to as a partition wall) is selectively formed. The insulating layer 131 is formed over the first electrode layer 126 so as to have an opening. In this embodiment mode, the insulting layer 131 is formed over an entire surface of the first electrode layer 126, and is etched by a mask made of a resist or the like to be processed. In the case of forming the insulating layer 131 by a droplet discharging method, a printing method, a dispenser method, or the like which is capable of direct and selective formation of the insulating layer 131, the process by etching is not necessarily performed.

The insulating layer 131 can be formed of an inorganic insulating material such as silicon oxide, silicon nitride, silicon oxynitride, aluminum oxide, aluminum nitride, aluminum oxynitride, or another insulating material; acrylic acid, methacrylic acid, or a derivative thereof; a heat resistant high molecular material such as polyimide, aromatic polyamide, or polybenzimidazole; an inorganic siloxane based insulating material having an Si—O—Si bond among compounds made of silicon, oxygen, and hydrogen, using a siloxane based material as a starting material; or an organic siloxane based insulating material in which hydrogen bonded with silicon is substituted with an organic group such as methyl or phenyl. Also, the insulating layer 131 may be formed using a photosensitive or a non-photosensitive material such as an acrylic resin, or a polyimide resin. The insulating layer 131 preferably has a form of which a curvature radius changes continuously, so that coverage with an electroluminescent layer 132 and a second electrode layer 133 formed thereover are improved.

After the insulating layer 131 is formed by discharge of a component by a droplet discharging method, a surface thereof may be planarized by pressing with pressure to improve planarity. As a pressing method, unevenness may be reduced by moving of a roller-shaped object on the surface, or the surface may be perpendicularly pressed with a flat plate-shaped object. Alternatively, surface unevenness may be eliminated with an air knife after softening or melting the surface with a solvent or the like. A CMP method may be alternatively used for polishing the surface. This step may be employed in planarizing the surface when unevenness is generated by a droplet discharging method. When the planarity is improved by this step, display irregularity or the like of a display panel can be prevented; thus, a high-definition image can be displayed.

A light-emitting element is formed over the substrate 100 that is the TFT substrate for the display panel (see FIGS. 14A and 14B).

Before the electroluminescent layer 132 is formed, heat treatment at 200° C. is performed in atmospheric pressure, so that moisture in the first electrode layer 134 and the insulating layer 131 or adsorbed on surfaces thereof is removed. In addition, it is preferable that the electroluminescent layer 132 be formed by heat treatment under reduced pressure at 200 to 400° C., preferably 250 to 350° C., and then vacuum evaporation method or a droplet discharging method under reduced pressure without being exposed to the air.

As the electroluminescent layer 132, materials showing light emission of red (R), green (G), and blue (B) are each selectively formed by an evaporation method using an evaporation mask, or the like. The materials showing light emission of red (R), green (G), and blue (B) are preferable because they can be formed by a droplet discharging method like a color filter (such as a low molecular weight material or a high molecular weight material), and in this case, RGB color separation can be realized without using a mask. The second electrode layer 133 is stacked over the electroluminescent layer 132, so that a display device with a display function, in which the light-emitting element is used is completed.

Although not shown, it is effective to provide a passivation film so as to cover the second electrode layer 133. The passivation (protective) film provided in forming the display device may have a single layer structure or a multilayer structure. The passivation film is formed of an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide (AlNO) in which the content of nitrogen is larger than that of oxygen, aluminum oxide, diamond-like carbon (DLC), or nitrogen-containing carbon (CNx), and a single layer of the insulating film or a stacked layer including the insulating films can be used. For example, a stacked layer formed of a nitrogen-containing carbon (CNx) film and a silicon nitride (SiN) film may be used. Alternatively, an organic material can be used, and a stacked layer of polymer such as styrene polymer may be used. Further alternatively, a siloxane material may be used.

At this time, a film with excellent coverage is preferably used as the passivation film, and it is effective to use a carbon film, especially a DLC film. A DLC film can be formed at temperatures ranging from room temperature to less than or equal to 100° C.; therefore, the DLC film can be easily formed over the electroluminescent layer with low heat resistance. The DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam vapor deposition method, a laser vapor deposition method, or the like. As a reaction gas for deposition, a hydrogen gas and a hydrocarbon-based gas (for example, $CH_4$, $C_2H_2$, or $C_6H_6$) are used and ionized by glow discharge, and then deposition is carried out with accelerative collision of ions with a cathode to which a negative self-bias is applied. In addition, the CN film may be formed using $C_2H_4$ gas and $N_2$ gas as reaction gases. The DLC film has high blocking effect against oxygen, and thus can suppress oxidation of the electroluminescent layer. Therefore, a problem of oxidation of the electroluminescent layer during a subsequent sealing step can be prevented.

A sealant is formed and sealing is performed with the use of a sealing substrate. After that, a gate wiring layer formed to be electrically connected to the gate electrode layer 103 may be connected to a flexible wiring board for external electrical connection. This similarly applies to a source wiring layer formed to be electrically connected to the source or drain electrode layer 116 that also serves as a source wiring layer.

A space between the substrate 100 including the element and the sealing substrate is filled with filler to be sealed. The space can be filled with the filler by a dripping method. The filler may be replaced with an inert gas such as nitrogen. Moreover, deterioration of a light-emitting element due to moisture can be prevented when a drying agent is provided in a display device. The drying agent may be provided either on the sealing substrate side or the element-formed substrate side, in such a way that a depressed portion is formed in a region of the substrate where the sealant is formed. When the drying agent is provided in a position corresponding to a region that does not contribute to displaying such as a driver circuit region or a wiring region of the sealing substrate, the aperture ratio is not lowered even if the drying agent is not transparent. The filler may be formed so as to contain a hygroscopic material, so that the filler has a function of a drying agent. Accordingly, a display device having a display function using a light-emitting element is completed.

Although a switching TFT has a single gate structure in this embodiment mode, the switching TFT may have a multigate structure such as a double gate structure. In addition, when a semiconductor is formed using a SAS or a crystalline semiconductor, an impurity region can be formed by addition of an impurity imparting one conductivity type. In this case, a semiconductor layer may have impurity regions that have different concentrations. For example, the vicinity of a channel region of the semiconductor layer, where the gate electrode layer is stacked, may be a low-concentration impurity region, and the region outside the low-concentration impurity region may be a high-concentration impurity region.

This embodiment mode can be combined with Embodiment Modes 1 to 3, as appropriate.

By the present invention, a component such as a wiring included in a display device can be formed with a desired shape. Moreover, a complicated photolithography step is reduced and the display device can be manufactured by a simplified process. Thus, materials are seldom wasted and reduction in cost can be achieved. Accordingly, a high-performance and highly reliable display device can be manufactured with high yield.

Embodiment Mode 5

In this embodiment mode, an example of a display device for the purpose of manufacture by a highly reliable and more-simplified process at low cost will be explained. Specifically, a light-emitting display device in which a light-emitting element is used for a display element will be explained. A method for manufacturing the display device in this embodiment mode will be explained with reference to FIGS. 15A and 15B.

Over a substrate 150 having an insulating surface, by a sputtering method, a PVD method (Physical Vapor Deposition), a CVD method such as a low-pressure CVD method (an LPCVD method) or a plasma CVD method, or the like, a base film 151a is formed to have a thickness of 10 to 200 nm (preferably, 50 to 200 nm) using a silicon nitride oxide film and a base film 151b with a thickness of 50 to 200 nm (preferably, 100 to 150 nm) formed using a silicon oxynitride film is stacked thereover as a base film. Alternatively, acrylic acid or methacrylic acid, a derivative thereof, a heat-resistant polymer such as polyimide, aromatic polyamide, or polybenzimidazole, or a siloxane resin may be used. Alternatively, a resin material such as a vinyl resin such as polyvinyl alcohol or polyvinylbutyral, an epoxy resin, a phenol resin, a novolac resin, an acrylic resin, a melamine resin, or an urethane resin may be used. Alternatively, an organic material such as benzocyclobutene, parylene, fluorinated arylene ether, or polyimide; a composition material containing a water-soluble homopolymer and a water-soluble copolymer; or the like may be used. Further alternatively, an oxazole resin can be used, and photo-curing polybenzoxazole or the like can be use, for example.

In addition, a droplet discharging method, a printing method (a method by which a pattern is formed, such as screen printing or offset printing), a coating method such as a spin coating method, a dipping method, a dispenser method, or the like can be used. In this embodiment mode, the base films 151a and 151b are formed by a plasma CVD method. As the substrate 150, a glass substrate, a quartz substrate, a silicon substrate, a metal substrate, or a stainless steel substrate on which an insulating film is formed may be used. Alternatively, a heat-resistant plastic substrate which can withstand a treatment temperature of this embodiment mode or a flexible substrate such as a film may be used. As the plastic substrate, a substrate formed of PET (polyethylene terephthalate), PEN (polyethylene naphthalate), or PES (polyether sulfonate) can be used, and a synthetic resin such as acrylic can be used for the flexible substrate. In the display device manufactured in this embodiment mode, light from a light-emitting element is extracted through the substrate 150, and accordingly, it is necessary that the substrate 150 has a light-transmitting property.

As the base film, silicon oxide, silicon nitride, silicon oxynitride, silicon nitride oxide, or the like can be used. The base film may have a single layer structure or a stacked-layer structure including two layers or three layers.

Next, a semiconductor film is formed over the base film. The semiconductor film may be formed to have a thickness of 25 to 200 nm (preferably, 30 to 150 nm) by various methods (such as a sputtering method, an LPCVD method, or a plasma CVD method). In this embodiment mode, it is preferable to use a crystalline semiconductor film formed by crystallization of an amorphous semiconductor film by laser irradiation.

The semiconductor film obtained in this manner may be doped with a small amount of impurity element (born or phosphorus) in order to control threshold voltage of a thin film transistor. This doping of the impurity element may be performed to the amorphous semiconductor film before a crystallization step. Doping of an impurity element to an amorphous semiconductor film makes it possible to activate an impurity by heat treatment for crystallization performed thereafter. Moreover, a defect or the like generated in doping can be improved.

Next, the crystalline semiconductor film is processed into a desired shape, so that a semiconductor layer is formed.

Although either one of plasma etching (dry etching) and wet etching may be employed for the etching process, plasma etching is suitable for process of a large-area substrate. As an etching gas, a fluorine-based gas or chlorine-based gas such as $CF_4$, $NF_3$, $Cl_2$, or $BCl_3$ is used, and an inter gas such as He or Ar may be appropriately added to the etching gas. In addition, when etching process is performed by atmospheric discharge plasma, local discharge process becomes possible; therefore, it is not necessary that the mask layer is formed over an entire surface of the substrate.

In the present invention, a conductive layer for forming a wiring layer or an electrode layer, a mask layer for forming a predetermined pattern, or the like may be formed by a method by which a pattern can be selectively formed, such as a droplet discharging method. By the droplet discharging (jetting) method (also referred to as an inkjet method according to the system thereof), a predetermined pattern (a conductive layer, an insulating layer or the like) can be formed by selective discharge (jet) of liquid droplets of a composition prepared for a specific purpose. In this case, a process for controlling wettability or adhesion may be performed to the formation region. Further, a method for transferring or drawing a pattern, for example, a printing method (a method for forming a pattern, such as screen printing or offset printing), a dispenser method, or the like can also be used.

A gate insulating layer that covers the semiconductor layer is formed. The gate insulating layer is formed of an insulating film containing silicon to have a thickness of 10 to 150 nm by a plasma CVD method, a sputtering method, or the like. The gate insulating layer may be formed of a material such as an oxide material containing silicon or nitride material containing silicon typified by silicon nitride, silicon oxide, silicon oxynitride, or silicon nitride oxide, and may be a stacked layer or a single layer. In addition, the insulating layer may be a stacked layer including three layers formed of a silicon nitride film, silicon oxide film, and a silicon nitride film; a single layer formed of silicon oxynitride film, or a stacked layer including two layers.

Next, a gate electrode layer is formed over the gate insulating layer. The gate electrode layer can be formed by a method such as a sputtering method, an evaporation method, or a CVD method. The gate electrode layer may be formed of an element selected from tantalum (Ta), tungsten (W), titanium (Ti), molybdenum (Mo), aluminum (Al), copper (Cu), chromium (Cr), and neodium (Nd), or an alloy material or a compound material containing the element as its main component. Alternatively, as the gate electrode layer, a semiconductor film typified by a polycrystalline silicon film doped with an impurity element such as phosphorus or an AgPdCu alloy may be used. In addition, the gate electrode layer may be a single layer or a stacked layer.

In this embodiment mode, the gate electrode layer is formed so as to have a tapered shape; however, the present invention is not limited thereto. The gate electrode layer may have a stacked-layer structure in which only one layer has a tapered shape and the other has a perpendicular side surface by anisotropic etching. As in this embodiment mode, a taper angle may be different or the same between the stacked gate electrode layers. With the tapered shape, coverage with a film stacked thereover is improved and defects are reduced, so that reliability is improved.

The gate insulating layer is etched to some extent by an etching step in forming the gate electrode layer, so that the thickness is reduced (so-called reduction in thickness) in some cases.

An impurity element is added to the semiconductor layer, so that an impurity region is formed. The impurity region can be a high concentration impurity region or a low concentration impurity region by control of the concentration. A thin film transistor having a low concentration impurity region is referred to as an LDD (Lightly Doped Drain) structure. In addition, the low concentration impurity region can be formed so as to be overlapped with a gate electrode, and such a thin film transistor is referred to as a GOLD (Gate Overlapped LDD) structure. The polarity of the thin film transistor is n-type when phosphorus (P) or the like is added to the impurity region. In the case where the polarity thereof is p-type, boron (B) or the like may be added.

In this embodiment mode, a region where the impurity region is overlapped with the gate electrode layer with the gate insulating layer interposed therebetween is denoted as a Lov region, and a region where the impurity region is not overlapped with the gate electrode layer with the gate insulating layer interposed therebetween is denoted as a Loff region. In FIG. 15B, the impurity regions are shown by hatching and blank spaces. This does not mean that the blank spaces are not doped with an impurity element, but shows that the concentration distribution of the impurity element in this region depends on a mask and the doping conditions so as to be understood intuitively. It is to be noted that this similarly applies to the other drawings of this specification.

Heat treatment, strong light irradiation, or laser light irradiation may be performed for activation of the impurity element. At the same time as the activation, the gate insulating layer and an interface between the gate insulating layer and the semiconductor layer can recover from damage thereto.

Next, a first interlayer insulating layer that covers the gate electrode layer and the gate insulating layer is formed. In this embodiment mode, the first interlayer insulating layer has a stacked-layer structure formed of an insulating film 167 and an insulating film 168. Each of the insulating films 167 and 168 can be formed of a silicon nitride film, a silicon nitride oxide film, a silicon oxynitride film, a silicon oxide film, or the like by a sputtering method or a plasma CVD method, or a single layer structure of another insulating film containing silicon or a stacked-layer structure including three or more layers thereof.

Furthermore, heat treatment is performed in a nitrogen atmosphere at 300 to 550° C. for 1 to 12 hours, so that a step of hydrogenating the semiconductor layer is performed. The heat treatment is preferably performed at 400 to 500° C. This step is a step of terminating dangling bonds of the semiconductor layer with hydrogen contained in the insulating film 167 that is the interlayer insulating layer. In this embodiment mode, heat treatment is performed at 410° C.

The insulating film 167 and the insulating film 168 can be formed of a material selected from aluminum nitride (AlN), aluminum oxynitride (AlON), aluminum nitride oxide (AlNO) in which the content of nitrogen is higher than that of oxygen, aluminum oxide, diamond-like carbon (DLC), nitrogen-containing carbon (CN), polysilazane, and another substance containing an inorganic insulating material. Alternatively, a material containing siloxane may be used. An organic insulating material may be used, and as an organic material, polyimide, acrylic, polyamide, polyimide amide, a resist, or benzocyclobutene can be used. Moreover, an oxazole resin can be used. For example, a photo-curing polybenzoxazole or the like can be used.

Next, a contact hole (an opening) reaching the semiconductor layer is formed in the insulating film 167, the insulating film 168, and the gate insulating layer.

In this embodiment mode, the opening is formed using laser light as described in Embodiment Mode 1. A source region and a drain region of the semiconductor layer are selectively irradiated with laser light from the insulating films 167 and 168 side. Part of irradiated regions of the source region and the drain region of the semiconductor layer is evaporated by the irradiated energy, so that the insulating film 167, the insulating film 168, and the gate insulating layer over the irradiated regions of the source region and the drain region of the semiconductor layer are removed. Accordingly, the opening can be formed.

A source electrode layer and a drain electrode layer are formed in the opening where the source region and the drain region of the semiconductor layer are exposed, so that the source region of the semiconductor layer can be electrically connected to the source electrode layer and the drain region of the semiconductor layer can be electrically connected to the drain electrode layer.

The source and drain electrode layers can be formed in such a manner that a conductive film is formed by a PVD method, CVD method, an evaporation method, or the like, and then the conductive film is processed into a desired shape. In addition, a conductive layer can be selectively formed in a predetermined place by a droplet discharging method, a printing method, a dispenser method, an electroplating method, or the like. Furthermore, a reflow method or damascene method may be used. The source or the drain electrode layer is formed using a metal such as Ag, Au, Cu, Ni, Pt, Pd, Ir, Rh, W, Al, Ta, Mo, Cd, Zn, Fe, Ti, Si, Ge, Zr, or Ba or metal nitride thereof. Also, a stacked-layer structure of these may be used.

The gate electrode layer, the semiconductor layer, the source electrode layer, and the drain electrode layer which are included in the display device described in this embodiment mode can be formed in such a manner that a light-absorbing film using a conductive material or a semiconductor material is formed over a transfer substrate, and then is processed into a desired shape by laser light irradiation to be selectively formed over a substrate to which the light-absorbing film is transferred, as described in Embodiment Mode 3. Accordingly, a photolithography step is not used, so that a process is simplified and waste of material can be prevented; therefore, reduction in cost can be achieved.

Through the above-described steps, an active matrix substrate can be manufactured, in which a thin film transistor 285 that is a p-channel thin film transistor where a p-type impurity region is included in a Lov region and a thin film transistor 275 that is an n-channel thin film transistor where an n-channel impurity region is included in a Lov region are included in a peripheral driver circuit region 204, and a thin film transistor 265 that is a multi-channel n-channel thin film transistor where an n-type impurity region is included in a Loff region and a thin film transistor 255 that is a p-channel thin film transistor where a p-channel impurity region is included in a Lov region are included in a pixel region 206.

The thin film transistor is not limited to that described in this embodiment mode. The thin film transistor may have a single gate structure in which one channel formation region is formed, a double gate structure in which two channel formation regions are formed, or a triple gate structure in which three channel formation regions are formed. In addition, the thin film transistor in the peripheral driver circuit region may also have a single gate structure, a double gate structure, or a triple gate structure.

Next, an insulating film 181 is formed as a second interlayer insulating layer. In FIG. 15B, a separation region 201 for separating by scribing, an external terminal connection region 202 that is an attachment portion of an FPC, a wiring region 203 that is a lead wiring region of a peripheral portion, the peripheral driver circuit region 204, and the pixel region 206 are shown. A wiring 179a and a wiring 179b are provided in the wiring region 203. A terminal electrode layer 178 connected to an external terminal is provided in the external terminal connection region 202.

The insulating film 181 can be formed of a material selected from silicon oxide, silicon nitride, silicon oxynitride, silicon nitride oxide, aluminum nitride (AlN), aluminum oxide containing nitrogen (also referred to as aluminum oxynitride) (AlON), aluminum nitride containing oxygen (also referred to as aluminum nitride oxide) (AlNO), aluminum oxide, diamond-like carbon (DLC), nitrogen-containing carbon (CN), PSG (phosphosilicate glass), BPSG (borophosphosilicate glass), alumina, and another substance containing an inorganic insulating material. Alternatively, a siloxane resin may be used. Alternatively, an organic insulating material may be used. An organic material may be either photosensitive or non-photosensitive, and polyimide, acrylic, polyamide, polyimide amide, a resist, benzocyclobutene, or a low dielectric constant (Low-k) material can be used. Further alternatively, an oxazole resin can be used. For example, a photo-curing polybenzoxazole or the like can be used. Since an interlayer insulating layer provided for planarization needs to have high heat resistance, high insulating property, and high planarity, the insulating film 181 is preferably formed by a coating method typified by a spin coating method.

Instead, the insulating film 181 can be formed by dipping, spray coating, a doctor knife, a roll coater, a curtain coater, a knife coater, a CVD method, an evaporation method, or the like. The insulating film 181 may be formed by a droplet discharging method. In a case of using a droplet discharging method, a material liquid can be saved. Alternatively, a method like a droplet discharging method by which a pattern can be transferred or drawn, such as a printing method (a method by which a pattern is formed, such as screen printing or offset printing), a dispenser method, or the like can be used.

A minute opening, that is, a contact hole is formed in the insulating film 181 in the pixel region 206. The source or drain electrode layer is electrically connected to a first electrode layer 185 at the opening formed in the insulating film 181. The opening formed in the insulating film 181 can be formed by laser light irradiation as described in Embodiment Mode 1. In this embodiment mode, the source or drain electrode layer is formed using a low melting point metal that is comparatively easy to be evaporated (chromium in this embodiment mode). The source or drain electrode layer is selectively irradiated with laser light from the insulating film 181 side. Part of an irradiated region of the source or drain electrode layer is evaporated by the irradiated energy, so that the insulating film 181 over the irradiated region of the source or drain electrode layer is removed. Accordingly, an opening can be formed. The first electrode layer 185 is formed in the opening where the source or drain electrode layer is exposed, so that the source or drain electrode layer and the first electrode layer 185 can be electrically connected to each other.

The first electrode layer 185 serves as an anode or a cathode. The first electrode layer 185 may be formed of an element selected from Ti, Ni, W, Cr, Pt, Zn, Sn, In, and Mo; a film mainly containing an alloy material or a compound material containing the element as its main component, such as titanium nitride, $TiSi_xN_y$, $WSI_x$, tungsten nitride, $WSi_xN_y$, or NbN; or a stacked film thereof with a total thickness of 100 to 800 nm.

In this embodiment mode, a structure in which a light-emitting element is used as a display element and light emitted from the light-emitting element is extracted from the first electrode layer 185 side; therefore, the first electrode layer 185 has a light-transmitting property. The first electrode layer 185 is formed in such a manner that a transparent conductive film is formed and then etched into a desired shape.

In the present invention, the first electrode layer 185 that is a light-transmitting electrode layer may be specifically formed using a transparent conductive film formed of a conductive material having a light-transmitting property, such as indium oxide containing tungsten oxide, indium zinc oxide containing tungsten oxide, indium oxide containing titanium oxide, or indium tin oxide containing titanium oxide. It is needless to say that indium tin oxide (ITO), indium zinc oxide (IZO), indium tin oxide to which silicon oxide is added (ITSO), or the like can also be used.

Even in a case of using a material such as a metal film which does not have a light-transmitting property, light can be transmitted through the first electrode layer 185 when the first electrode layer 185 is formed to be very thin (preferably, a thickness of approximately 5 nm to 30 nm) so as to be able to transmit light. A metal thin film which can be used for the first electrode layer 185 is a conductive film formed of titanium, tungsten, nickel, gold, platinum, silver, aluminum, magnesium, calcium, lithium, or an alloy thereof.

The first electrode layer 185 can be formed by an evaporation method, a sputtering method, a CVD method, a printing method, a dispenser method, a droplet discharging method, or the like. In this embodiment mode, the first electrode layer 185 is formed by a sputtering method using indium zinc oxide containing tungsten oxide. The first electrode layer 185 preferably has a total thickness of 100 to 800 nm. As described in Embodiment Mode 3, the first electrode layer 185 may be formed in such a manner that a conductive light-absorbing film is formed over a transfer substrate, and then is processed into a desired shape by laser light irradiation to be selectively formed over a substrate to which the light-absorbing film is transferred.

The first electrode layer 185 may be cleaned and polished by a CMP method or a polyvinyl alcohol-based porous body so that a surface of the first electrode layer 185 is planarized. In addition, after polishing by a CMP method, ultraviolet irradiation, oxygen plasma treatment, or the like may be performed to the surface of the first electrode layer 185.

After the first electrode layer 185 is formed, heat treatment may be performed. By this heat treatment, moisture contained in the first electrode layer 185 is discharged. Thus, degasification of the first electrode layer 185 does not occur; therefore, even if a light-emitting material which is easily deteriorated due to moisture is formed over the first electrode layer 185, the light-emitting material is not deteriorated. Accordingly, a highly reliable display device can be manufactured.

Next, an insulating layer 186 (also referred to as a partition wall, a barrier, or the like) that covers an edge of the first electrode layer 185 and the source electrode layer and the drain electrode layer is formed.

The insulating layer 186 can be formed of silicon oxide, silicon nitride, silicon oxynitride, or silicon nitride oxide. The insulating layer 186 may have a single layer structure or a stacked-layer structure including two layers or three layers. As another material for the insulating layer 186, a material selected from aluminum nitride, aluminum oxynitride in which the content of oxygen is higher than that of nitrogen, aluminum nitride oxide in which the content of nitrogen is higher than that of oxygen, aluminum oxide, diamond-like carbon (DLC), nitrogen-containing carbon, polysilazane, and another substance containing an inorganic insulating material can be used. A material containing siloxane may also be used. Furthermore, an organic insulating material may be used. An organic material may be either photosensitive or non-photosensitive, and polyimide, acrylic, polyamide, polyimide amide, a resist, or benzocyclobutene can be used. Moreover, an oxazole resin can be used. For example, a photo-curing polybenzoxazole or the like can be used.

The insulating layer 186 can be formed by a sputtering method, a PVD method (Physical Vapor Deposition), a CVD method such as a low-pressure method (an LPCVD method) or a plasma CVD method, a droplet discharging method by which a pattern can be selectively formed, a printing method by which a pattern can be transferred or drawn (a method by which a pattern is formed, such as screen printing or offset printing), a dispenser method, a coating method such as a spin coating method, a dipping method, or the like.

Either one of plasma etching (dry etching) and wet etching may be employed for the etching process for a desired shape. Plasma etching is suitable for process of a large-area substrate. As an etching gas, a fluorine-based gas or chlorine-based gas such as $CF_4$, $NF_3$, $Cl_2$, or $BCl_3$ is used, and an inter gas such as He or Ar may be appropriately added to the etching gas. In addition, when etching process is performed by atmospheric discharge plasma, local discharge process becomes possible; therefore, it is not necessary that the mask layer is formed over an entire surface of the substrate.

Figure 15A:
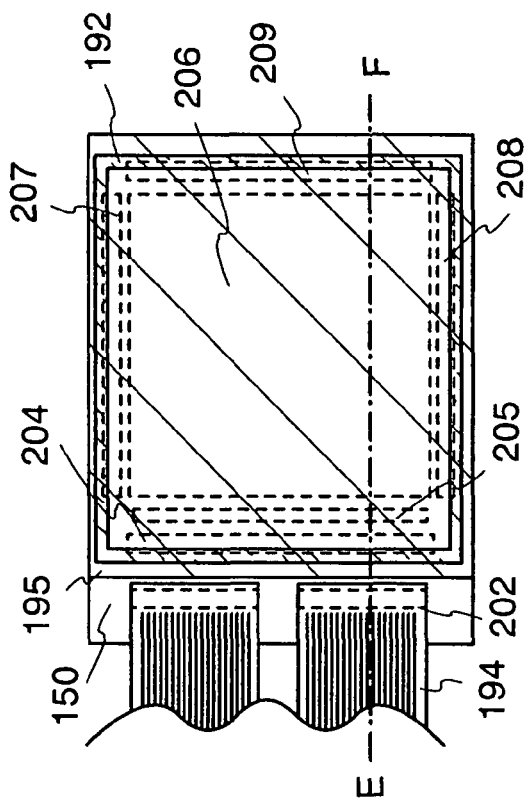
FIGS. 15A and 15B are views explaining a display device of the present invention.
Figure 15B:
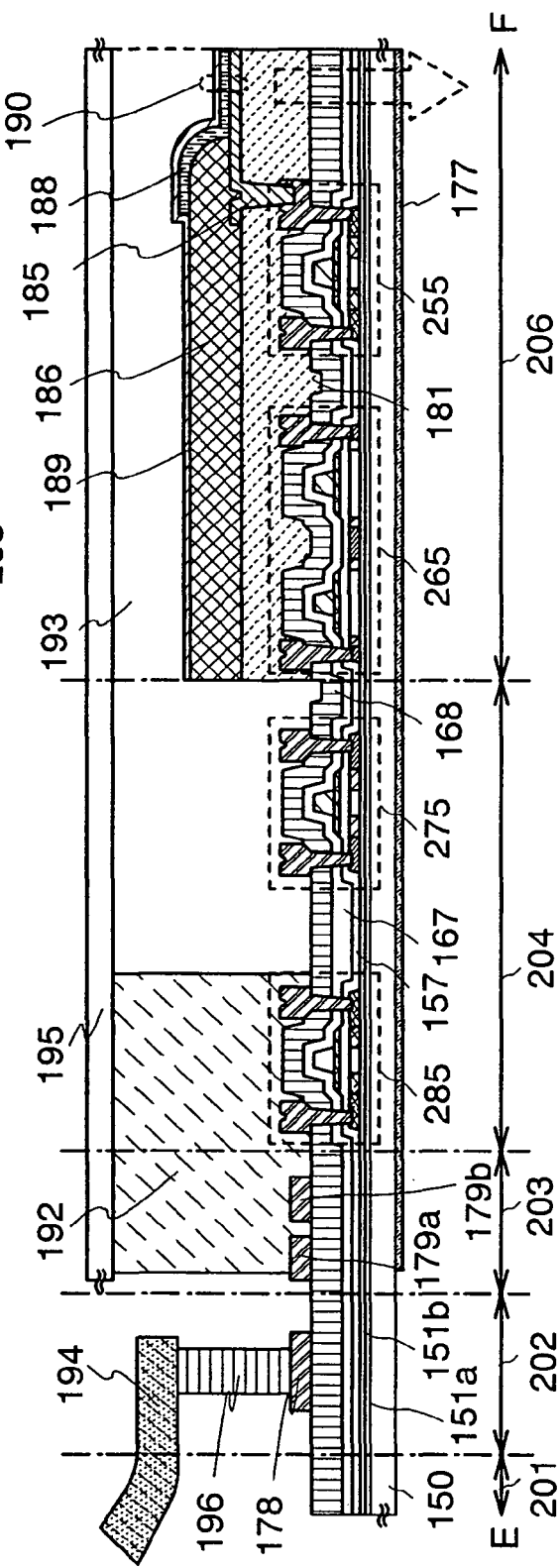

In a connection region 205 shown in FIG. 15A, a wiring layer that is formed by the same step and formed of the same material as those of a second electrode layer is electrically connected to a wiring layer that is formed by the same step and formed of the same material as those of the gate electrode layer.

A light-emitting layer 188 is formed over the first electrode layer 185. It is to be noted that, although only one pixel is shown in FIGS. 15A and 15B, electroluminescent layers corresponding to respective colors of R (red), G (green), and B (blue) are separately formed in this embodiment mode.

Next, a second electrode layer 189 formed of a conductive film is provided over the light-emitting layer 188. The second electrode layer 189 may be formed of Al, Ag, L1, Ca, an alloy or an compound thereof such as MgAg, MgIn, AlLi, $CaF_2$, or a calcium nitride. Accordingly, a light-emitting element 190 including the first electrode layer 185, the light-emitting layer 188, and the second electrode layer 189 is formed (see FIG. 15B).

In the display device of this embodiment mode described in FIGS. 15A and 15B, light emitted from the light-emitting element 190 is emitted through the first electrode layer 185 in the direction of an arrow shown in FIG. 15B.

In this embodiment mode, an insulating layer may be provided over the second electrode layer 189 as a passivation film (a protective film). It is effective to provide the passivation film so as to cover the second electrode layer 189 as described above. The passivation film is formed of an insulating film containing silicon nitride, silicon oxide, silicon oxynitride, silicon nitride oxide, aluminum nitride, aluminum oxynitride, aluminum nitride oxide in which the content of nitrogen is higher than that of oxygen, aluminum oxide, a diamond-like carbon (DLC), or nitrogen-containing carbon, and a single layer of the insulating film or a stacked layer in which the insulating films are combined can be used. Alternatively, a siloxane resin may be used.

At this time, a film with excellent coverage is preferably used as the passivation film, and it is effective to use a carbon film, especially a DLC film. A DLC film can be formed at temperatures ranging from room temperature to less than or equal to 100° C.; therefore, the DLC film can be easily formed over the electroluminescent layer with low heat resistance. The DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam vapor deposition method, a laser vapor deposition method, or the like. As a reaction gas for deposition, a hydrogen gas and a hydrocarbon-based gas (for example, $CH_4$, $C_2H_2$, or $C_6H_6$) are used and ionized by glow discharge, and then deposition is carried out with accelerative collision of ions with a cathode to which a negative self-bias is applied. In addition, the CN film may be formed using $C_2H_4$ gas and $N_2$ gas as reaction gases. The DLC film has high blocking effect to oxygen and thus can suppress oxidation of the light-emitting layer 188. Therefore, a problem of oxidation of the light-emitting layer 188 during a subsequent sealing step can be prevented.

The substrate 150 over which the light-emitting element 190 is formed as described above and a sealing substrate 195 are fixed to each other with a sealant 192, so that the light-emitting element is sealed (see FIGS. 15A and 15B). As the sealant 192, it is typically preferable to use a visible light curable resin, an ultraviolet curable resin, or a heat curable resin. For example, an epoxy resin such as a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type (Epichlorohydrin-Bisphenol) epoxy resin, a glycidyl ester resin, a glycidyl amine resin, a heterocyclic epoxy resin, or a modified epoxy resin can be used. It is to be noted that a region surrounded by the sealant may be filled with a filler 193, or nitrogen or the like may be enclosed by sealing the region in a nitrogen atmosphere. Since the display device of this embodiment mode is of bottom emission type, the filler 193 does not need to have a light-transmitting property. However, in the case of employing a structure in which light is extracted through the filler 193, the filler 193 needs to have a light-transmitting property. Typically, a visible light curable, ultraviolet curable, or thermosetting epoxy resin may be used. Through the above steps, the display device of this embodiment mode with a display function in which the light-emitting element is used is completed. Alternatively, the filler can be dropped in a liquid state, so that the display device is filled with the filler. When a substance having a hygroscopic property such as a drying agent is used as the filler, a higher water-absorbing effect can be obtained, and element deterioration can be prevented.

In order to prevent element deterioration due to moisture, a drying agent is provided in an EL display panel. In this embodiment mode, the drying agent is provided in a depressed portion formed in the sealing substrate so as to surround the pixel region, so that it does not interfere with a reduction in thickness. Further, when the drying agent is also formed in a region corresponding to a gate wiring layer so that a moisture absorbing area becomes wide, moisture can be effectively absorbed. In addition, when the drying agent is formed over the gate wiring layer which does not directly contribute to light emission, a reduction in light extraction efficiency does not occur.

In this embodiment mode, the case where the light-emitting element is sealed with a glass substrate. Sealing treatment is a treatment for protecting the light-emitting element from moisture. Therefore, any of the following method is used: a method in which a light-emitting element is mechanically sealed with a cover material, a method in which a light-emitting element is sealed with a thermosetting resin or an ultraviolet curable resin, and a method in which a light-emitting element is sealed with a thin film of metal oxide, metal nitride, or the like having high barrier capability. As the cover material, glass, ceramics, plastic, or a metal can be used. However, when light is emitted to the cover material side, the cover material needs to have a light-transmitting property. The cover material is attached to the substrate over which the above-described light-emitting element is formed, with a sealant such as a thermosetting resin or an ultraviolet curable resin, and the resin is cured with heat treatment or ultraviolet light irradiation treatment, so that a sealed space is formed. It is also effective to provide a moisture absorbing material typified by barium oxide in the sealed space. The moisture absorbing material may be provided on the sealant or over a partition or a peripheral portion so as not to block light emitted from the light emitting element. Further, a space between the cover material and the substrate over which the light emitting element is formed can also be filled with a thermosetting resin or an ultraviolet curable resin. In this case, it is effective to add a moisture absorbing material typified by barium oxide in the thermosetting resin or the ultraviolet curable resin.

In addition, the source or drain electrode layer and the first electrode layer may be connected to each other through a wiring layer instead of being directly connected to each other.

In this embodiment mode, an FPC 194 is connected to the terminal electrode layer 178 by an anisotropic conductive layer 196 in the external terminal connection region 202 so as to have an electrical connection with the outside. Moreover, as shown in FIG. 15A that is a top view of the display device, the display device manufactured in this embodiment mode includes a peripheral driver circuit region 207 and a peripheral driver circuit region 208 each having scanning line driver circuits, in addition to the peripheral driver circuit region 204 and a peripheral driver circuit region 209 each having signal line driver circuits.

In this embodiment mode, the display device includes the above-described circuits; however, the present invention is not limited thereto, and an IC chip may be mounted as a peripheral driver circuit by the above-described COG method or the above-described TAB method. Moreover, a single scanning line driver circuit and signal line driver circuit or a plurality of scanning line driver circuits and signal line driver circuits may be provided.

As for the display device of the present invention, a driving method for image display is not particularly limited. For example, a dot sequential driving method, a line sequential driving method, an area sequential driving method, or the like may be used. Typically, the line sequential driving method is used, and a time division gray scale driving method or an area gray scale driving method may be appropriately used. Further, a video signal inputted to the signal line of the display device may be either an analog signal or a digital signal. The driver circuit and the like may be appropriately designed in accordance with the video signal.

This embodiment mode can be combined with Embodiment Modes 1 to 3, as appropriate.

By the present invention, a component such as a wiring included in a display device can be formed with a desired shape. Moreover, a complicated photolithography step is reduced and the display device can be manufactured by a simplified process. Thus, materials are seldom wasted and reduction in cost can be achieved. Accordingly, a high-performance and highly reliable display device can be manufactured with high yield.

Embodiment Mode 6

A thin film transistor can be formed by application of the present invention and a display device can be formed using the thin film transistor. In the case where a light-emitting element is used, and also an n-channel transistor is used as a transistor for driving the light-emitting element, light is emitted from the light-emitting element by any of bottom emission, top emission, and dual emission. Here, a stacked-layer structure of the light-emitting element corresponding to each case will be explained with reference to FIGS. 17A to 17C.

In addition, channel protective thin film transistors 461, 471, and 481 to which the present invention is applied are used in this embodiment mode. The thin film transistor 481 is provided over a light-transmitting substrate 480, which includes a gate electrode layer 493, a gate insulating layer 497, a semiconductor layer 482, an n-type semiconductor layer 495a, an n-type semiconductor layer 495b, a source or drain electrode layer 487a, a source or drain electrode layer 487b, a channel protective layer 496, an insulating layer 499, and a wiring layer 498. As described in Embodiment Mode 3, the gate electrode layer, the semiconductor layer, the source electrode layer, the drain electrode layer, or the like may be formed in such a manner that a conductive light-absorbing film is formed over a transfer substrate, and then is processed into a desired shape by laser light irradiation to be selectively formed over a substrate to which the light-absorbing film is transferred. A process can be simplified and waste of material can be prevented; thus, reduction in cost can be achieved.

Figure 17A:
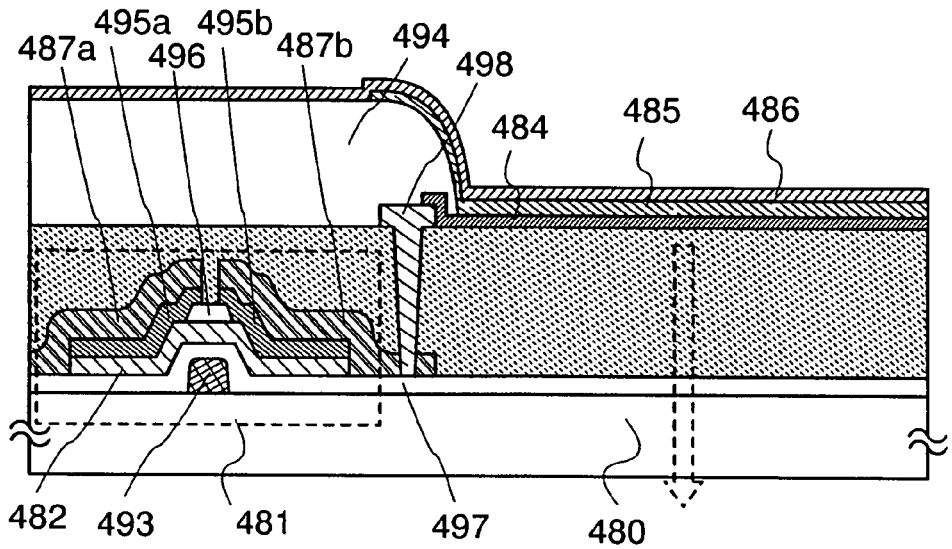
FIGS. 17A to 17C are views each explaining a display device of the present invention.
Figure 17B:
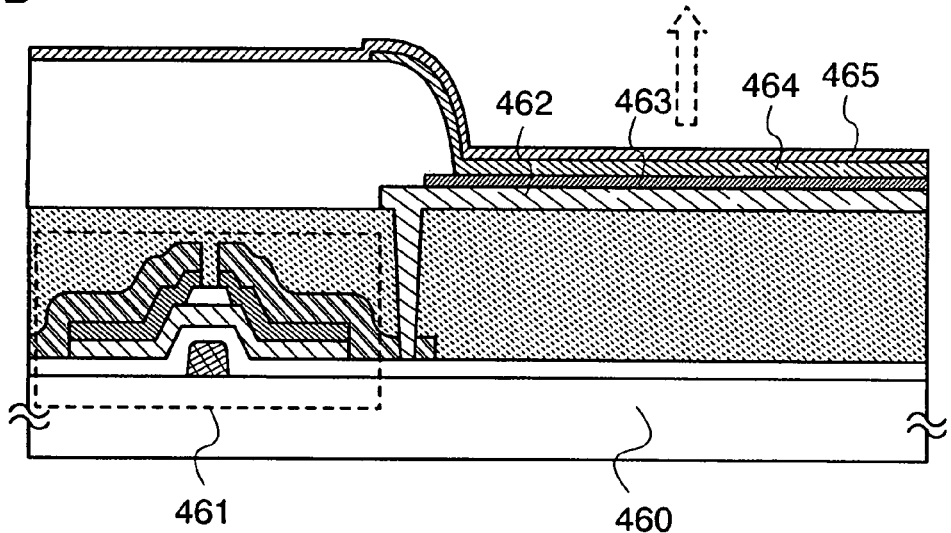
Figure 17C:
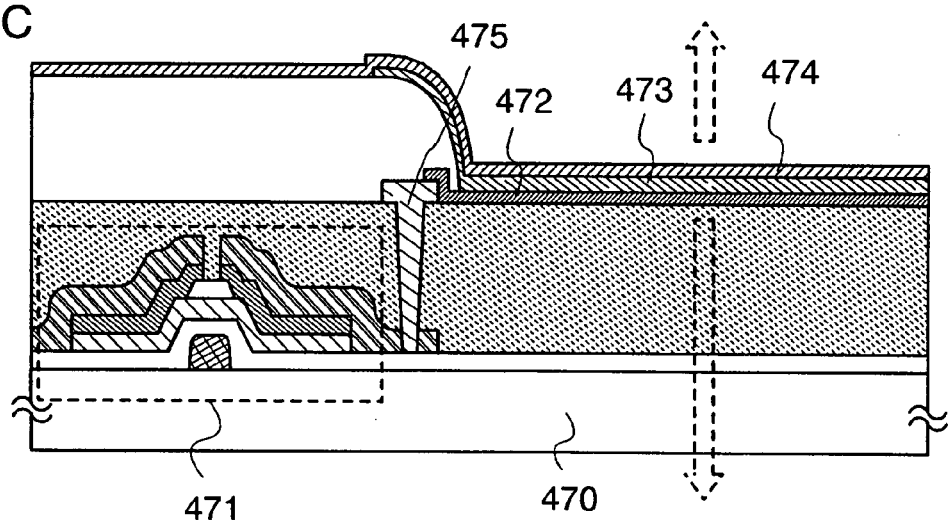

In FIGS. 17A to 17C shown in this embodiment mode, a contact hole (an opening) reaching the source or drain electrode layer 487b is formed in the insulating layer 499.

In this embodiment mode, as described in Embodiment Mode 1, the opening is formed by laser light. The source or drain electrode layer 487*b* is selectively irradiated with laser light from the insulating layer 499 side, so that part of the source or drain electrode layer 487*b* and the insulating layer 499 over an irradiated region of the source or drain electrode layer 487*b* are removed by the irradiated energy, so that the opening reaching the gate insulating layer 497 can be formed.

The wiring layer 498 is formed in the opening where the source or drain electrode layer 487*b* and the gate insulating layer 497 are exposed, so that the source or drain electrode layer 487*b* and the wiring layer 498 can be electrically connected to each other. Since the wiring layer 498 is formed together with a first electrode layer 484 of the light-emitting element, the thin film transistor 481 and the light-emitting element are electrically connected to each other through the wiring layer 498.

In this embodiment mode, an amorphous semiconductor layer is used as a semiconductor layer. However, the present invention is not limited to this embodiment mode. A crystalline semiconductor layer can be used as the semiconductor layer and an n-type semiconductor layer can be used as a semiconductor layer with one conductivity type. Instead of forming the n-type semiconductor layer, conductivity type may be imparted to the semiconductor layer by plasma treatment with a $PH_3$ gas. In the case of using a crystalline semiconductor layer such as polysilicon, an impurity region with one conductivity type may be formed by introduction (addition) of an impurity to the crystalline semiconductor layer without forming the semiconductor layer with one conductivity type. In addition, an organic semiconductor such as pentacene can also be used. When an organic semiconductor is selectively formed by a droplet discharging method, a process step can be simplified.

The case where the crystalline semiconductor layer is used as the semiconductor layer is explained. First, an amorphous semiconductor layer is crystallized to form a crystalline semiconductor layer. In a crystallization step, an element that promotes crystallization (also referred to as a catalyst element or a metal element) is added to the amorphous semiconductor layer and heat treatment (at 550 to 750° C. for 3 minutes to 24 hours) is performed, so that crystallization is performed. As the element that promotes crystallization, one or more kinds of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element that promotes crystallization from the crystalline semiconductor layer, a semiconductor layer containing an impurity element is formed to be in contact with the crystalline semiconductor film, so that the semiconductor layer serves as a gettering sink. As the impurity element, an impurity element imparting n-type conductivity, an impurity element imparting p-type conductivity, a rare gas element, or the like can be used. For example, one or more kinds of phosphorus (P), nitrogen (N), arsenic (As), antimony (Sb), bismuth (Bi), boron (B), helium (He), neon (Ne), argon (Ar), krypton (Kr), and xenon (Xe) can be used. An n-type semiconductor layer is formed to be in contact with the crystalline semiconductor layer containing the element that promotes crystallization, and heat treatment (at 550 to 750° C. for 3 minutes to 24 hours) is performed. The element that promotes crystallization contained in the crystalline semiconductor layer moves to the n-type semiconductor layer, so that the element that promotes crystallization contained in the crystalline semiconductor layer is removed or reduced. Accordingly, the semiconductor layer is formed. On the other hand, the n-type semiconductor layer becomes an n-type semiconductor layer containing a metal element that is an element that promotes crystallization, and then is processed into a desired shape, so that an n-type semiconductor layer is formed. In this manner, the n-type semiconductor layer also serves as a gettering sink of the semiconductor layer and serves as a source region or a drain region.

A crystallization step and a gettering step of the semiconductor layer may be performed by heat treatment performed several times, or the crystallization step and the gettering step can be performed by one heat treatment. In this case, an amorphous semiconductor layer is formed, an element that promotes crystallization is added, a semiconductor layer that serves as a gettering sink is formed, and then heat treatment may be performed.

In this embodiment mode, a gate insulating layer is formed of a stacked layer including a plurality of layers, and a silicon nitride oxide film and a silicon oxynitride film are formed from the gate electrode layer 493 side, so that a stacked-layer structure including two layers is obtained. Insulating layers to be stacked may be continuously formed while changing a reactive gas under the same temperature without breaking a vacuum in the same chamber. When the insulating layers are continuously formed without breaking the vacuum, contamination of an interface between the stacked films can be prevented.

Polyimide, polyvinyl alcohol, or the like may be dropped by a droplet discharging method, so that the channel protective layer 496 is formed. As a result, an exposure step can be omitted. The channel protective layer 496 can be formed using a film formed of one or more kinds of an inorganic material (such as silicon oxide, silicon nitride, silicon oxynitride, or silicon nitride oxide), a photosensitive or non-photosensitive organic material (an organic resin material) (such as polyimide, acrylic, polyamide, polyimide amide, a resist, or benzocyclobuten), and a low dielectric constant material, or a stacked layer of a film formed thereof. In addition, a siloxane material may be used. As a formation method, a sputtering method or a vapor deposition method such as a plasma CVD method or a thermal CVD method can be used. Alternatively, a droplet discharging method, a dispenser method, or a printing method (a method by which a pattern if formed, such as screen printing or offset printing) can be used. An SOG film or the like obtained by a coating method can also be used.

First, the case where light is emitted to the substrate 480 side, that is, the case of bottom emission, is explained with reference to FIG. 17A. In this case, the wiring layer 498, the first electrode layer 484, an electroluminescent layer 485, and a second electrode layer 486 are sequentially stacked to be in contact with the source or drain electrode layer 487*b* so as to be electrically connected to the thin film transistor 481. It is necessary that the substrate 480 through which light is transmitted has a light-transmitting property to at least visible light.

Next, in the case where light is emitted to an opposite side to a substrate 460, that is, the case of top emission, is explained with reference to FIG. 17B. A thin film transistor 461 can be formed in a similar manner to the above-described thin film transistor 481. A source or drain electrode layer 462 that is electrically connected to the thin film transistor 461 is in contact with a first electrode layer 463 so as to be electrically connected to each other. The first electrode layer 463, an electroluminescent layer 464, and a second electrode layer 465 are sequentially stacked. The source or drain electrode layer 462 is a reflective metal layer, where light emitted from a light-emitting element is reflected upward as shown by an arrow. Since a structure is employed, in which the first electrode layer 463 is stacked over the source or drain electrode layer 462, even if a light-transmitting material is used for the first electrode layer 463 and light is transmitted, the light is reflected on the source or drain electrode layer 462 and emitted to the opposite side to the substrate 460. It is needless to say that the first electrode layer 463 may be formed of a reflective metal film. Since light emitted from the light-emitting element is emitted through the second electrode layer 465, the second electrode layer 465 is formed of a material having a light-transmitting property to at least visible light.

Lastly, the case where light is emitted to both a substrate 470 side and a side opposite thereto, that is, the case of dual emission, is explained with reference to FIG. 17C. A thin film transistor 471 is also a channel protective thin film transistor. A wiring layer 475 and a first electrode layer 472 are electrically connected to a source or drain electrode layer that is electrically connected to a semiconductor layer of the thin film transistor 471. The first electrode layer 472, an electroluminescent layer 473, and a second electrode layer 474 are sequentially stacked. At this time, the dual emission is realized when both the first electrode layer 472 and the second electrode layer 474 are formed of a material having a light-transmitting property to at least visible light or formed to have a thickness through which light can be transmitted. In this case, it is necessary that an insulating layer or the substrate 470 through which light is transmitted has a light-transmitting property to at least visible light.

This embodiment mode can be freely combined with each of Embodiment Modes 1 to 5.

By the present invention, a component such as a wiring included in a display device can be formed with a desired shape. Moreover, a complicated photolithography step is reduced and the display device can be manufactured by a simplified process. Thus, materials are seldom wasted and reduction in cost can be achieved. Accordingly, a high-performance and highly reliable display device can be manufactured with high yield.

Embodiment Mode 7

In this embodiment mode, an example of a display device for the purpose of manufacture by a highly reliable and more-simplified process at low cost will be explained. Specifically, a light-emitting display device in which a light-emitting element is used for a display element will be explained.

In this embodiment mode, a structure of the light-emitting element which can be applied as the display element of the display device of the present invention is explained with reference to FIGS. 22A to 22D.

Each of FIGS. 22A to 22D shows an element structure of the light-emitting element. In the light-emitting element, an electroluminescent layer 860 formed of a mixture of an organic compound and an inorganic compound is interposed between a first electrode layer 870 and a second electrode layer 850. As shown in the drawings, the electroluminescent layer 860 includes a first layer 804, a second layer 803, and a third layer 802.

First, the first layer 804 has a function of transporting holes to the second layer 803 and includes at least a first organic compound and a first inorganic compound showing an electron accepting property to the first organic compound. What is important is that the first organic compound and the first inorganic compound are not only simply mixed, but also the first inorganic compound shows an electron accepting property to the first organic compound. With such a structure, a lot of hole-carriers are generated in the first organic compound which originally has almost no inherent carriers, and thus, a highly excellent hole injecting property and a highly excellent hole transporting property can be obtained.

Therefore, as for the first layer 804, not only an effect that is considered to be obtained when an inorganic compound is mixed (such as improvement in a heat resistant property) but also excellent conductivity (in particular, a hole-injecting property and a hole transporting property in the first layer 804) can be obtained. This excellent conductivity is an effect that cannot be obtained in a conventional hole transporting layer in which an organic compound and an inorganic compound, which do not electronically interact with each other, are simply mixed. This effect can make drive voltage lower than conventional one. In addition, since the first layer 804 can be made thick without causing increase in drive voltage, short circuit of the element due to dust and the like can be suppressed.

It is preferable to use an organic compound with a hole transporting property as the first organic compound because hole-carriers are generated in the first organic compound as described above. For example, as an example of the organic compound with a hole transporting property, the following can be given: phthalocyanine (abbreviation: $H_2Pc$), copper phthalocyanine (abbreviation: CuPc), vanadyl phthalocyanine (abbreviation: VOPc), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl)amino]benzene (abbreviation: m-MTDAB), NN'-diphenyl-NN'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4',4"-tris(N-carbazolyl)triphenylamine (abbreviation: TCTA), and the like. However, the organic compound with a hole transporting property is not limited thereto. In addition, among the compounds mentioned above, aromatic amine compounds as typified by TDATA, MTDATA, m-MTDAB, TPD, NPB, DNTPD, and TCTA can easily generate hole-carriers, and are a suitable group of compounds for the first organic compound.

On the other hand, the first inorganic compound may be any material as long as the material can easily accept electrons from the first organic compound, and various kinds of metal oxide and metal nitride can be used. An oxide of a transition metal that belongs to any of Groups 4 to 12 of the periodic table is preferable because such the oxide of the transition metal easily shows an electron accepting property. Specifically, titanium oxide, zirconium oxide, vanadium oxide, molybdenum oxide, tungsten oxide, rhenium oxide, ruthenium oxide, zinc oxide, and the like can be given. In addition, among the metal oxides mentioned above, many kinds of oxides of transition metals that belong to any of Groups 4 to 8 of the periodic table have a higher electron accepting property, which are a preferable group of compounds. In particular, vanadium oxide, molybdenum oxide, tungsten oxide, and rhenium oxide are preferable because they can be formed by vacuum evaporation and can be easily handled.

It is to be noted that the first layer 804 may be formed of a stacked layer of a plurality of layers each including a combination of the organic compound and the inorganic compound as described above. In addition, another organic compound or another inorganic compound may be further included.

Next, the third layer 802 is explained. The third layer 802 has a function of transporting electrons to the second layer 803, and includes at least a third organic compound and a third inorganic compound showing an electron donating property to the third organic compound. What is important is that the third organic compound and the third inorganic compound are not only simply mixed, but also the third inorganic compound shows an electron donating property to the third organic compound. With such a structure, a lot of electron-carriers are generated in the third organic compound which has originally almost no inherent carriers, and a highly excellent electron injecting property and a highly excellent electron transporting property can be obtained.

Therefore, as for the third layer 802, not only an effect that is considered to be obtained when an inorganic compound is mixed (such as improvement in a heat resistant property) but also excellent conductivity (in particular, an electron injecting property and an electron transporting property in the third layer 802) can be obtained. This excellent conductivity is an effect that cannot be obtained in a conventional electron transporting layer in which an organic compound and an inorganic compound which do not electronically interact with each other are simply mixed. This effect can make drive voltage lower than the conventional one. In addition, since the third layer 802 can be made thick without causing increase in drive voltage, short circuit of the element due to dust and the like can be suppressed.

It is preferable to use an organic compound with an electron transporting property as the third organic compound because electron-carriers are generated in the third organic compound as described above. For example, as an example of the organic compound with an electron transporting property, the following can be given: tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis[2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2"-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. However, the organic compound with an electron transporting property is not limited thereto. In addition, among the compounds mentioned above, chelate metal complexes having a chelate ligand including an aromatic ring as typified by $Alq_3$, $Almq_3$, $BeBq_2$, BAlq, $Zn(BOX)_2$, $Zn(BTZ)_2$, and the like; organic compounds having a phenanthroline skeleton as typified by BPhen, BCP and the like; and organic compounds having an oxadiazole skeleton as typified by PBD, OXD-7, and the like can easily generate electron-carriers; thereby being suitable groups of compounds for the third organic compound.

On the other hand, the third inorganic compound may be any material as long as the material can easily donate electrons to the third organic compound, and various kinds of metal oxide and metal nitride can be used. Alkali metal oxide, alkaline earth metal oxide, rare earth metal oxide, alkali metal nitride, alkaline earth metal nitride, and rare earth metal nitride are preferable because they easily show an electron donating property. Specifically, lithium oxide, strontium oxide, barium oxide, erbium oxide, lithium nitride, magnesium nitride, calcium nitride, yttrium nitride, lanthanum nitride, and the like can be used. In particular, lithium oxide, barium oxide, lithium nitride, magnesium nitride, and calcium nitride are preferable because they can be formed by vacuum evaporation and can be easily handled.

It is to be noted that the third layer 802 may be formed of a stacked layer of a plurality of layers each including a combination of the organic compound and the inorganic compound as described above. In addition, another organic compound or another inorganic compound may be further included.

Next, the second layer 803 is explained. The second layer 803 has a function of emitting light and includes a second organic compound that has a light-emitting property. A second inorganic compound may also be included. The second layer 803 can be formed using various light-emitting organic compounds and inorganic compounds. However, since it is considered to be hard to make current flow through the second layer 803 in comparison with the first layer 804 or the third layer 802, the thickness of the second layer 803 is preferably approximately 10 to 100 nm.

The second organic compound is not particularly limited as long as it is a light-emitting organic compound. For example, as an example of the light-emitting organic compound, the following can be given: 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-6-[p-(dimethylamino)styryl]-4H-pyran (abbreviation: DCM1), 4-(dicyanomethylene)-2-methyl-6-[2-(julolidine-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. In addition, it is also possible to use a compound capable of emitting phosphorescence such as bis[2-(4',6'-difluorophenyl)pyridinato-N,$C^{2'}$]iridium(picolinate) (abbreviation: FIrpic), bis{2-[3',5'-bis(trifluoromethyl)phenyl]pyridinato-N,$C^{2'}$}iridium(picolinate) (abbreviation: Ir($CF_3$ ppy)$_2$(pic)), tris(2-phenylpyridinato-N,$C^{2'}$)iridium (abbreviation: Ir(ppy)$_3$), bis(2-phenylpyridinato-N,$C^{2'}$)iridium(acetylacetonate) (abbreviation: Ir(ppy)$_2$(acac)), bis[2-(2'-thienyl)pyridinato-N,$C^{3'}$]iridium(acetylacetonate) (abbreviation: Ir(thp)$_2$(acac)), bis(2-phenylquinolinato-N,$C^{2'}$)iridium(acetylacetonate) (abbreviation: Ir(pq)$_2$(acac)), or bis[2-(2'-benzothienyl)pyridinato-N,$C^{3'}$]iridium (acetylacetonate) (abbreviation: Ir(btp)$_2$(acac)).

Further, a triplet excitation light-emitting material containing a metal complex or the like may be used for the second layer 803 in addition to a singlet excitation light-emitting material. For example, among pixels emitting red, green, and blue light, a pixel emitting red light whose luminance is reduced by half in a relatively short time is formed using a triplet excitation light-emitting material and the other pixels are formed using a singlet excitation light-emitting material. The triplet excitation light-emitting material has a feature of favorable light-emitting efficiency and less power consumption to obtain the same luminance. In other words, when the triplet excitation light-emitting material is used for the red pixel, only a small amount of current needs to be applied to a light-emitting element, and thus, reliability can be improved. The pixel emitting red light and the pixel emitting green light may be formed using the triplet excitation light-emitting material and the pixel emitting blue light may be formed using the singlet excitation light-emitting material to achieve lower power consumption. Further low power consumption can be achieved when the light-emitting element emitting green light that is highly visible to human eyes is formed using the triplet excitation light-emitting material.

The second layer 803 may include not only the second organic compound as described above, which performs light-emission, but also another organic compound. For example, as an example of the organic compound that can be added, the following can be given: TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and furthermore, 4,4'-bis(N-carbazolyl)biphenyl (abbreviation: CBP), 1,3,5-tris[4-(N-carbazolyl)phenyl]benzene (abbreviation: TCPB), and the like. However, the organic compound is not limited thereto. It is preferable that the organic compound, which is added in addition to the second organic compound, have higher excitation energy than that of the second organic compound and be added in larger amounts than the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure in which each pixel with a light-emitting layer having a different emission wavelength range is provided to perform color display. Typically, a light-emitting layer corresponding to each color of R (red), G (green), and B (blue) is formed. Also in this case, color purity can be improved and a pixel portion can be prevented from having a mirror surface (reflection) by provision of a filter which transmits light of an emission wavelength range on the light emission side of the pixel. When the filter is provided, a circularly polarizing plate or the like that has been conventionally needed can be omitted, and the loss of light emitted from the light-emitting layer can be eliminated. Moreover, change in color tone, which occurs when a pixel portion (a display screen) is obliquely seen, can be reduced.

Either a low-molecular organic light-emitting material or a high-molecular organic light-emitting material can be used for a material of the second layer 803. A high-molecular organic light-emitting material is physically stronger than a low-molecular material and is superior in durability of the element. In addition, a high-molecular organic light-emitting material can be formed by coating; therefore, it is relatively easy to manufacture the element.

The emission color is determined depending on a material forming the light-emitting layer; therefore, a light-emitting element which performs desired light emission can be formed by selection of an appropriate material for the light-emitting layer. As a high-molecular electroluminescent material which can be used for forming the light-emitting layer, a polyparaphenylenevinylene-based material, a polyparaphenylene-based material, a polythiophene-based material, or a polyfluorene-based material can be used.

As the polyparaphenylenevinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2, 2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The second inorganic compound may be any inorganic compound as long as the inorganic compound does not easily quench light emission of the second organic compound, and various kinds of metal oxide and metal nitride can be used. In particular, an oxide of a metal that belongs to Group 13 or 14 of the periodic table is preferable since light emission of the second organic compound is not easily quenched by such an oxide. Specifically, aluminum oxide, gallium oxide, silicon oxide, and germanium oxide are preferable. However, the second inorganic compound is not limited thereto.

It is to be noted that the second layer 803 may be formed of a stacked layer of a plurality of layers each including a combination of the organic compound and the inorganic compound as described above. In addition, include another organic compound or another inorganic compound may be further included. A layer structure of the light-emitting layer can be changed, and an electrode layer for injecting electrons may be provided or a light-emitting material may be dispersed, instead of providing no specific electron injecting region or light-emitting region. Such a change can be permitted unless it departs from the purpose of the present invention.

A light-emitting element formed using the above-described materials emits light by being forwardly biased. A pixel of a display device which is formed using the light-emitting element can be driven by a simple matrix mode or an active matrix mode. In any case, each pixel emits light by application of a forward bias thereto at a specific timing; however, the pixel is in a non-emitting state for a certain period. Reliability of the light-emitting element can be improved by application of a reverse bias thereto in the non-emitting time. In the light-emitting element, there is a deterioration mode in which emission intensity is decreased under constant driving conditions or a deterioration mode in which a non-light-emitting region is enlarged in the pixel and luminance is apparently decreased. However, progression of deterioration can be slowed down by alternate current driving where bias is applied forwardly and reversely, and thus, reliability of a light-emitting display device can be improved. Additionally, either digital driving or analog driving can be applied.

A color filter (colored layer) may be formed on a sealing substrate. The color filter (colored layer) can be formed by an evaporation method or a droplet discharging method. With the use of the color filter (colored layer), high-definition display can be performed. This is because a broad peak can be corrected to be sharp in an emission spectrum of each of R, G, and B by the color filter (colored layer).

Full color display can be performed by formation of a material which emits light of a single color and combination of it with a color filter or a color conversion layer. The color filter (colored layer) or the color conversion layer may be formed over, for example, the sealing substrate and may be attached to an element substrate.

Needless to say, display of a single color emission may also be performed. For example, an area color type display device may be manufactured with the use of single color emission. The area color type is suitable for a passive matrix display portion, and can mainly display characters and symbols.

Figure 22A:
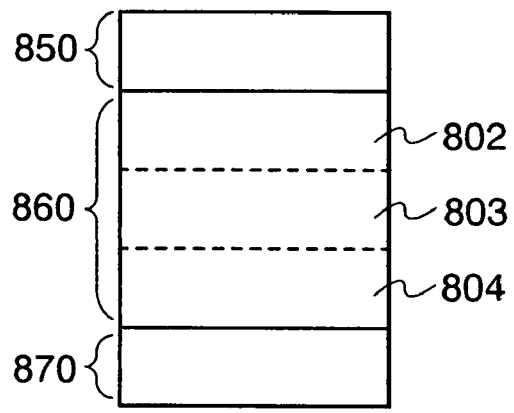
FIGS. 22A to 22D are views each explaining a structure of a light-emitting element which can be applied to the present invention.
Figure 22B:
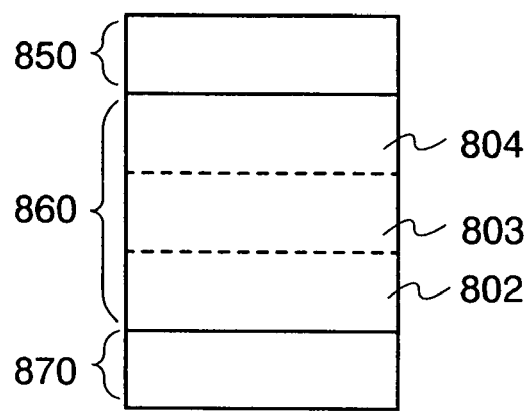

It is necessary that materials of the first electrode layer 870 and the second electrode layer 850 are selected in consideration of a work function. The first electrode layer 870 and the second electrode layer 850 can be either an anode or a cathode depending on the pixel structure. In the case where polarity of a driving thin film transistor is a p-channel type, it is preferable that the first electrode layer 870 serve as an anode and the second electrode layer 850 serve as a cathode as shown in FIG. 22A. In a case where polarity of the driving thin film transistor is an n-channel type, it is preferable that the first electrode layer 870 serve as a cathode and the second electrode layer 850 serve as an anode as shown in FIG. 22B. Materials that can be used for the first electrode layer 870 and the second electrode layer 850 are described. It is preferable to use a material having a higher work function (specifically, a material having a work function of greater than or equal to 4.5 eV) for one of the first electrode layer 870 and the second electrode layer 850, which serve as an anode, and a material having a lower work function (specifically, a material having a work function of less than or equal to 3.5 eV) for the other electrode layer which serves as a cathode. However, since the first layer 804 is superior in a hole injecting property and a hole transporting property and the third layer 802 is superior in an electron injecting property and an electron transporting property, both of the first electrode layer 870 and the second electrode layer 850 are scarcely restricted by a work function, and various materials can be used.

Each of the light-emitting elements shown in FIGS. 22A and 22B has a structure in which light is extracted through the first electrode layer 870, and thus, the second electrode layer 850 does not always have to have a light-transmitting property. The second electrode layer 850 may be formed of a film mainly including an element selected from Ti, Ni, W, Cr, Pt, Zn, Sn, In, Ta, Al, Cu, Au, Ag, Mg, Ca, L1, and Mo, or an alloy material or a compound material containing the element as its main component, such as titanium nitride, $TiSi_xN_y$, $WSi_x$, tungsten nitride, $WSi_xN_y$, and NbN, or a stacked film of these with a total thickness ranging from 100 to 800 nm.

The second electrode layer 850 can be formed by an evaporation method, a sputtering method, a CVD method, a printing method, a droplet discharging method, or the like.

In addition, when the second electrode layer 850 is formed using a light-transmitting conductive material, like the material used for the first electrode layer 870, light is also extracted through the second electrode layer 850, and a dual emission mode can be obtained, in which light emitted from the light-emitting element is emitted from both of the first electrode layer 870 side and the second electrode layer 850 side.

It is to be noted that the light-emitting element of the present invention has many variations by change of types of the first electrode layer 870 and the second electrode layer 850.

FIG. 22B shows the case where the third layer 802, the second layer 803, and the first layer 804 are provided in this order from the first electrode layer 870 side in the electroluminescent layer 860.

As described above, in the light-emitting element of the present invention, a layer interposed between the first electrode layer 870 and the second electrode layer 850 are formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions called a high carrier injecting property and carrier transporting property by mixture of an organic compound and an inorganic compound, where the functions cannot be obtained from only either one of the organic compound or the inorganic compound. Moreover, it is necessary for the first layer 804 and the third layer 802 to be layers in which an organic compound and an inorganic compound are combined, particularly when provided on the first electrode layer 870 side, and the first layer 804 and the third layer 802 may contain only one of an organic compound and an inorganic compound when provided on the second electrode layer 850 side.

It is to be noted that various methods can be used as a method for forming the electroluminescent layer 860, which is a layer in which the organic compound and the inorganic compound are mixed. For example, the methods include a co-evaporation method of evaporating both the organic compound and the inorganic compound by resistance heating. In addition, for co-evaporation, the inorganic compound may be evaporated by an electron beam (EB) while evaporating the organic compound by resistance heating. Furthermore, the methods also include a method of sputtering the inorganic compound while evaporating the organic compound by resistance heating to deposit the both at the same time. Besides, the electroluminescent layer may also be formed by a wet process.

Similarly, as for the first electrode layer 870 and the second electrode layer 850, evaporation by resistance heating, EB evaporation, sputtering, a wet process, and the like can be used. As described in Embodiment Mode 3, the first electrode layer 870 and the second electrode layer 850 may be formed in such a manner that a conductive light-absorbing film is formed over a transfer substrate, and then is processed into a desired shape by laser light irradiation to be selectively formed over a substrate to which the light-absorbing film is transferred.

Figure 22C:
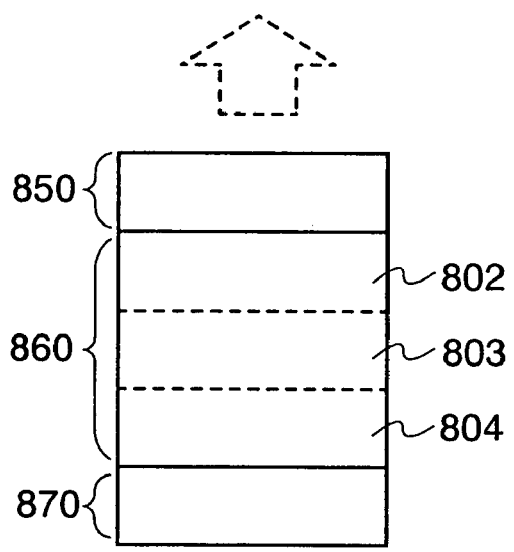
Figure 22D:
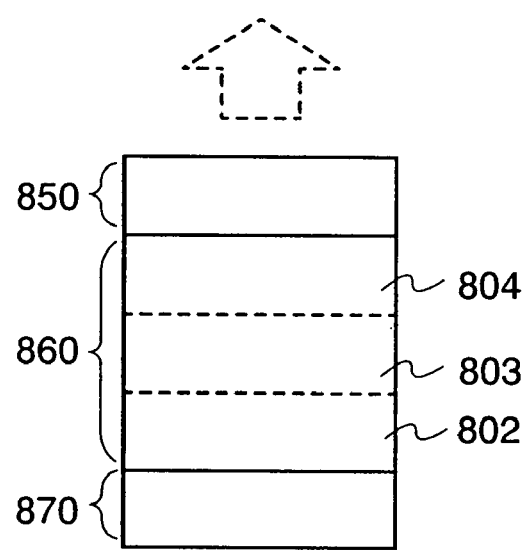

In FIG. 22C, an electrode layer having reflectivity is used for the first electrode layer 870 and an electrode layer having a light-transmitting property is used for the second electrode layer 850 in the structure of FIG. 22A. Light emitted from the light-emitting element is reflected by the first electrode layer 870, then, transmitted through the second electrode layer 850, and is emitted to outside. Similarly, in FIG. 22D, an electrode layer having reflectivity is used for the first electrode layer 870, and an electrode layer having a light-transmitting property is used for the second electrode layer 850 in the structure of FIG. 22B. Light emitted from the light-emitting element is reflected by the first electrode layer 870, then, transmitted through the second electrode layer 850, and is emitted to outside.

This embodiment mode can be freely combined with the above-described embodiment modes in which the display device having the light-emitting element is explained. This embodiment mode can be freely combined with each of above-described Embodiment Modes 1 to 5, as appropriate.

By the present invention, a component such as a wiring included in a display device can be formed with a desired shape. Moreover, a complicated photolithography step is reduced and the display device can be manufactured by a simplified process. Thus, materials are seldom wasted and reduction in cost can be achieved. Accordingly, a high-performance and highly reliable display device can be manufactured with high yield.

Embodiment Mode 8

In this embodiment mode, an example of a display device for the purpose of manufacture by a highly reliable and more-simplified process at low cost will be explained. Specifically, a light-emitting display device in which a light-emitting element is used for a display element will be explained. In this embodiment mode, a structure of a light-emitting element which can be applied as a display element of a display device of the present invention will be explained with reference to FIGS. 23A to 23C and FIGS. 24A to 24C.

A light-emitting element utilizing electroluminescence is classified by whether a light-emitting material is an organic compound or an inorganic compound. In general, the former is referred to as an organic EL element and the latter is referred to as an inorganic EL element.

The inorganic EL element is classified into a dispersion type inorganic EL element and a thin film type inorganic EL element, depending on its element structure. The former and the latter are different in that the former has an electroluminescent layer in which particles of a light-emitting material are dispersed in a binder, whereas the latter has a light-emitting layer formed of a thin film of a light-emitting material. However, the former and the latter are in common in that they need an electron accelerated by a high electric field. It is to be noted that, as a mechanism of light emission that is obtained, there are donor-acceptor recombination type light emission that utilizes a donor level and an acceptor level, and localized type light emission that utilizes inner-shell electron transition of a metal ion. In general, a dispersion type inorganic EL element performs donor-acceptor recombination type light emission and a thin-film type inorganic EL element exhibits localized type light emission.

A light-emitting material which can be used in the present invention includes a base material and an impurity element which becomes an emission center. By the change of the impurity element to be contained, light emission of various colors can be obtained. Various methods such as a solid-phase method or a liquid-phase method (a coprecipitation method) can be used for forming the light-emitting material. In addition, an evaporative decomposition method, a double decomposition method, a method by heat decomposition reaction of a precursor, a reversed micelle method, a method in which such a method and high temperature baking are combined, a liquid-phase method such as a freeze-drying method, or the like can be used.

A solid-phase method is a method in which a base material and an impurity element or a compound containing an impurity element are weighed, they are mixed in a mortar, the mixture is heated and baked in an electric furnace to be reacted, so that the impurity element is contained in the base material. The baking temperature is preferably 700 to 1500° C. This is because the solid reaction does not progress when the temperature is too low, whereas the base material is decomposed when the temperature is too high. It is to be noted that, although the baking may be performed in a powder state, it is preferable that the baking be performed in a pellet state. Although the solid-phase method needs baking at a comparatively high temperature, the solid-phase method is easy; therefore, high productivity is obtained and the solid-phase method is suitable for mass production.

A liquid-phase method (a coprecipitation method) is a method in which a base material or a compound containing a base material and an impurity element or a compound containing an impurity element are reacted in a solution, dried, and then baked. Particles of a light-emitting material are distributed uniformly, and the reaction can progress even when the grain size is small and the baking temperature is low.

As a base material used for a light-emitting material, sulfide, oxide, or nitride can be used. As sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As oxide, for example, zinc oxide (ZnO), yttrium oxide ($Y_2O_3$), or the like can be used. As nitride, for example, aluminum nitride (AlN), gallium nitride (GaN), indium nitride (InN), or the like can be used. Furthermore, as the base material used for the light-emitting material, zinc selenide (ZnSe), zinc telluride (ZnTe), or the like can also be used. Alternatively, a ternary mixed crystal such as calcium sulfide-gallium ($CaGa_2S_4$), strontium sulfide-gallium ($SrGa_2S_4$), or barium sulfide-gallium ($BaGa_2S_4$) may be used.

For an emission center of the localized type light emission, manganese (Mn), copper (Cu), samarium (Sm), terbium (Tb), erbium (Er), thulium (Tm), europium (Eu), cerium (Ce), praseodymium (Pr), or the like can be used. It is to be noted that a halogen element such as fluorine (F) or chlorine (Cl) may be added. The halogen element can also serve as charge compensation.

On the other hand, for an emission center of the donor-acceptor recombination type light emission, a light-emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case where the light-emitting material for the donor-acceptor recombination type light emission is synthesized by a solid-phase method, each of a base material, a first impurity element or a compound containing a first impurity element, and a second impurity element or a compound containing a second impurity element is weighed and mixed in a mortar, and then heated and baked in an electric furnace. The above-described base material can be used for the base material. As the first impurity element or the compound containing the first impurity element, for example, fluorine (F), chlorine (Cl), aluminum sulfide ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. The baking temperature is preferably 700 to 1500° C. This is because the solid reaction does not progress when the temperature is too low, whereas the base material is decomposed when the temperature is too high. It is to be noted that, although the baking may be carried out in a powder state, it is preferable that the baking be carried out in a pellet state.

As an impurity element in the case of utilizing solid-phase reaction, a compound containing a first impurity element and a second impurity element may be used. In this case, the impurity element is easily diffused and solid-phase reaction easily progresses; thus, a uniform light-emitting material can be obtained. Moreover, since an unnecessary impurity element does not enter, a light-emitting material with high purity can be obtained. As the compound containing the first impurity element and the second impurity element, for example, copper chloride (CuCi), silver chloride (AgCl), or the like can be used.

It is to be noted that these impurity elements may be contained in the base material at concentrations of 0.01 to 10 atom %, preferably, 0.05 to 5 atom %.

In the case of the thin-film type inorganic EL element, an electroluminescent layer, which contains the above-described light-emitting material, can be formed by a vacuum evaporation method such as a resistance heating evaporation method or an electron beam evaporation (EB evaporation) method; a physical vapor deposition method (PVD) such as a sputtering method; a chemical vapor deposition method (CVD) such as a metal organic CVD method or a low-pressure hydride transport CVD method; an atomic layer epitaxy method (ALE); or the like.

Figure 23A:
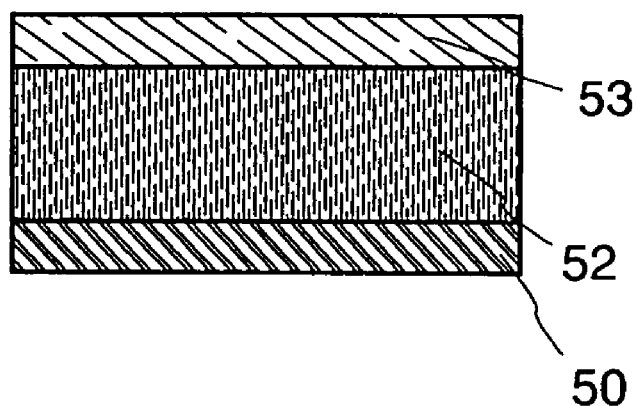
FIGS. 23A to 23C are views each explaining a structure of a light-emitting element which can be applied to the present invention.
Figure 23B:
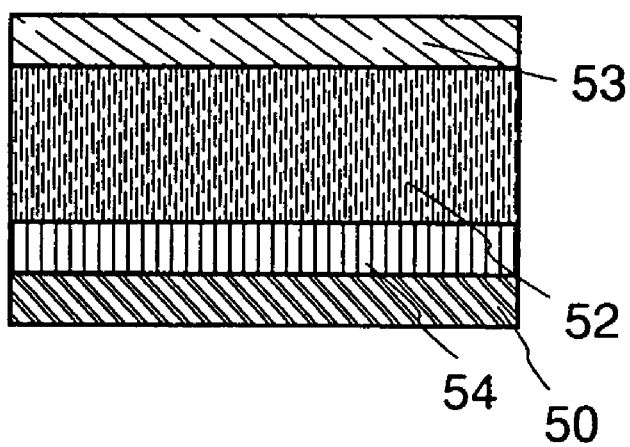
Figure 23C:
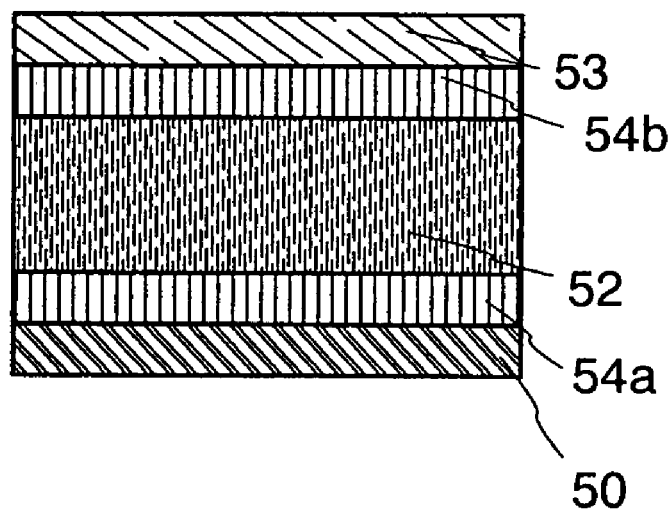

An example of a thin-film type inorganic EL element that can be used as a light-emitting element is shown in FIGS. 23A to 23C. In FIGS. 23A to 23C, the light-emitting element includes a first electrode layer 50, an electroluminescent layer 52, and a second electrode layer 53.

Each of the light-emitting elements shown in FIGS. 23B and 23C has a structure in which an insulating layer is provided between an electrode layer and an electroluminescent layer in the light-emitting element shown in FIG. 23A. The light-emitting element shown in FIG. 23B has an insulating layer 54 between the first electrode layer 50 and the electroluminescent layer 52. The light-emitting element shown in FIG. 23C has an insulating layer 54a between the first electrode layer 50 and the electroluminescent layer 52 and has an insulating layer 54b between the second electrode layer 53 and the electroluminescent layer 52. As described above, an insulating layer may be provided between an electroluminescent layer and one of a pair of electrode layers that sandwich the electroluminescent layer. Alternatively, an insulating layer may be provided between an electroluminescent layer and one of a pair of electrode layers that sandwich the electroluminescent layer and another insulating layer between the electroluminescent layer and the other one of the pair of electrode layers. Also, an insulating layer may be a single layer or a stacked layer including a plurality of layers.

In addition, although the insulating layer 54 is provided so as to be in contact with the first electrode layer 50 in FIG. 23B, the order of the insulating layer and the electroluminescent layer may be reversed so that the insulating layer 54 is provided to be in contact with the second electrode layer 53.

In the case of the dispersion type inorganic EL element, particulate light-emitting materials are dispersed in a binder, so that a film electroluminescent layer is formed. When particles having a desired size cannot be sufficiently obtained by a method for forming a light-emitting material, the light-emitting materials may be processed into particles by crushing in a mortar or the like. The binder is a substance for fixing the particulate light-emitting materials in a dispersion state and holding the light-emitting materials in a form of an electroluminescent layer. The light-emitting materials are uniformly dispersed in the electroluminescent layer by the binder and are fixed.

In the case of the dispersion type inorganic EL element, as a formation method of an electroluminescent layer, a droplet discharging method capable of selectively forming an electroluminescent layer; a printing method (such as screen printing or offset printing); or a coating method such as a spin coating method; a dipping method; a dispenser method; or the like can be used. Although there is no particular limitation on a thickness of the electroluminescent layer, the thickness thereof is preferably in a range of 10 to 1000 nm. The ratio of the light-emitting material in the electroluminescent layer containing the light-emitting material and the binder may be greater than or equal to 50 wt % and less than or equal to 80 wt %.

Figure 24A:
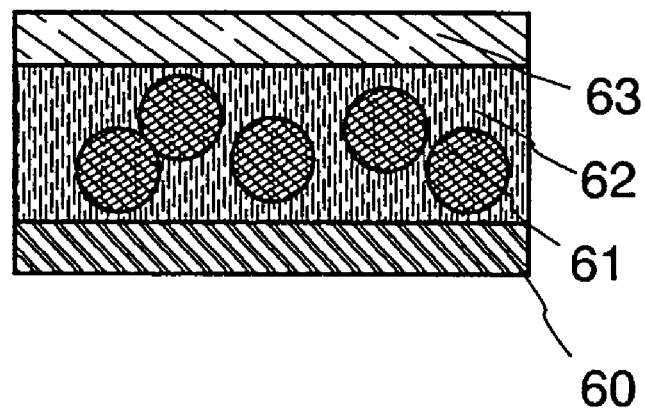
FIGS. 24A to 24C are views each explaining a structure of a light-emitting element which can be applied to the present invention.
Figure 24B:
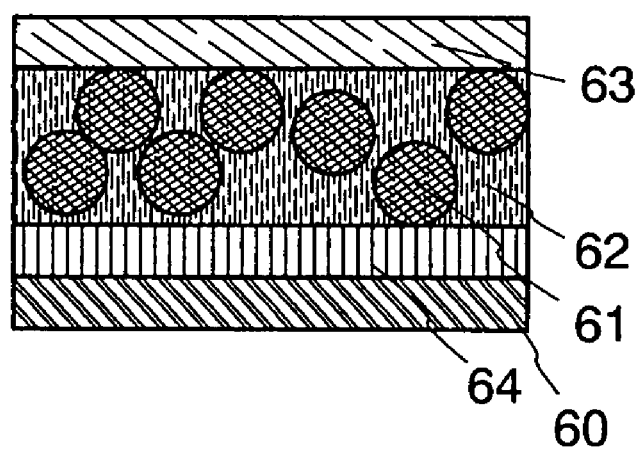
Figure 24C:
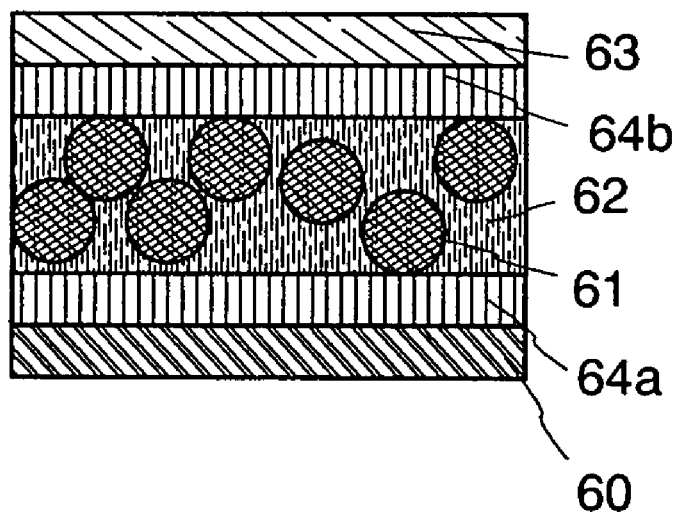

An example of the dispersion type inorganic EL element that can be used as a light-emitting element is shown in FIGS. 24A to 24C. A light-emitting element shown in FIG. 24A has a structure in which a first electrode layer 60, an electroluminescent layer 62, and a second electrode layer 63 are stacked and light-emitting materials 61 held by a binder is contained in the electroluminescent layer 62.

In addition, as described in Embodiment Mode 3, the first electrode layers 50 and 60 and the second electrode layers 53 and 63 may be formed in such a manner that a conductive light-absorbing film is formed over a transfer substrate, and then is processed into a desired shape by laser light irradiation to be selectively formed over a substrate to which the light-absorbing film is transferred.

As a binder that can be used in this embodiment, an organic material or an inorganic material can be used, or a mixed material of an organic material and an inorganic material may be used. As an organic material, polymer which has comparatively high dielectric constant like cyanoethyl cellulose-based resin; or a resin such as polyethylene, polypropylene, a polystyrene-based resin, a silicone resin, an epoxy resin, or vinylidene fluoride can be used. Alternatively, a heat-resistant polymer such as aromatic polyamide or polybenzoimidazole, or a siloxane resin may be used. Siloxane has a skeleton structure formed by a bond of silicon (Si) and oxygen (O) and has an organic group containing at least hydrogen (for example, an alkyl group or aromatic hydrocarbon) as a substituent. Alternatively, as the substituent, a fluoro group may be used. Further alternatively, as the substituent, an organic group containing at least hydrogen and a fluoro group may be used. A resin material such as a vinyl resin such as polyvinyl alcohol or polyvinyl butyral, a phenol resin, a novolac resin, an acrylic resin, a melamine resin, a urethane resin, an oxazole resin (polybenzoxazole) may also be used as the organic material as well as the above-described materials. A dielectric constant can also be controlled by mixing these resins with microparticles having a high dielectric constant such as barium titanate ($BaTiO_3$) or strontium titanate ($SrTiO_3$) as appropriate.

As an example of the inorganic material contained in the binder, the following can be used: a material selected from silicon oxide (SiOx), silicon nitride (SiNx), silicon containing oxygen and nitrogen, aluminum nitride (AlN), aluminum containing oxygen and nitrogen or aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$) and another substance containing an inorganic material. When an inorganic material having high dielectric constant is mixed with an organic material (by addition or the like), dielectric constant of an electroluminescent layer including a light-emitting material and a binder can be further controlled and increased. When a mixed layer of an inorganic material and an organic material is used for a binder to obtain high dielectric constant, a higher electric charge can be induced in the light emitting material.

In a manufacturing process, the light-emitting materials are dispersed in a solution containing a binder. As a solvent of the solution containing a binder that can be used in this embodiment, it is preferable that a solvent that dissolves a binder material and that can make a solution with the viscosity of which is appropriate for a method of forming an electroluminescent layer (various wet processes) and a desired thickness. When an organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

Each of the light-emitting elements shown in FIGS. 24B and 24C has a structure in which an insulating layer is provided between an electrode layer and an electroluminescent layer in the light-emitting element shown in FIG. 24A. The light-emitting element shown in FIG. 24B has an insulating layer 64 between the first electrode layer 60 and the electroluminescent layer 62. The light-emitting element shown in FIG. 24C has an insulating layer 64a between the first electrode layer 60 and the electroluminescent layer 62 and has an insulating layer 64b between the second electrode layer 63 and the electroluminescent layer 62. As described above, an insulating layer may be provided between an electroluminescent layer and one of a pair of electrode layers that sandwich the electroluminescent layer. Alternatively, an insulating layer may be provided between an electroluminescent layer and one of a pair of electrode layers that sandwich the electroluminescent layer and another insulating layer between the electroluminescent layer and the other one of the pair of electrode layers. Also, an insulating layer may be a single layer or a stacked layer including a plurality of layers.

In addition, although the insulating layer 64 is provided so as to be in contact with the first electrode layer 60 in FIG. 24B, the order of the insulating layer and the electroluminescent layer may be reversed so that the insulating layer 64 is provided to be in contact with the second electrode layer 63.

An insulating layer such as the insulating layer 54 in FIGS. 23A to 23C and the insulating layer 64 in FIGS. 24A to 24C are not particularly limited; however, it is preferable that the insulating layer have high withstand voltage, be a dense film, and furthermore have high dielectric constant. For example, the insulating layer can be formed using silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like; a mixed film thereof; or a stacked film containing two or more kinds of the elements. These insulating layers can be formed by sputtering, evaporation, CVD, or the like. Alternatively, the insulating layer may be formed in such a manner that particles of these insulting materials are dispersed in a binder. A binder material may be formed of a material that is similar to that of a binder contained in the electroluminescent layer and by a method that is similar thereto. Although there is no particular limitation on the thickness of the insulating layer, the thickness thereof is preferably in a range of 10 to 1000 nm.

Although the light-emitting element described in this embodiment emits light by application of voltage between the pair of electrode layers that sandwich the electroluminescent layer, the light-emitting element can also be operated by either DC drive or AC drive.

By the present invention, a component such as a wiring included in a display device can be formed with a desired shape. Moreover, a complicated photolithography step is reduced and the display device can be manufactured by a simplified process. Thus, materials are seldom wasted and reduction in cost can be achieved. Accordingly, a high-performance and highly reliable display device can be manufactured with high yield.

This embodiment mode can be freely combined with each of above-described Embodiment Modes 1 to 5, as appropriate.

Embodiment Mode 9

In this embodiment mode, an example of a display device for the purpose of manufacture by a highly reliable and more-simplified process at low cost will be explained. Specifically, a liquid crystal display device using a liquid crystal display element for a display element will be explained.

Figure 19A:
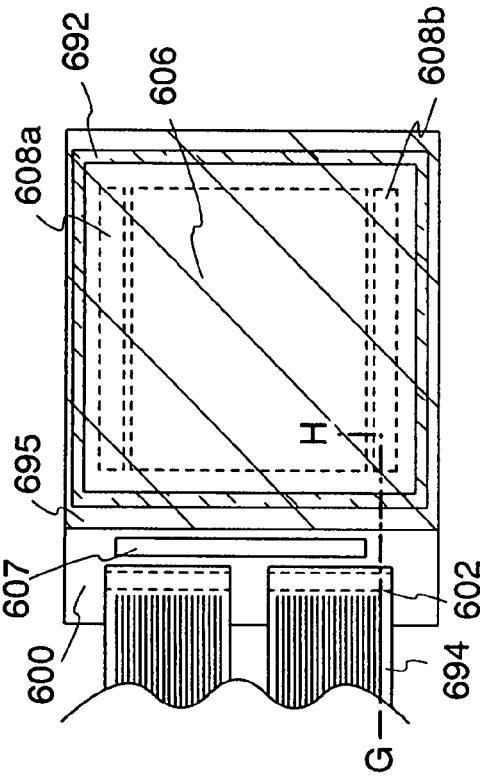
FIGS. 19A and 19B are views explaining a display device of the present invention.
Figure 19B:
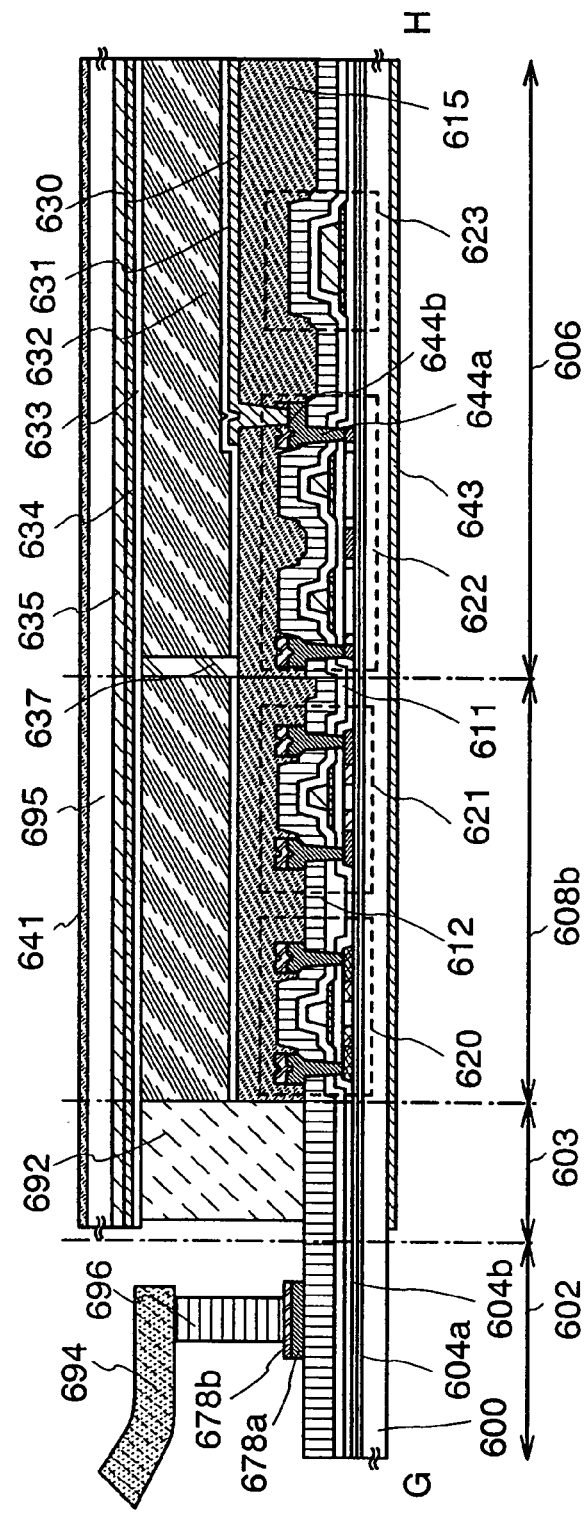

FIG. 19A is a top view of a liquid crystal display device, and FIG. 19B is a cross-sectional view taken along a line G-H of FIG. 19A.

As shown in FIG. 19A, a pixel region 606, a driver circuit region 608a and a driver circuit region 608b that are scanning line driver regions are sealed between a substrate 600 and an opposite substrate 695 with a sealant 692. A driver circuit region 607 that is a signal line driver circuit formed using a driver IC is provided over the substrate 600. In the pixel region 606, a transistor 622 and a capacitor 623 are provided, and in the driver circuit region 608b, a driver circuit including a transistor 620 and a transistor 621 is provided. An insulating substrate similar to that in the above embodiment mode can be used as the substrate 600. Although there is concern that a substrate made of a synthetic resin generally has lower allowable temperature limit than other substrates, the substrate can be employed by transfer after a manufacturing process using a high heat-resistant substrate.

In the pixel region 606, the transistor 622 serving as a switching element is provided over the substrate 600 with a base film 604a and a base film 604b interposed therebetween. In this embodiment mode, the transistor 622 is a multi-gate thin film transistor (TFT), which includes a semiconductor layer including impurity regions that function as a source region and a drain region, a gate insulating layer, a gate electrode layer having a stacked structure of two layers, and a source electrode layer and a drain electrode layer. The source or drain electrode layer is in contact with and electrically connected to the impurity region of the semiconductor layer and a pixel electrode layer 630.

A source electrode layer and a drain electrode layer have a stacked-layer structure. A source or drain electrode layer 644a and a source or drain electrode layer 644b are electrically connected to a pixel electrode layer 630 at an opening formed in an insulating layer 615. The opening formed in the insulating layer 615 can be formed by laser light irradiation as described in Embodiment Mode 2. In this embodiment mode, a low melting point metal that is comparatively easy to be evaporated (chromium in this embodiment mode) is used for the source or drain electrode layer 644b, and a high melting point metal that is not easily evaporated in comparison with the source or drain electrode layer 644b (tungsten in this embodiment) is used for the source or drain electrode layer 644a. The source or drain electrode layer 644a and the source or drain electrode layer 644b are selectively irradiated with laser light from the insulating layer 615 side, so that an irradiated region of the source or drain electrode layer 644b and the insulating layer 615 over the irradiated region of the source or drain electrode layer 644b are removed by irradiated energy. Accordingly, the opening reaching the source or drain electrode layer 644a can be formed. The pixel electrode layer 630 is formed in the opening where the source or drain electrode layer 644a and the source or drain electrode layer 644b are exposed, so that the source or drain electrode layer 644a and the source or drain electrode layer 644b are electrically connected to the pixel electrode 630.

A thin film transistor can be manufactured by many methods. For example, a crystalline semiconductor film is employed as an active layer. A gate electrode is provided over a crystalline semiconductor film with a gate insulating film interposed therebetween. An impurity element can be added to the active layer, using the gate electrode. By addition of an impurity element using the gate electrode in this manner, it is not necessary that a mask is formed for adding an impurity element. The gate electrode can have a single-layer structure or a stacked-layer structure. The impurity region can be formed into a high concentration impurity region and a low concentration impurity region by control of the concentration thereof. A thin film transistor having a low concentration impurity region in this manner is referred to as an LDD (Lightly Doped Drain) structure. The low concentration impurity region can be formed to be overlapped with the gate electrode, and such a thin film transistor is referred to as a GOLD (Gate Overlapped LDD) structure. The thin film transistor is formed to have an n-type polarity with the use of phosphorus (P) in the impurity region. In the case of p-type, boron (B) or the like may be added. After that, an insulating film 611 and an insulating film 612 that cover the gate electrode and the like are formed. Dangling bonds of the crystalline semiconductor film can be terminated by a hydrogen element mixed into the insulating film 611 (and the insulating film 612).

In order to further improve planarity, the insulating film 615 may be formed as an interlayer insulating film. The insulating film 615 can be formed using an organic material, an inorganic material, or a stacked-layer structure thereof. For example, the insulating film 615 can be formed of a material selected from silicon oxide, silicon nitride, silicon oxynitride, silicon nitride oxide, aluminum nitride, aluminum oxynitride, aluminum nitride oxide in which the content of nitrogen is higher than that of oxygen, aluminum oxide, diamond-like carbon (DLC), polysilazane, a nitrogen-containing carbon (CN), PSG (phosphosilicate glass), BPSG (borophosphosilicate glass), alumina, and another substance containing an inorganic insulating material. Alternatively, an organic insulating material may be used, an organic material may be either photosensitive or non-photosensitive, and polyimide, acrylic, polyamide, polyimide amide, a resist, benzocyclobutene, a siloxane resin, or the like can be used. It is to be noted that the siloxane resin corresponds to a resin having Si—O—Si bonds. Siloxane has a skeleton structure formed from a bond of silicon (Si) and oxygen (O). As a substituent, an organic group containing at least hydrogen (for example, an alkyl group or aromatic hydrocarbon) is used. Alternatively, fluoro group may be used as the substituent. Further alternatively, an organic group containing at least hydrogen and a fluoro group may be used as the substituent.

With the use of a crystalline semiconductor film, the pixel region and the driver circuit region can be formed over the same substrate. In this case, the transistor in the pixel region and the transistor in the driver circuit region 608*b* are formed simultaneously. The transistor used in the driver circuit region 608*b* forms a part of a CMOS circuit. Although the thin film transistor included in the CMOS circuit has a GOLD structure, it may have an LDD structure like the transistor 622.

Without limitation to this embodiment mode, the thin film transistor of the pixel region may have a single-gate structure in which a single channel formation region is formed, a double gate structure in which two channel formation regions are formed, or a triple gate structure in which three channel formation regions are formed. In addition, the thin film transistor of a peripheral driver circuit region may also have a single gate structure, a double gate structure, or a triple-gate structure.

It is to be noted that the present invention is not limited to the thin film transistor described in this embodiment mode, but can also be applied to a top gate structure (such as a staggered structure), a bottom gate structure (such as an inversely staggered structure), a dual gate structure including two gate electrode layers provided over and under a channel region each with a gate insulating film interposed therebetween, or another structure.

Next, an insulating layer 631 referred to as an orientation film is formed by a printing method or a droplet discharging method to cover the pixel electrode layer 630. It is to be noted that the insulating layer 631 can be selectively formed by a screen printing method or an offset printing method. After that, rubbing treatment is performed. The rubbing treatment is not necessarily performed when the mode of liquid crystal is, for example, a VA mode. An insulating layer 633 serving as an orientation film is similar to the insulating layer 631. Then, the sealant 692 is formed by a droplet discharging method in a peripheral region of the pixel region.

After that, the opposite substrate 695 provided with the insulating layer 633 serving as an orientation film, a conductive layer 634 serving as an opposite electrode, a colored layer 635 serving as a color filter, a polarizer 641 (also referred to as a polarizing plate) is attached to the substrate 600 that is a TFT substrate with a spacer 637 interposed therebetween, and a liquid crystal layer 632 is provided in a gap therebetween. Since the liquid crystal display device of this embodiment mode is of transmissive type, a polarizer (polarizing plate) 643 is provided also on an opposite side to the surface of the substrate 600 having the elements. The polarizer can be provided over the substrate with the use of an adhesive layer. The sealant may be mixed with a filler, and furthermore, the opposite substrate 695 may be provided with a shielding film (black matrix), or the like. It is to be noted that the color filter or the like may be formed of materials exhibiting red (R), green (G), and blue (B) when the liquid crystal display device performs full color display. When monochrome display is performed, the colored layer may be omitted or formed of a material exhibiting at least one color.

It is to be noted that the color filter is not provided in some cases where light-emitting diodes (LEDs) of RGB or the like are arranged as a backlight and a successive additive color mixing method (field sequential method) in which color display is performed by time division is employed. The black matrix is preferably provided so as to overlap a transistor and a CMOS circuit in order to reduce reflection of external light by wirings of the transistor and the CMOS circuit. It is to be noted that the black matrix may be provided so as to overlap a capacitor. This is because reflection by a metal film forming the capacitor can be prevented.

The liquid crystal layer can be formed by a dispenser method (dropping method), or an injecting method by which liquid crystal is injected using a capillary phenomenon after attaching the substrate 600 including the element to the opposite substrate 695. A dropping method is preferably employed when a large-size substrate to which an injecting method is not easily applied is used.

Although the spacer may be provided in such a manner that particles each having a size of several micrometers are sprayed, the spacer in this embodiment mode is formed by a method in which a resin film is formed over an entire surface of the substrate and then etched. A material of such a spacer is applied by a spinner and then subjected to light exposure and development to form a predetermined pattern. Moreover, the material is heated at 150 to 200° C. in a clean oven or the like so as to be hardened. The spacer formed in this manner can have various shapes depending on the conditions of the light exposure and development. It is preferable that the spacer have a columnar shape with a flat top, so that mechanical strength of the liquid crystal display device can be secured when the opposite substrate is attached. The shape can be conical, pyramidal, or the like, and there is no particular limitation on the shape.

Subsequently, a terminal electrode layer 678*a* and 678*b* electrically connected to the pixel region is provided with an FPC 694 that is a wiring board for connection, through an anisotropic conductive layer 696. The FPC 694 functions to transmit external signals or potential. Through the above-described steps, a liquid crystal display device having a display function can be manufactured.

A wiring and a gate electrode layer that are included in the transistor, the pixel electrode layer 630, and the conductive layer 634 that is an opposite electrode layer can be formed using a material selected from indium tin oxide (ITO), indium zinc oxide (IZO) in which indium oxide is mixed with zinc oxide (ZnO), a conductive material in which indium oxide is mixed with silicon oxide (SiO$_2$), organoindium, organotin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu) or silver (Ag), an alloy thereof, or metal nitride thereof.

The polarizing plate and the liquid crystal layer may be stacked with a retardation plate interposed therebetween.

It is to be noted that, although a TN liquid crystal panel is described in this embodiment mode, the above-described process can be applied to a liquid crystal panel of another system in a similar manner. For example, this embodiment mode can be applied to an In-Plane-Switching mode liquid crystal panel in which an electric field is applied parallel to a glass substrate, so that liquid crystals are aligned. In addition, this embodiment mode can be applied to a VA (Vertical Alignment) mode liquid crystal panel.

Figure 5:
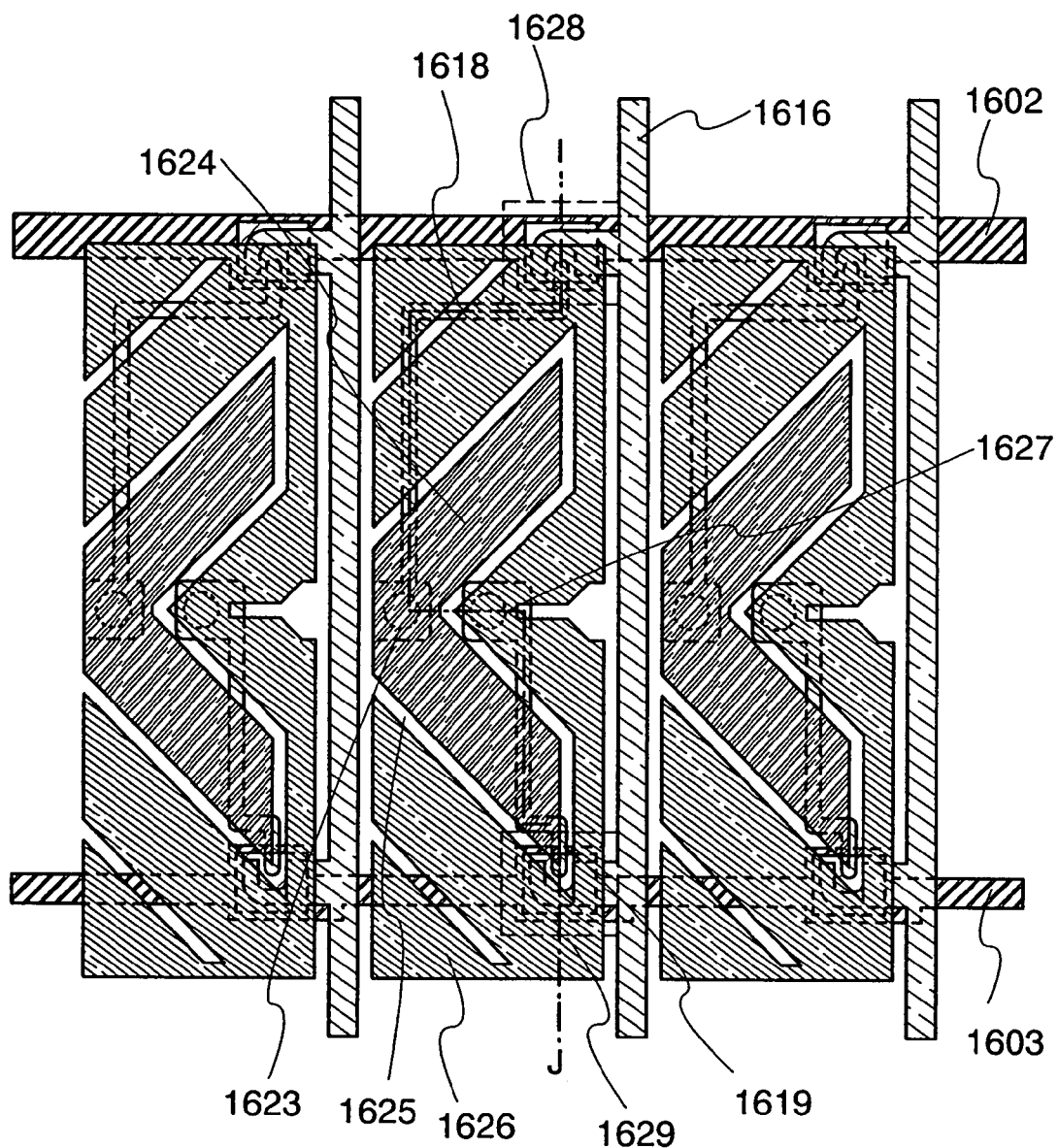
FIG. 5 is a view illustrating a display device of the present invention.
Figure 6:
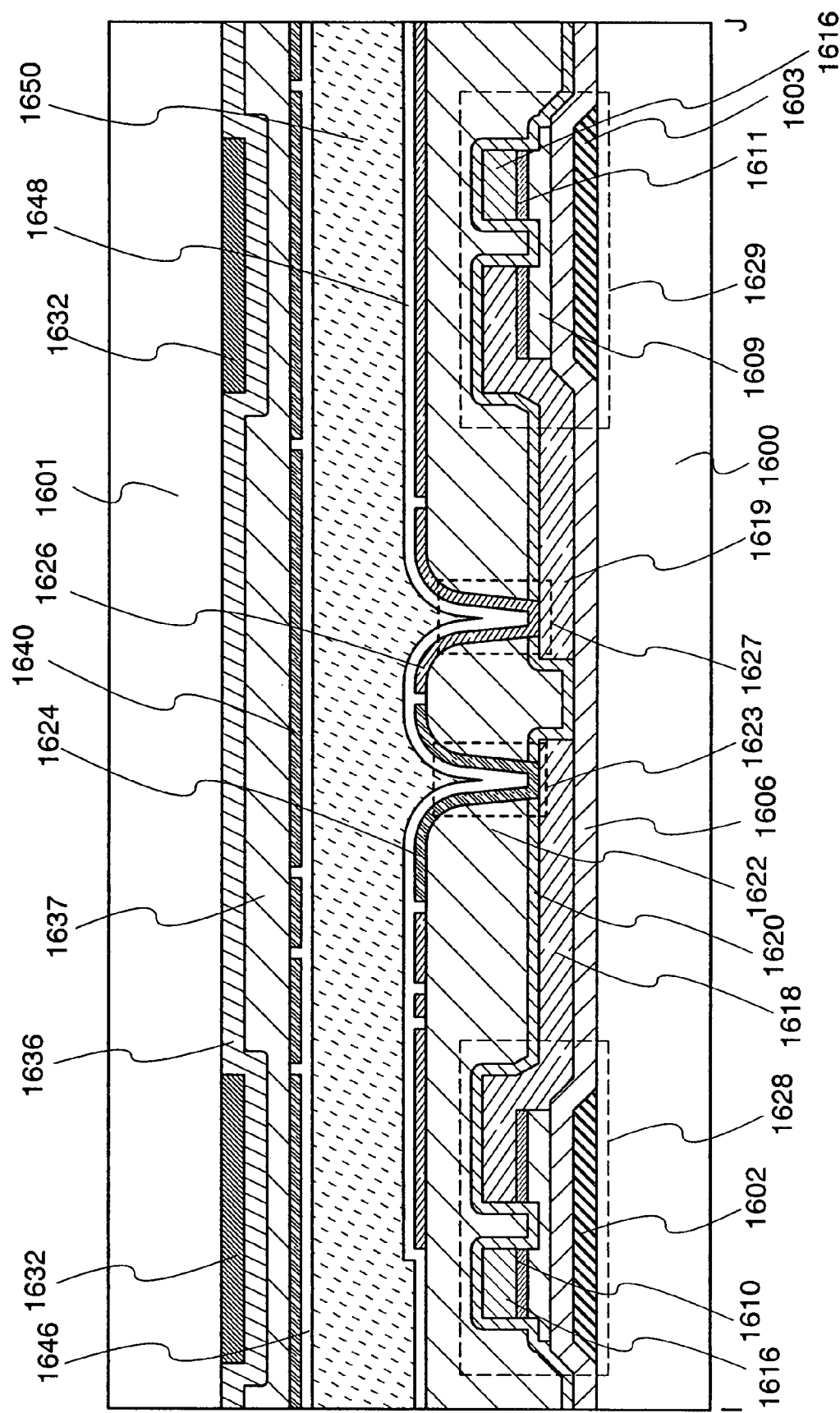
FIG. 6 is a view illustrating a display device of the present invention.

Each of FIG. 5 and FIG. 6 shows a pixel structure of the VA mode liquid crystal panel. FIG. 5 is a plane view, and a cross-sectional structure corresponding to a section line I-J shown in FIG. 5 is shown in FIG. 6. The explanation is given hereinafter with reference to both drawings.

In this pixel structure, a plurality of pixel electrodes are included in one pixel, and a TFT is connected to each of the pixel electrodes. Each TFT is formed so as to be driven by a different gate signal. That is, a multi-domain pixel has a structure in which a signal applied to each pixel electrode is independently controlled.

A pixel electrode layer 1624 is connected to a TFT 1628 with a wiring layer 1618 through an opening (a contact hole) 1623. In addition, a pixel electrode layer 1626 is connected to a TFT 1629 with a wiring layer 1619 through an opening (a contact hole) 1627. A gate wiring layer 1602 of the TFT 1628 and a gate electrode layer 1603 of the TFT 1629 are separated so that a different gate signal can be given to them. On the other hand, a wiring layer 1616 that serves as a data line is commonly used for the TFT 1628 and the TFT 1629.

As described in Embodiment Mode 3, the pixel electrode layer 1624 and the pixel electrode layer 1626 may be formed in such a manner that a conductive light-absorbing film is formed over a transfer substrate, and then is processed into a desired shape by laser light irradiation to be selectively formed over a substrate to which the light-absorbing film is transferred. When the present invention is used, the process can be simplified and waste of material can be prevented; thus, a display device can be manufactured at low cost with excellent productivity.

Figure 7:
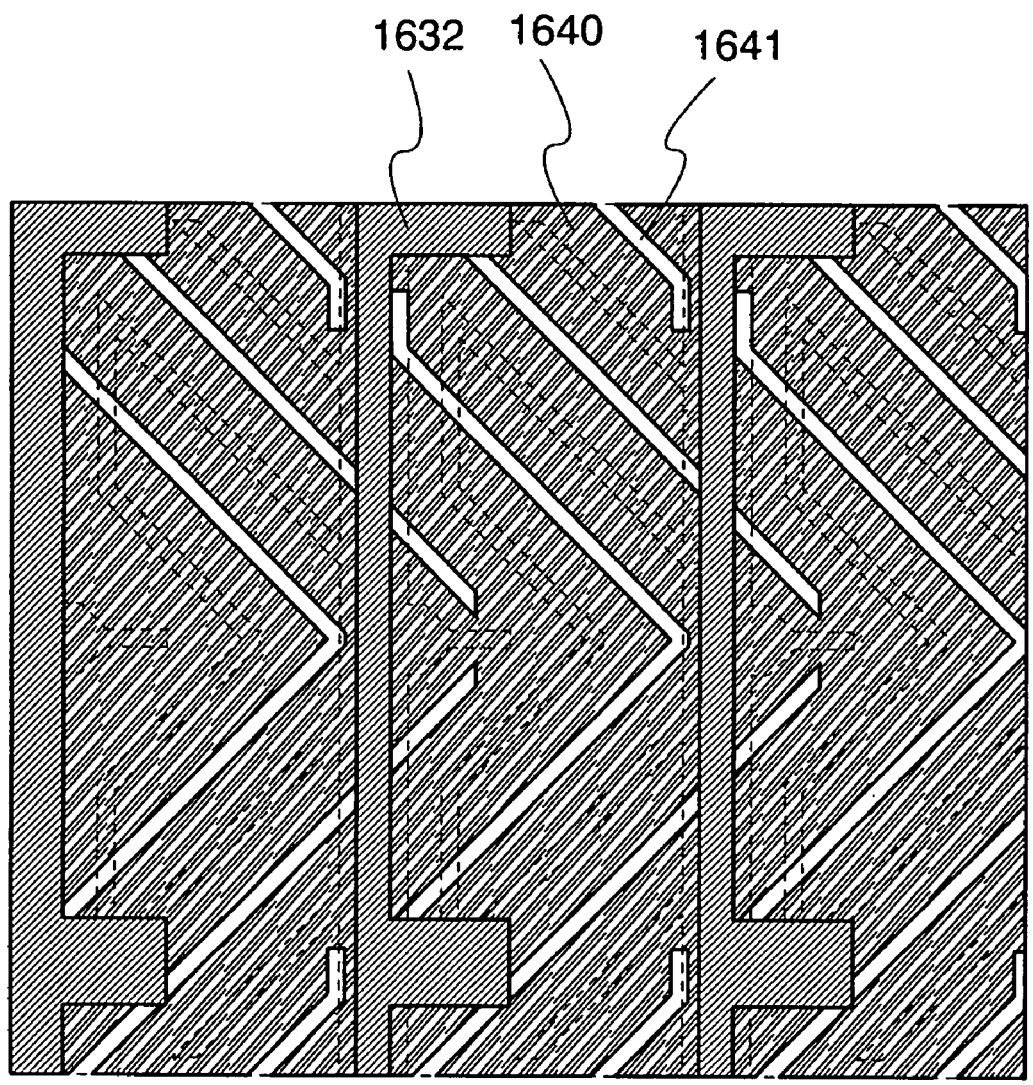
FIG. 7 is a view illustrating a display device of the present invention.
Figure 8A:
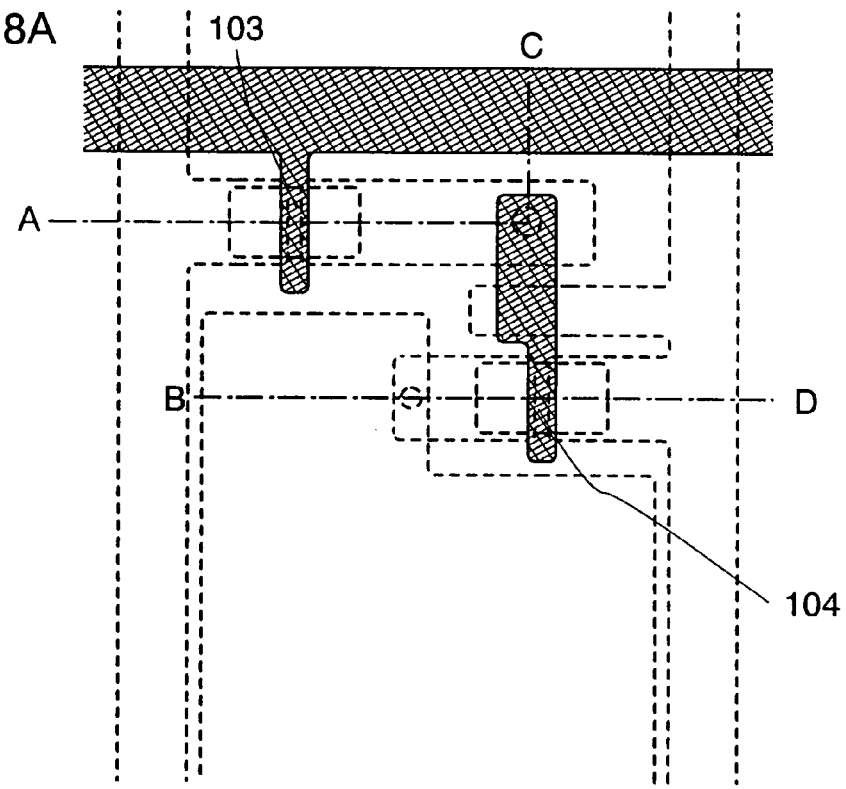
FIGS. 8A to 8C are views explaining a method for manufacturing a display device of the present invention.
Figure 8B:
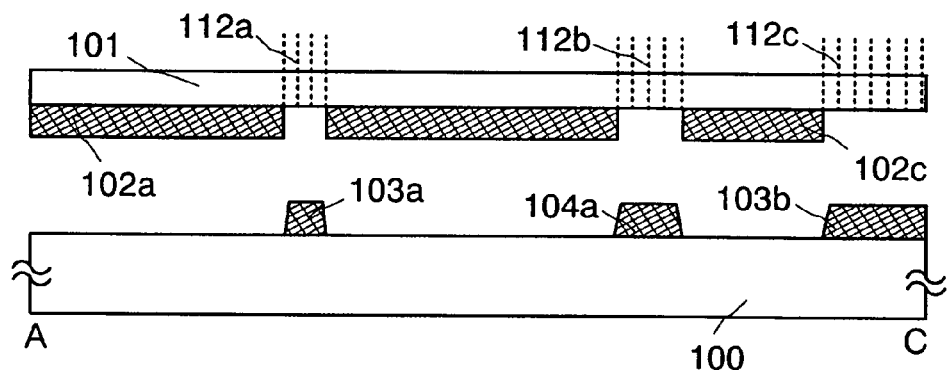
Figure 8C:
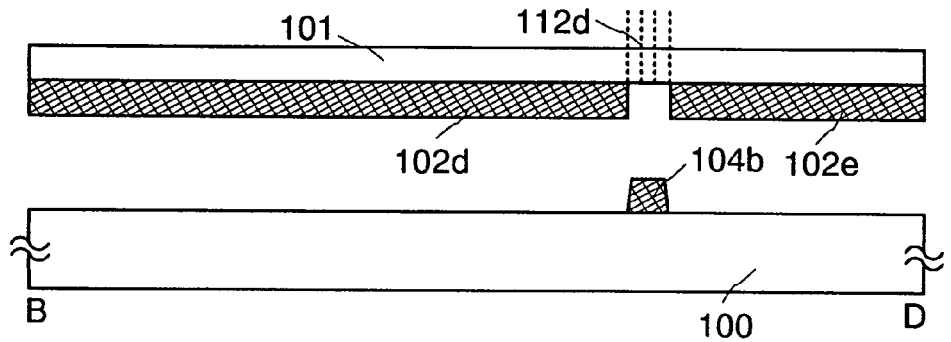

Shapes of the pixel electrode layer 1624 and the pixel electrode layer 1626 are different and are separated from each other by a slit 1625. The pixel electrode layer 1626 is formed so as to surround an external side of the pixel electrode layer 1624 that spreads out into a V-shape. The timing of application of voltage to the pixel electrode layer 1624 and the pixel electrode layer 1626 is made different for the TFT 1628 and the TFT 1629, so that alignment of liquid crystals is controlled. A light-shielding film 1632, a colored layer 1636, and an opposite electrode layer 1640 are formed over an opposite substrate 1601. In addition, a planarizing film 1637 is formed between the colored layer 1636 and the opposite electrode layer 1640, so that alignment disorder of liquid crystals is prevented. FIG. 7 shows a structure of the opposite substrate side. Although the opposite electrode layer 1640 is commonly used in different pixels, a slit 1641 is formed. When this slit 1641 and the slit 1625 on the pixel electrode layer 1624 and the pixel electrode layer 1626 sides are arranged so as to alternately mesh with each other, an oblique electric field is effectively generated and the alignment of liquid crystals can be controlled. Accordingly, a direction of alignment of the liquid crystals can be made different by location and the view angle is widened.

In this manner, a liquid crystal panel can be manufactured using a composite material of an organic compound and an inorganic compound for the pixel electrode layer. When such a pixel electrode is used, it is not necessary to use a transparent conductive film containing indium as its main component and a bottleneck of a raw material can be eliminated.

This embodiment mode can be freely combined with above-described Embodiment Modes 1 to 3, as appropriate.

By the present invention, a component such as a wiring included in a display device can be formed with a desired shape. Moreover, a complicated photolithography step is reduced and the display device can be manufactured by a simplified process. Thus, materials are seldom wasted and reduction in cost can be achieved. Accordingly, a high-performance and highly reliable display device can be manufactured with high yield.

Embodiment Mode 10

In this embodiment mode, an example of a display device for the purpose of manufacture by a highly reliable and more-simplified process at low cost will be explained. Specifically, a liquid crystal display device using a liquid crystal display element for a display element will be explained.

Figure 18:
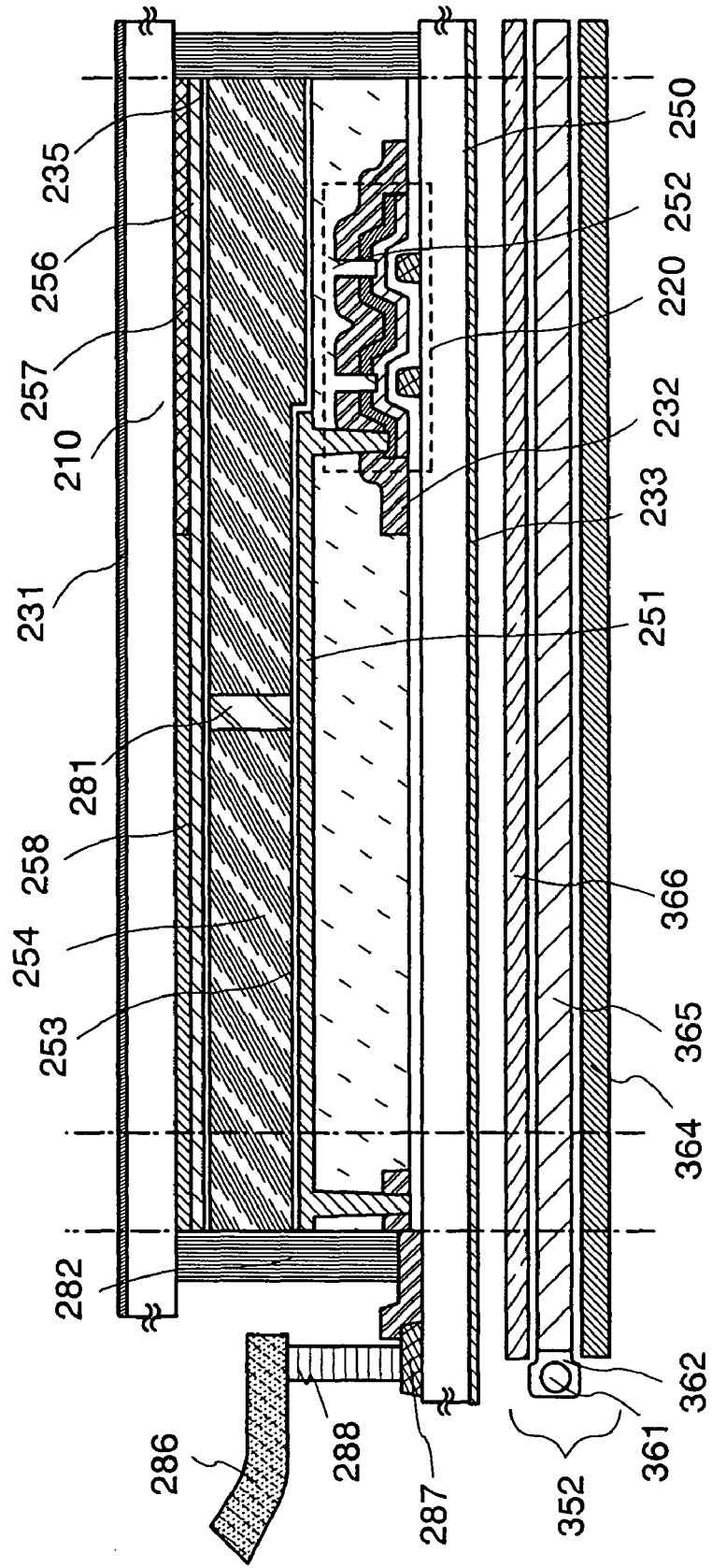
FIG. 18 is a view explaining a display device of the present invention.

A display device shown in FIG. 18 includes, over a substrate 250, a transistor 220 that is an inversely staggered thin film transistor, a pixel electrode layer 251, an insulting layer 252, an insulating layer 253, a liquid crystal layer 254, a spacer 281, an insulating layer 235, an opposite electrode layer 256, a color filter 258, a black matrix 257, an opposite substrate 210, a polarizing plate (polarizer) 231, and a polarizing plate (polarizer) 233 in a pixel region; a sealant 282, a terminal electrode layer 287, an anisotropic conductive layer 288, and an FPC 286 in a sealing region.

A gate electrode layer, a semiconductor layer, a source electrode layer, a drain electrode layer, and the pixel electrode layer 251 of the transistor 220 that is the inversely staggered thin film transistor manufactured in this embodiment mode may be formed in such a manner that, as describe in Embodiment Mode 3, a light-absorbing film using a conductive material or a semiconductor material is formed over a transfer substrate, and then is processed into a desired shape by laser light irradiation to be selectively formed over a substrate to which the light-absorbing film is transferred. As described above, when the present invention is used, the process is simplified and waste of material can be prevented. Thus, a display device can be manufactured at low cost with excellent productivity.

In this embodiment mode, an amorphous semiconductor is used as a semiconductor layer, and a semiconductor layer having one conductivity type may be formed as needed. In this embodiment mode, a semiconductor layer and an n-type amorphous semiconductor layer as a semiconductor layer having one conductivity type are stacked. Furthermore, an NMOS structure of an n-channel thin film transistor in which an n-type semiconductor layer is formed, a PMOS structure of a p-channel thin film transistor in which a p-type semiconductor layer is formed, or a CMOS structure of an n-channel thin film transistor and a p-channel thin film transistor can be manufactured.

In addition, in order to impart conductivity, an n-channel thin film transistor and a p-channel thin film transistor can also be formed by addition of an element imparting conductivity by doping and formation of an impurity region in the semiconductor layer. Instead of forming the n-type semiconductor layer, conductivity may be imparted to the semiconductor layer by plasma treatment with a $PH_3$ gas.

In this embodiment mode, the transistor 220 is an n-channel inversely staggered thin film transistor. Furthermore, a channel protective type inversely staggered thin film transistor provided with a protective layer over a channel region of the semiconductor layer can be used.

Next, a structure of a backlight unit 352 is explained. The backlight unit 352 includes a cold cathode tube, a hot cathode tube, a light-emitting diode, an inorganic EL, or an organic EL as a light source 361 that emits fluorescence, a lamp reflector 362 to effectively lead fluorescence to a light guide plate 365, the light guide plate 365 by which fluorescent is totally reflected and light is led to an entire surface, a diffusing plate 366 for reducing variations in brightness, and a reflector plate 364 for reusing light leaked under the light guide plate 365.

A control circuit for controlling the luminance of the light source 361 is connected to the backlight unit 352. The luminance of the light source 361 can be controlled by a signal supplied from the control circuit.

A source or drain electrode layer of the transistor 220 is electrically connected to the pixel electrode layer 251 at an opening formed in the insulating layer 252. The opening formed in the insulating layer 252 can be formed by laser light irradiation as described in Embodiment Mode 1. In this embodiment mode, a low melting point metal that is comparatively easy to be evaporated (chromium in this embodiment) is used for the source or drain electrode layer. The source or drain electrode layer is selectively irradiated with laser light from the insulating layer 252 side, so that an irradiated region of the source or drain electrode layer and the insulating layer 252 over the irradiated region of the source or drain electrode layer are removed by the irradiated energy. Accordingly, the opening can be formed. The pixel electrode layer 251 is formed in the opening where the source or drain electrode layer is exposed, so that the source or drain electrode layer is electrically connected to the pixel electrode layer 251.

This embodiment mode can be combined with Embodiment Modes 1 to 3, as appropriate.

By the present invention, a component such as a wiring included in a display device can be formed with a desired shape. Moreover, a complicated photolithography step is reduced and the display device can be manufactured by a simplified process. Thus, materials are seldom wasted and reduction in cost can be achieved. Accordingly, a high-performance and highly reliable display device can be manufactured with high yield.

Embodiment Mode 11

In this embodiment mode, an example of a display device for the purpose of manufacture by a highly reliable and more-simplified process at low cost will be explained.

Figure 21:
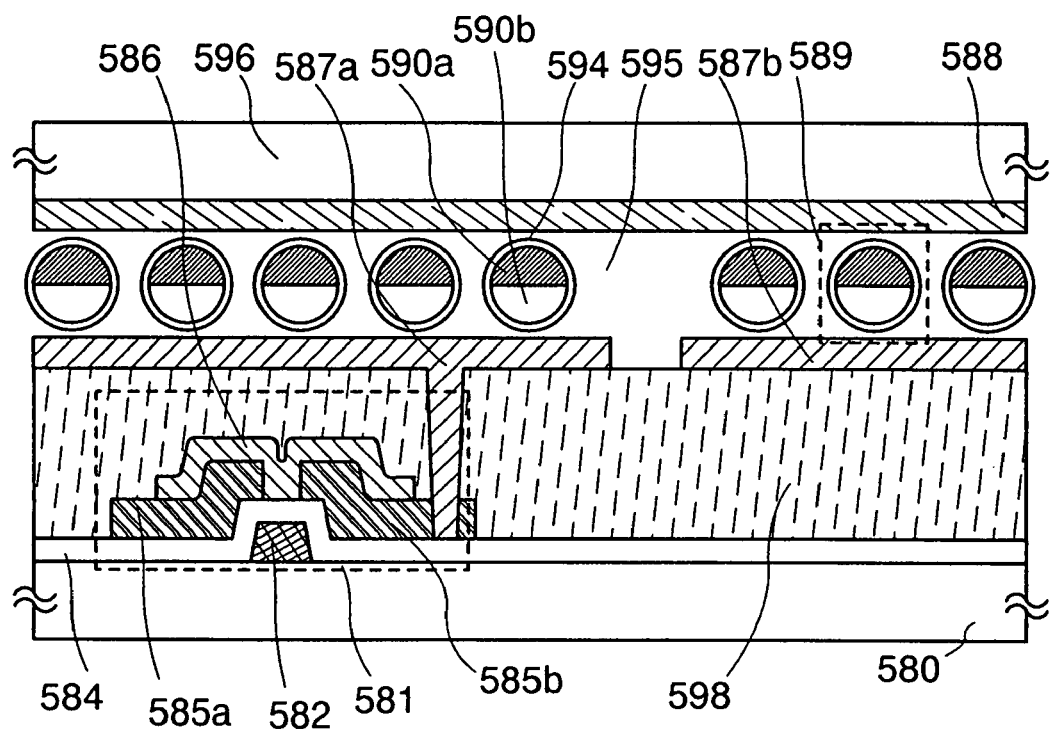
FIG. 21 is a view explaining a display device of the present invention.

FIG. 21 shows an active matrix electronic paper to which the present invention is applied. Although the active matrix one is shown in FIG. 21, the present invention can also be applied to a passive matrix electronic paper.

A twist ball display method can be employed for the electronic paper. The twist ball display method means a method in which spherical particles including a white hemisphere on one side and a black hemisphere on the other side are arranged between a first electrode layer and a second electrode layer, and a potential difference is generated between the first electrode layer and the second electrode layer to control a direction of the spherical particles, so that display is performed.

A transistor 581 is an inversed coplanar thin film transistor, in which a gate electrode layer 582, a gate insulating layer 584, a wiring layer 585*a*, a wiring layer 585*b*, and a semiconductor layer 586 are included. In addition, the wiring layer 585*b* is in contact with a first electrode layer 587*a* at an opening formed in an insulating layer 598, so that the wiring layer 585*b* is electrically connected to the first electrode layers 587*a*. Spherical particles 589, each of which has a black region 590*a* and a white region 590*b* and includes a cavity 594 filled with liquid around the black region 590*a* and the white region 590*b*, are provided between the first electrode layers 587*a* and 587*b* and a second conductive layer 588. A space around the spherical particles 589 is filled with a filler 595 such as a resin (see FIG. 21).

In this embodiment mode, a gate electrode layer, a semiconductor layer, a source electrode layer, a drain electrode layer, an electrode layer, or the like may be formed in such a manner that, as described in Embodiment Mode 3, a conductive light-absorbing film is formed over a transfer substrate, and then is processed into a desired shape by laser light irradiation to be selectively formed over a substrate to which the light-absorbing film is transferred. When the present invention is used, the process can be simplified and waste of material can be prevented; thus, reduction in cost can be achieved.

The wiring layer 585*b* is electrically connected to the first electrode layer 587*a* at the opening formed in the insulating layer 598. The opening formed in the insulating layer 598 can be formed by laser light irradiation as described in Embodiment Mode 1. In this embodiment mode, a low melting point metal that is comparatively easy to be evaporated (chromium in this embodiment mode) is used for the wiring layer 585*b*. The wiring layer 585*b* is selectively irradiated with laser light from the insulating layer 598 side, so that an irradiated region of the wiring layer 585*b* and the insulating layer 598 over the irradiated region of the wiring layer 585*b* are removed by the irradiated energy. Accordingly, the opening reaching the gate insulating layer 584 can be formed. The first electrode layer 587*a* is formed in the opening where the wiring layer 585*b* is exposed, so that the wiring layer 585*b* and the first electrode layer 587*a* can be electrically connected to each other.

An electrophoresis element can be used instead of the twist ball. A microcapsule with a diameter of approximately 10 to 200 μm in which a transparent liquid, a positively-charged white microparticle, and a negatively-charged black microparticle are included is used. In the microcapsule provided between the first electrode layer and the second electrode layer, the white microparticle and the black microparticle move in opposite directions when an electric field is applied by the first electrode layer and the second electrode layer, so that white and black can be displayed. A display element which applies this principle is an electrophoresis display element, which is generally referred to as an electronic paper. Since the electrophoresis display element has higher reflectivity than a liquid crystal display element, a supplementary light is not necessary, power consumption is low, and a display portion can be recognized even in a dim place. Moreover, since an image that is displayed once can be kept even in the case where power is not supplied to the display portion, the displayed image can be stored even in the case where a display device with a display function is kept away from a radio wave source.

A transistor may be provided with any structure as long as the transistor can serve as a switching element. Various semiconductors such as an amorphous semiconductor, a crystalline semiconductor, a polycrystalline semiconductor, a microcrystalline semiconductor can be used for the semiconductor layer, and an organic transistor may be formed using an organic compound.

Although, specifically, the case of the active matrix display device is described in this embodiment mode, it is needless to say that the present invention can be applied to a passive matrix display device. Also in the passive matrix display device, a wiring layer, an electrode layer, or the like may be formed in such a manner that a conductive light-absorbing film is formed over a transfer substrate, and then is processed into a desired shape by laser light irradiation to be selectively formed over a substrate to which the light-absorbing film is transferred.

This embodiment mode can be freely combined with above-described Embodiment Modes 1 to 3, as appropriate.

By the present invention, a component such as a wiring included in a display device can be formed with a desired shape. Moreover, a complicated photolithography step is reduced and the display device can be manufactured by a simplified process. Thus, materials are seldom wasted and reduction in cost can be achieved. Accordingly, a high-performance and highly reliable display device can be manufactured with high yield.

Embodiment Mode 12

Next, a mode in which a driver circuit for driving is mounted on a display panel formed according to Embodiment Modes 4 to 11 will be explained.

First, a display device employing a COG method is explained with reference to FIG. 26A. A pixel portion 2701 for displaying information such as characters or images is provided over a substrate 2700. A substrate provided with a plurality of driver circuits is divided into rectangles, and a driver circuit 2751 after division (also referred to as a driver IC) is mounted on the substrate 2700. FIG. 26A shows a mode of mounting a plurality of driver ICs 2751 and FPCs 2750 mounted on the end of the driver ICs 2751. In addition, the size obtained after division may be made almost the same as the length of a side of the pixel portion on a signal line side, and a tape may be mounted on the end of the single driver IC.

Alternatively, a TAB method may be employed. In that case, a plurality of tapes may be attached and driver ICs may be mounted on the tapes as shown in FIG. 26B. Similarly to the case of the COG method, a single driver IC may be mounted on a single tape. In this case, a metal piece or the like for fixing the driver IC may be attached together in terms of intensity.

A plurality of driver ICs to be mounted on the display panel are preferably formed over a rectangular substrate having a side of 300 to 1000 mm for the sake of improvement in productivity.

In other words, a plurality of circuit patterns each including a driver circuit portion and an input-output terminal as a unit may be formed over the substrate and may be lastly divided to be used. In consideration of the side length of the pixel portion or the pixel pitch, the driver IC may be formed to be a rectangle having a long side of 15 to 80 mm and a short side of 1 to 6 mm. Alternatively, the driver IC may be formed to have the same side length as that of the pixel portion, or a total length of a side length of the pixel portion and a side length of each driver circuit.

An advantage of the external dimension of the driver IC over an IC chip is the length of the long side. When the driver IC having a long side length of 15 mm to 80 mm is used, the number of the driver ICs necessary for being mounted in accordance with the pixel portion is less than that in the case of using an IC chip. Therefore, yield in manufacturing can be improved. When a driver IC is formed over a glass substrate, productivity is not decreased because there is no limitation on the shape of a substrate used as a mother body. This is a great advantage compared with the case of taking IC chips out of a circular silicon wafer.

When a scanning line driver circuit 3702 is formed over the same substrate as the pixel portion, as shown in FIG. 25B, a driver IC provided with a signal line driver circuit is mounted on a region outside a pixel portion 3701. The driver IC is a signal line driver circuit. In order to form a pixel portion corresponding to RGB full color, 3072 signal lines are necessary for an XGA class and 4800 signal lines are necessary for a UXGA class. The signal lines formed in such a number are divided into several blocks at the end of the pixel portion 3701, and lead lines are formed. The signal lines are gathered corresponding to the pitches of output terminals of the driver ICs.

The driver IC is preferably formed of a crystalline semiconductor formed over a substrate. The crystalline semiconductor is preferably formed by irradiation of continuous wave laser light. Therefore, a continuous wave solid-state or gas laser is used for an oscillator for generating the laser light. There are few crystal defects when a continuous wave laser is used, and as a result, a transistor can be manufactured using a polycrystalline semiconductor layer with a large grain size. In addition, high-speed driving is possible since mobility or response speed is high, and it is possible to further improve an operating frequency of an element than that of a conventional element. Therefore, high reliability can be obtained because there is little variation in characteristics. It is to be noted that the channel length direction of the transistor and a moving direction of laser light may be arranged in the same direction to further improve the operating frequency. This is because the highest mobility can be obtained when the channel length direction of the transistor and the scanning direction of laser light with respect to a substrate are almost parallel to each other (preferably, greater than or equal to −30° and less than or equal to 30°) in a step of laser crystallization with a continuous wave laser. It is to be noted that the channel length direction corresponds to a current flowing direction, in other words, a direction in which electric charge moves, in a channel formation region. The transistor manufactured as described above has an active layer including a polycrystalline semiconductor layer in which a crystal grain is extended in the channel length direction, and this means that a crystal grain boundary is formed almost along the channel length direction.

In order to perform laser crystallization, it is preferable to significantly narrow down the laser light, and the shape of the laser light (beam spot) preferably has the same width as that of a short side of the driver ICs, greater than or equal to approximately 1 mm and less than or equal to 3 mm. In addition, in order to secure enough and efficient energy density for an object to be irradiated, an region irradiated with the laser light preferably has a linear shape. The term "linear" used herein refers to not a line in a strict sense but a rectangle or an oblong with a large aspect ratio. For example, the linear shape refers to a shape with an aspect ratio of greater than or equal to 2 (preferably greater than or equal to 10 and less than or equal to 10000). Thus, when a width of the laser light shape (beam spot) is made to be the same length as a short side of the driver ICs, a method for manufacturing a display device, of which productivity is improved, can be provided.

As shown in FIGS. 26A and 26B, driver ICs may be mounted as both the scanning line driver circuit and the signal line driver circuit. In this case, it is preferable to use the driver ICs having different specifications for the scanning line driver circuit and the signal line driver circuit.

In the pixel portion, the signal line and the scanning line intersect to form a matrix, and transistors are arranged corresponding to each intersection. One feature of the present invention is that a TFt having an amorphous semiconductor or a semiamorphous semiconductor as a channel portion is used as the transistor arranged in the pixel portion. The amorphous semiconductor is formed by a method such as a plasma CVD method or a sputtering method. The semiamorphous semiconductor can be formed by a plasma CVD method at a temperature of less than or equal to 300° C. A film thickness necessary to form the transistor is formed at short times even in the case of using, for example, a non-alkaline glass substrate with an external size of 550 mm×650 mm. The feature of such a manufacturing technique is effective for manufacturing a large-size display device. In addition, a semiamorphous TFT can obtain field effect mobility of 2 to 10 $cm^2/V \cdot sec$ by formation of a channel formation region, using a SAS. When the present invention is applied, a minute wiring can be stably formed without a defect such as a short circuit because a pattern can be formed into a desired shape with high controllability. Thus, a display panel in which system-on-panel is realized can be manufactured.

The scanning line driver circuit can also be formed over the substrate with the use of a TFT having a semiconductor layer formed of a SAS. In the case of using a TFT having a semiconductor layer formed of an AS, the driver ICs may be mounted as both the scanning line driver circuit and the signal line driver circuit.

In that case, it is preferable to use the driver ICs having different specifications for the scanning line driver circuit and the signal line driver circuit. For example, it is necessary that a transistor included in the scanning line driver IC withstands voltage of approximately 30 V; however, a driving frequency thereof is less than or equal to 100 kHz, and high-speed operation is not relatively required. Therefore, it is preferable to set a channel length (L) of the transistor included in the scanning line driver sufficiently long. On the other hand, it is necessary that a transistor of the signal line driver IC withstands voltage of only approximately 12 V; however, a driving frequency thereof is around 65 MHz at 3 V, and high-speed operation is required. Therefore, it is preferable to set a channel length or the like of the transistor included in a driver on a micron rule.

A method for mounting the driver IC is not particularly limited, and a COG method, a wire bonding method, or a TAB method can be employed.

When the thicknesses of the driver IC and the opposite substrate are set equal to each other, the heights of the driver IC and the opposite substrate are almost equal, which contributes to reduction in thickness of a display device as a whole. When both substrates are formed of the same material, thermal stress is not generated and characteristics of a circuit including a TFT are not damaged even when a temperature change is caused in the display device. Furthermore, the number of the driver ICs to be mounted can be reduced when longer driver ICs than IC chips are mounted as driver circuits, as described in this embodiment mode.

In this manner, a driver circuit can be incorporated in a display panel.

Embodiment Mode 13

An example in which a semiconductor layer is formed of an amorphous semiconductor or a SAS and a scanning line driver circuit is formed over a substrate in a display panel (an EL display panel and a liquid crystal display panel) manufactured according to Embodiment Modes 4 to 11 will be described.

Figure 31:
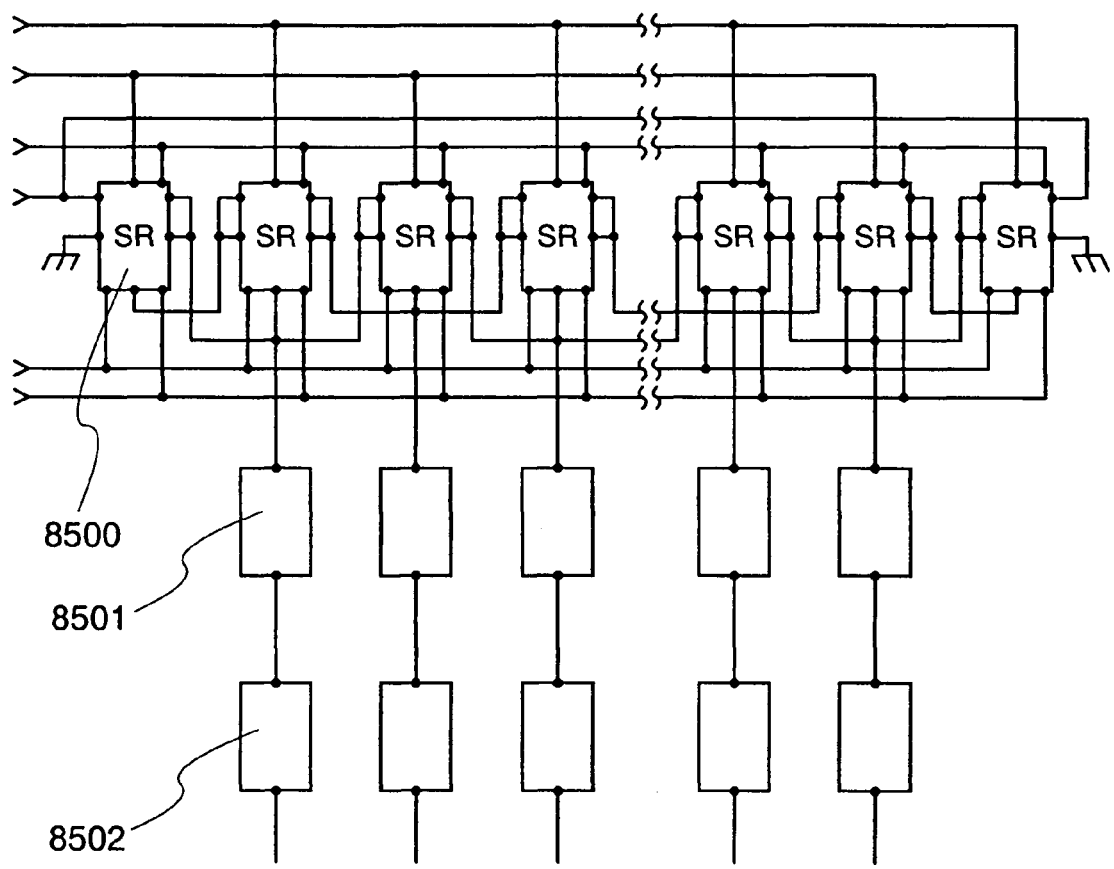
FIG. 31 is a diagram explaining a circuit configuration in the case where a scanning line driver circuit is formed of a TFT in a display panel of the present invention.

FIG. 31 is a block diagram of a scanning line driver circuit formed of an n-channel TFT that uses a SAS, in which an electric field effect mobility of 1 to 15 $cm^2/V \cdot sec$ can be obtained.

In FIG. 31, a block 8500 corresponds to a pulse output circuit outputting a sampling pulse for one stage. A shift register includes n pieces of pulse output circuits. Reference numeral 8501 denotes a buffer circuit and a pixel 8502 is connected to an end of the buffer circuit.

Figure 32:
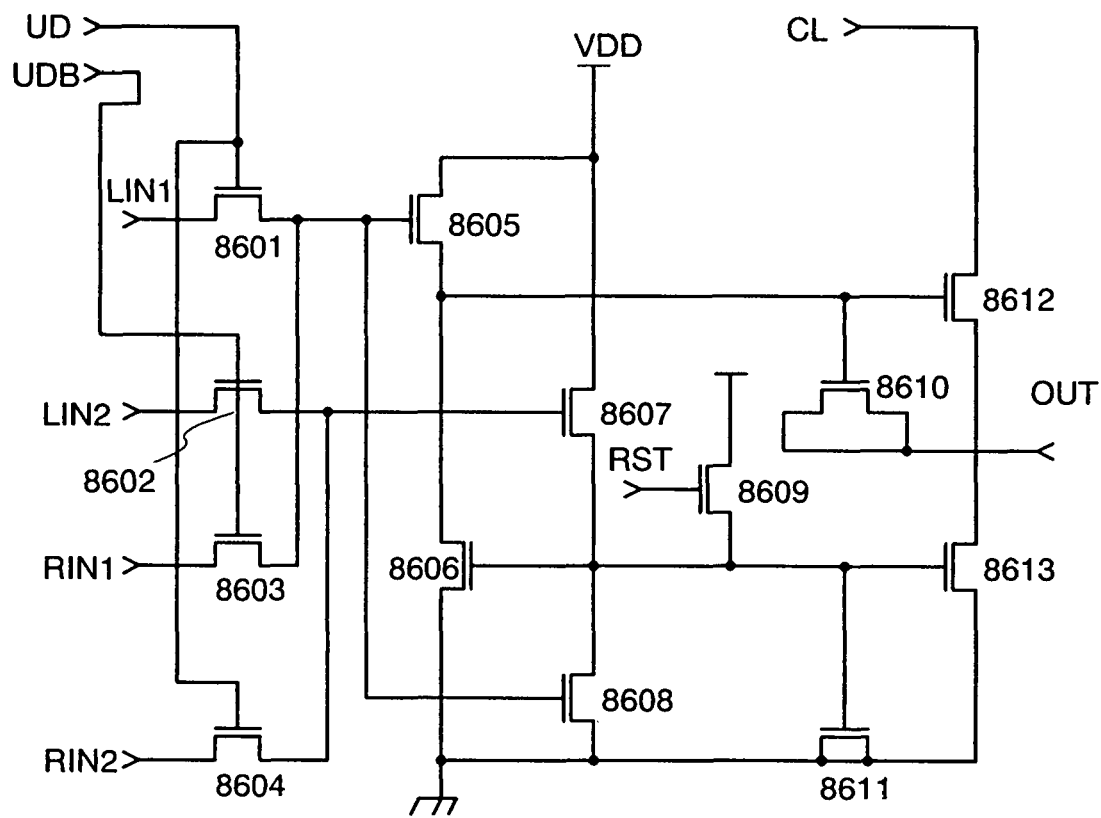
FIG. 32 is a diagram explaining a circuit configuration in the case where a scanning line driver circuit is formed of a TFT in a display panel of the present invention (a shift register circuit)

FIG. 32 shows a specific configuration of the pulse output circuit 8500, where the circuit includes n-channel TFTs 8601 to 8613. In this case, the size of each of the TFTs may be determined in consideration of operation characteristics of the n-channel TFTs using a SAS. For example, when the channel length is set to be 8 μm, the channel width can be set to be in the range of 10 to 80 μm.

Figure 33:
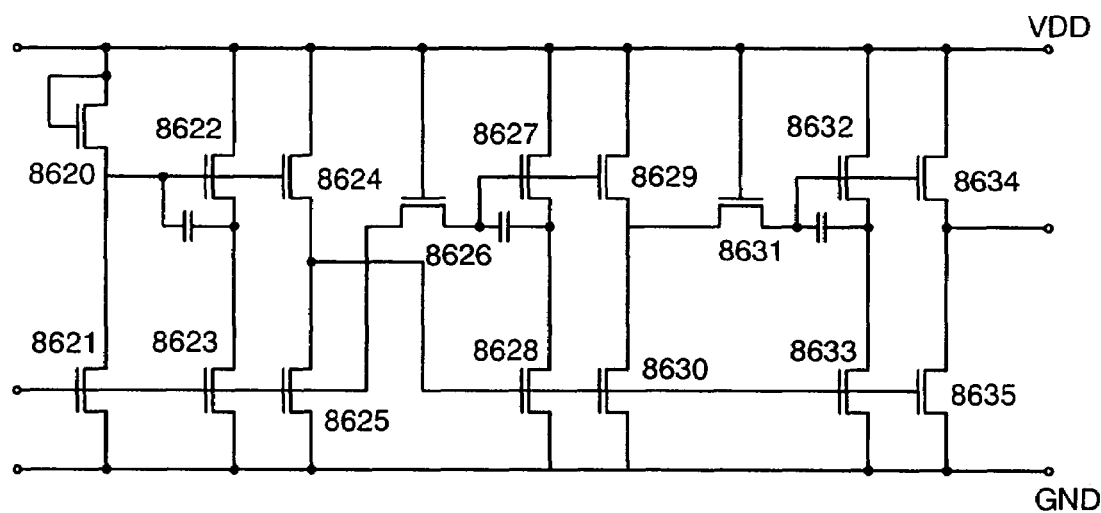
FIG. 33 is a diagram explaining a circuit configuration in the case where a scanning line driver circuit is formed of a TFT in a display panel of the present invention (a buffer circuit)

Further, a specific configuration of the buffer circuit 8501 is shown in FIG. 33. Similarly, the buffer circuit includes n-channel TFTs 8620 to 8635. In this case, the size of each of the TFTs may be determined in consideration of operation characteristics of the n-channel TFTs using a SAS. For example, when the channel length is set to be 10 μm, the channel width can be set to be in the range of 10 to 1800 μm.

In order to realize such a circuit, it is necessary that TFTs are connected to each other by wirings.

In this manner, a driver circuit can be incorporated in a display panel.

Embodiment Mode 14

Figure 16:
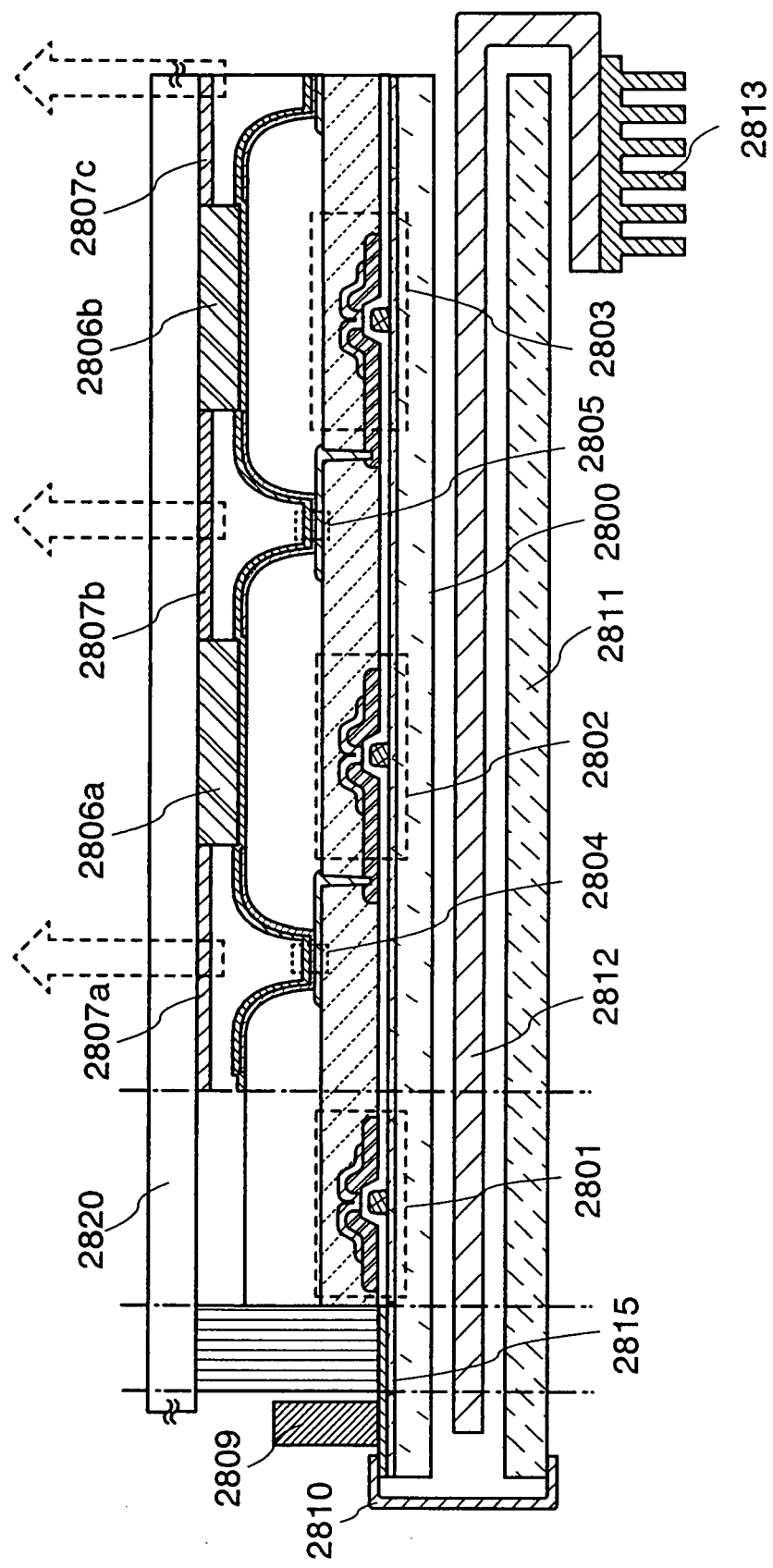
FIG. 16 is a cross-sectional view explaining a structural example of a display module of the present invention.

This embodiment mode will be explained with reference to FIG. 16. FIG. 16 shows an example in which an EL display module is formed using a TFT substrate 2800 manufactured by the present invention. In FIG. 16, a pixel portion including a pixel is formed over the TFT substrate 2800.

In FIG. 16, a TFT which has a similar structure as that formed in the pixel, or a protective circuit portion 2801 operated in a similar manner to a diode by connection of a gate to either a source or a drain of the TFT is provided between a driver circuit and the pixel, which is the outside of the pixel portion. A driver IC formed of a single crystal semiconductor, a stick driver IC formed of a polycrystalline semiconductor film over a glass substrate, a driver circuit formed of a SAS, or the like is applied to a driver circuit 2809.

The TFT substrate 2800 is fixed to a sealing substrate 2820 with spacers 2806a and 2806b interposed therebetween, which are formed by a droplet discharging method. The spacers are preferably provided to keep a distance between two substrates constant even when the substrate is thin or an area of the pixel portion is enlarged. A space between the TFT substrate 2800 and the sealing substrate 2820 over light-emitting elements 2804 and 2805 connected to TFTs 2802 and 2803, respectively, may be filled with a resin material which transmits at least visible light and the resin material may be solidified. Alternatively, the space may be filled with anhydrous nitrogen or an inert gas.

FIG. 16 shows the case where each of the light-emitting elements 2804 and 2805 have a structure of top emission mode, which emits light in the direction of arrows shown in the drawing. Multicolor display can be performed when the pixels are made to emit light of different colors of red, green, and blue. At this time, color purity of light emitted outside can be improved by formation of colored layers 2807a to 2807c corresponding to respective colors on the sealing substrate 2820 side. Moreover, pixels may be used as a pixel which emits white light and may be combined with the colored layers 2807a to 2807c.

The driver circuit 2809 which is an external circuit is connected to a scanning line connection terminal or a signal line connection terminal which is provided at one end of an external circuit substrate 2811 with a wiring board 2810. In addition, a heat pipe 2813 that is a high-efficiency heat conduction device with a pipe-like shape and a heat sink 2812, which are used to conduct heat to the outside of a device, may be provided to be in contact with or adjacent to the TFT substrate 2800 to increase a heat radiation effect.

It is to be noted that FIG. 16 shows the top emission EL module; however, a bottom emission mode may be employed by change of the structure of the light-emitting element or the placement of the external circuit board. Needless to say, a dual emission mode in which light is emitted from both sides of the top and bottom surfaces may be used. In the case of the top emission mode, the insulating layer serving as a partition wall may be colored to be used as a black matrix. This partition wall can be formed by a droplet discharging method and it may be formed in such a manner that a pigment-based black resin, carbon black, or the like is mixed into a resin material such as polyimide. A stacked layer thereof may also be used.

In addition, reflected light of light entering from the outside may be blocked with the use of a retardation film or a polarizing plate in the EL display module. In the case of a top emission display device, an insulating layer serving as a partition wall may be colored to be used as a black matrix. This partition wall can be formed by a droplet discharging method or the like. Carbon black or the like may be mixed into a pigment-based black resin or a resin material such as polyimide, and a stacked layer thereof may also be used. By a droplet discharging method, different materials may be discharged to the same region plural times to form the partition wall. A quarter wave plate and a half wave plate may be used as the retardation films and may be designed to be able to control light. As the structure, the light-emitting element, the sealing substrate (sealant), the retardation films (quarter wave plate and half wave plate), and the polarizing plate are sequentially formed over a TFT element substrate, and light emitted from the light-emitting element is transmitted therethrough and emitted outside from the polarizing plate side. The retardation films or polarizing plate may be provided on a side through which light passes or may be provided on both sides in the case of a dual emission display device in which light is emitted from both sides. In addition, an anti-reflection film may be provided on the outer side of the polarizing plate. Accordingly, a higher-definition and more accurate image can be displayed.

As for the TFT substrate 2800, a sealing structure may be formed in such a manner that a resin film is attached to the side where the pixel portion is formed, with the use of a sealant or an adhesive resin. In this embodiment mode, glass sealing using a glass substrate is described; however, various sealing methods such as resin sealing using a resin, plastic sealing using plastic, and film sealing using a film can be employed. A gas barrier film which prevents moisture from penetrating the resin film is preferably provided on the surface of the resin film. When a film sealing structure is employed, further reduction in thickness and weight can be achieved.

This embodiment mode can be implemented in combination with each of Embodiment Modes 1 to 8, 12, and 13.

Embodiment Mode 15

This embodiment mode will be explained with reference to FIGS. 20A and 20B. FIGS. 20A and 20B show an example in which a liquid crystal display module is formed using a TFT substrate 2600 manufactured according to the present invention.

FIG. 20A shows an example of a liquid crystal display module, in which the TFT substrate 2600 and an opposite substrate 2601 are fixed to each other with a sealant 2602, and a pixel portion 2603 and a liquid crystal layer 2604 are provided between the substrates to form a display region. A colored layer 2605 is necessary to perform color display. In the case of the RGB system, colored layers corresponding to respective colors of red, green, and blue are provided for respective pixels. The outer sides of the TFT substrate 2600 and the opposite substrate 2601 are provided with polarizing plates 2606 and 2607, and a diffuse plate 2613. A light source includes a cold cathode tube 2610 and a reflector plate 2611. A circuit substrate 2612 is connected to the TFT substrate 2600 by a flexible wiring board 2609. External circuits such as a control circuit and a power supply circuit are incorporated in the circuit substrate 2612. In addition, the polarizing plate and the liquid crystal layer may be stacked with a retardation film interposed therebetween.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like.

FIG. 20B shows an example in which an OCB mode is applied to the liquid crystal display module shown in FIG. 20A, and the liquid crystal display module is FS-LCD (Field sequential-LCD). The FS-LCD performs red, green, and blue light emissions in one frame period. Color display can be performed by composition of an image by a time division method. Also, light emission of each color is performed using a light emitting diode, a cold cathode tube, or the like; therefore, a color filter is not necessary. Accordingly, there is no necessity to arrange color filters of three primary colors and limit a display region of each color. Display of all three colors can be performed in any region. On the other hand, light emission of three colors is performed in one frame period; therefore, high speed response of liquid crystal is necessary. When an FLC mode using an FS system and the OCB mode are applied to the display device of the present invention, a display device or a liquid crystal television device with high performance and high image quality can be completed.

A liquid crystal layer of the OCB mode has a so-called π cell structure. In the π cell structure, liquid crystal molecules are oriented such that pretilt angles of the liquid molecules are symmetrical with respect to the center plane between the active matrix substrate and the opposite substrate. The orientation in the π cell structure is a splay orientation when voltage is not applied between the substrates, and shifts into a bend orientation when voltage is applied. White display is performed by this bend orientation. Further application of voltage makes the liquid crystal molecules in the bend orientation orientated perpendicular to the substrates, which does not allow light to pass therethrough. It is to be noted that approximately ten times as high response speed as that of a conventional TN mode can be achieved with the use of the OCB mode.

In addition, as a mode corresponding to the FS system, an HV (Half V)-FLC, an SS (Surface Stabilized)-FLC, or the like using a ferroelectric liquid crystal (FLC) that can be operated at high speed can also be used. A nematic liquid crystal that has relatively low viscosity is used for the OCB mode. A smectic liquid crystal that has a ferroelectric phase can be used for the HV-FLC or the SS-FLC.

Optical response speed of the liquid crystal display module is increased when a cell gap of the liquid crystal display module is narrowed. Alternatively, the optical response speed can be increased when the viscosity of the liquid crystal material is lowered. The above method of increasing the optical response speed is more effective when a pixel pitch of a pixel region of a TN mode liquid crystal display module is less than or equal to 30 μm. In addition, the optical response speed can be further increased by an overdrive method in which applied voltage is increased (or decreased) for a moment.

The liquid crystal display module of FIG. 20B is a transmissive type, in which a red light source 2910a, a green light source 2910b, and a blue light source 2910c are provided as light sources. A control portion 2912 is provided to separately control the red light source 2910a, the green light source 2910b, and the blue light source 2910c to be turned on or off. The light emissions of respective colors are controlled by the control portion 2912, and light enters the liquid crystal to compose an image using the time division method, so that color display is performed.

A high-definition and highly reliable liquid crystal display module can be manufactured by the present invention as described above.

This embodiment mode can be implemented in combination with each of Embodiment Modes 1 to 3 and 9 to 13.

Embodiment Mode 16

Figure 27:
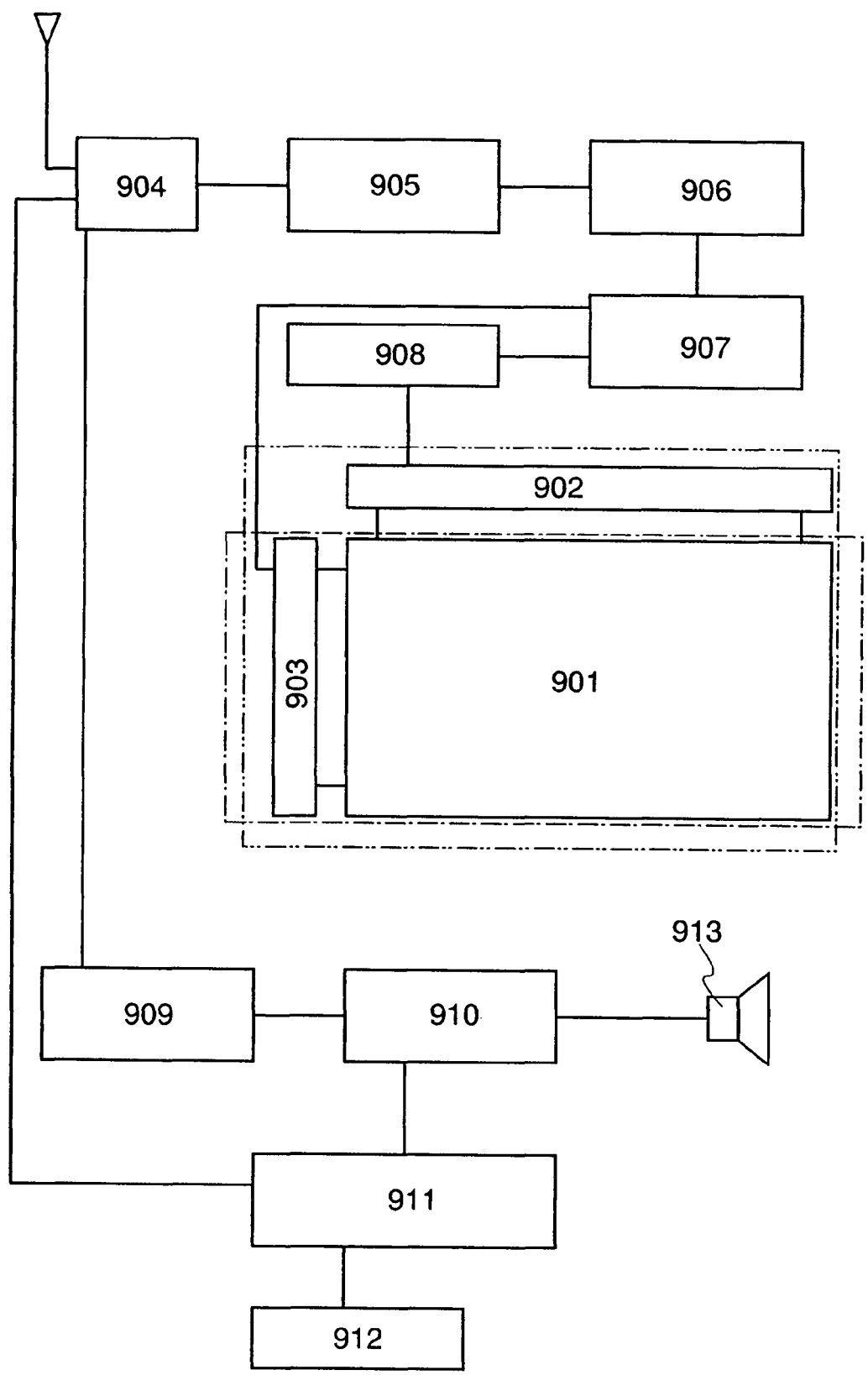
FIG. 27 is a block diagram illustrating a main structure of an electronic appliance to which the present invention is applied.

With the display device formed by the present invention, a television device (also simply referred to as a television, or a television receiver) can be completed. FIG. 27 is a block diagram illustrating a main structure of the television device.

FIG. 25A is a top view showing a structure of a display panel according to the present invention. A pixel portion 2701 in which pixels 2702 are arranged in matrix, a scanning line input terminal 2703, and a signal line input terminal 2704 are formed over a substrate 2700 having an insulating surface. The number of pixels may be determined in accordance with various standards. For example, 1024×768×3 (RGB) in the case of XGA and an RGB full-color display; 1600×1200×3 (RGB) in the case of UXGA and an RGB full-color display; and 1920×1080×3 (RGB) in the case of full-spec high vision and an RGB full-color display.

The pixels 2702 are arranged in matrix by intersections of scanning lines extending from the scanning line input terminal 2703 and signal lines extending from the signal line input terminal 2704. Each pixel 2702 in the pixel portion 2701 is provided with a switching element and a pixel electrode layer connected thereto. A typical example of the switching element is a TFT. A gate electrode layer of the TFT is connected to the scanning line, and a source or a drain of the TFT is connected to the signal line, which enables each pixel to be independently controlled by a signal inputted from the outside.

FIG. 25A shows a structure of a display panel in which a signal to be inputted to the scanning line and the signal line is controlled by an external driver circuit. Alternatively, a driver IC 2751 may be mounted on the substrate 2700 by a COG (Chip On Glass) method as shown in FIG. 26A. As another mounting mode, a TAB (Tape Automated Bonding) method may be used as shown in FIG. 26B. The driver IC may be formed over a single crystal semiconductor substrate or may be formed using a TFT over a glass substrate. In each of FIGS. 26A and 26B, the driver IC 2751 is connected to an FPC (Flexible Printed Circuit) 2750.

Figure 25C:
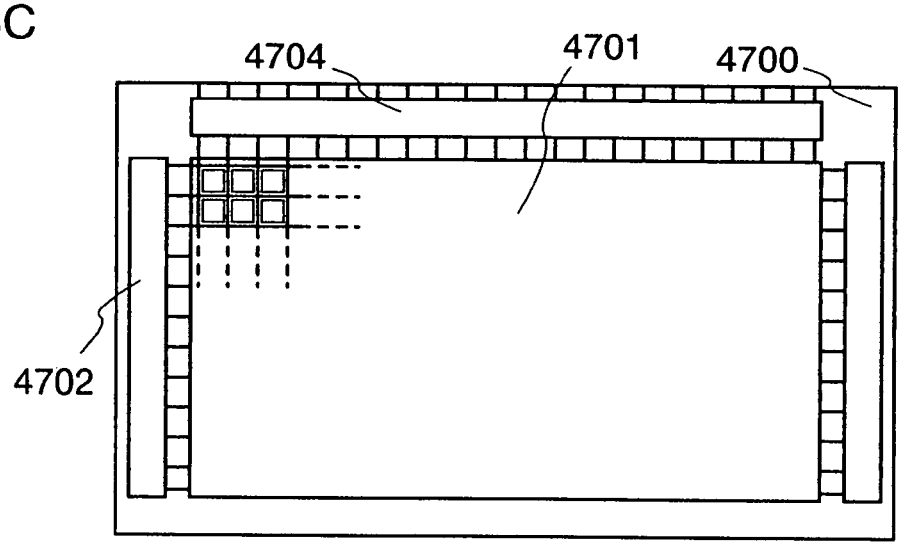

When a TFT provided in a pixel is formed of a crystalline semiconductor, a scanning line driver circuit 3702 can be formed over a substrate 3700 as shown in FIG. 25B. In FIG. 25B, a pixel portion 3701 is controlled by an external driver circuit connected to a signal line input terminal 3704, similarly to the structure shown in FIG. 25A. When the TFT provided in a pixel is formed of a polycrystalline (microcrystalline) semiconductor, a single crystal semiconductor, or the like having high mobility, a pixel portion 4701, a scanning line driver circuit 4702, and a signal line driver circuit 4704 can all be formed over a glass substrate 4700 as shown in FIG. 25C.

As for the display panel, as the structure as shown in FIG. 25A, there are the following cases: a case where only a pixel portion 901 is formed as shown in FIG. 27 and a scanning line driver circuit 903 and a signal line driver circuit 902 are mounted by a TAB method as shown in FIG. 26B; a case where the scanning line driver circuit 903 and the signal line driver circuit 902 are mounted by a COG method as shown in FIG. 26A; a case where a TFT is formed as shown in FIG. 25B, the pixel portion 901 and the scanning line driver circuit 903 are formed over a substrate, and the signal line driver circuit 902 is separately mounted as a driver IC; a case where the pixel portion 901, the signal line driver circuit 902, and the scanning line driver circuit 903 are formed over a substrate as shown in FIG. 27; and the like. The display panel may have any of the modes.

As another external circuit in FIG. 27, a video signal amplifier circuit 905 which amplifies a video signal among signals received by a tuner 904, a video signal processing circuit 906 which converts the signals outputted from the video signal amplifier circuit 905 into chrominance signals corresponding to respective colors of red, green, and blue, a control circuit 907 which converts the video signal into an input specification of the driver IC, and the like are provided on an input side of the video signal. The control circuit 907 outputs signals to both a scanning line side and a signal line side. In the case of digital driving, a signal dividing circuit 908 may be provided on the signal line side and an input digital signal may be divided into m pieces and supplied.

An audio signal among signals received by the tuner 904 is sent to an audio signal amplifier circuit 909 and is supplied to a speaker 913 through an audio signal processing circuit 910. A control circuit 911 receives control information of a receiving station (reception frequency) or sound volume from an input portion 912 and transmits signals to the tuner 904 and the audio signal processing circuit 910.

Figure 28A:
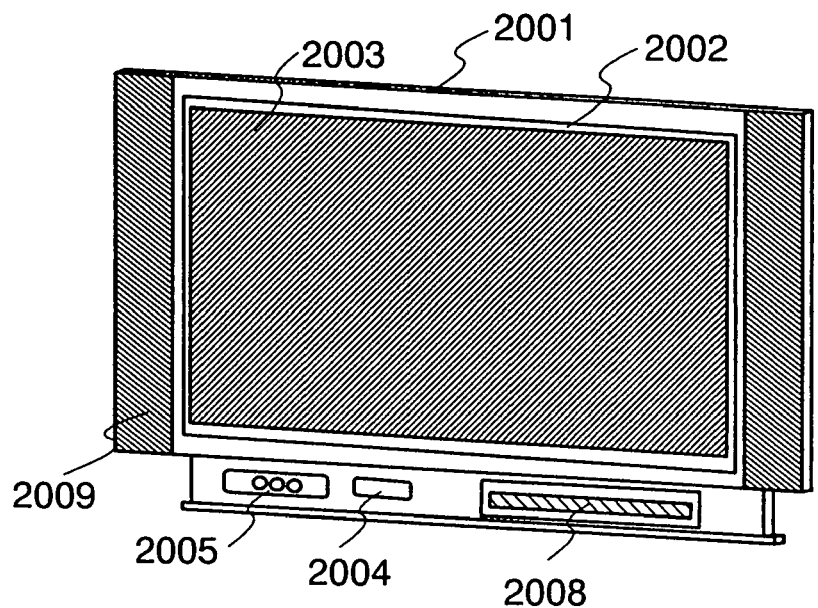
FIGS. 28A and 28B are views each illustrating an electronic appliance to which the present invention is applied.
Figure 28B:
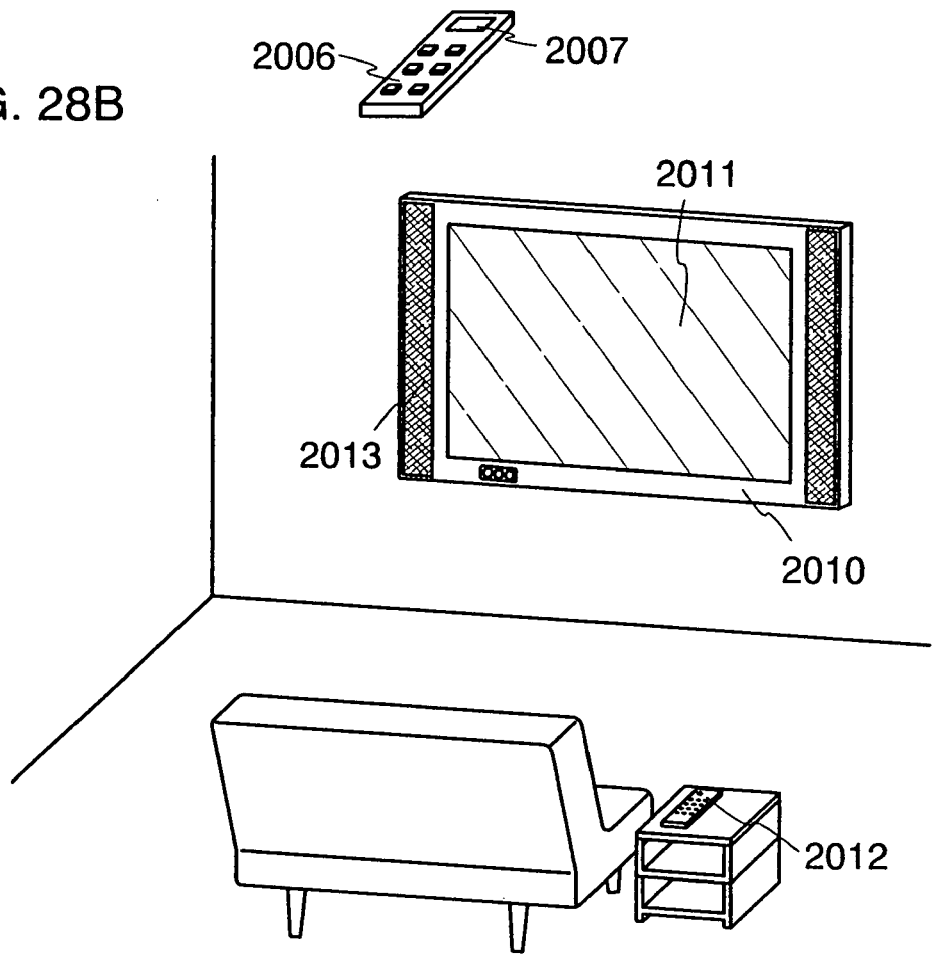

The display module is incorporated into a chassis as shown in FIGS. 28A and 28B, so that a television device can be completed. When a liquid crystal display module is used as a display module, a liquid crystal television device can be manufactured. When an EL module is used as a display module, an EL television device can be manufactured. In addition, a plasma television, an electronic paper, or the like can be manufactured. In FIG. 28A, a main screen 2003 is formed using the display module, and a speaker portion 2009, an operation switch, and the like are provided as its accessory equipment. Thus, a television device can be completed according to the present invention.

A display panel 2002 is incorporated in a chassis 2001, and general TV broadcast can be received by a receiver 2005. When the display device is connected to communication network by wired or wireless connections via a modem 2004, one-way (from a sender to a receiver) or two-way (between a sender and a receiver or between receivers) information communication can be performed. The television device can be operated with the use of a switch built in the chassis 2001 or a remote control device 2006. A display portion 2007 for displaying output information may also be provided in the remote control device 2006.

Further, the television device may include a sub screen 2008 formed using a second display panel so as to display channels, volume, or the like, in addition to the main screen 2003. In this structure, both the main screen 2003 and the sub screen 2008 can be formed using the liquid crystal display panel of the present invention. Alternatively, the main screen 2003 may be formed using an EL display panel having a wide viewing angle, and the sub screen 2008 may be formed using a liquid crystal display panel capable of displaying images with less power consumption. In order to reduce the power consumption preferentially, the main screen 2003 may be formed using a liquid crystal display panel, and the sub screen may be formed using an EL display panel, which can be switched on and off. By the present invention, a highly reliable display device can be formed even when a large-size substrate is used and a large number of TFTs or electronic components are used.

FIG. 28B shows a television device having a large-size display portion, for example, a 20 to 80-inch display portion. The television device includes a chassis 2010, a display portion 2011, a remote control device 2012 that is an operation portion, a speaker portion 2013, and the like. The present invention is applied to manufacture of the display portion 2011. Since the television device in FIG. 28B is a wall-hanging type, a large installation space is not necessary.

Needless to say, the present invention is not limited to the television device, and can be applied to various use applications as a large-size display medium such as an information display board at a train station, an airport, or the like, or an advertisement display board on the street, as well as a monitor of a personal computer.

This embodiment mode can be freely combined with above-described Embodiment Modes 1 to 15, as appropriate.

Embodiment Mode 17

Examples of electronic devices according to the present invention are as follows: a television device (also simply referred to as a television or a television receiver), a camera such as a digital camera or a digital video camera, a cellular telephone device (also simply referred to as a cellular phone or a cell-phone), an information terminal such as PDA, a portable game machine, a computer monitor, a computer, a sound reproducing device such as a car audio system, an image reproducing device including a recording medium, such as a home-use game machine, and the like. Specific examples are explained with reference to FIGS. 29A to 29E.

Figure 29A:
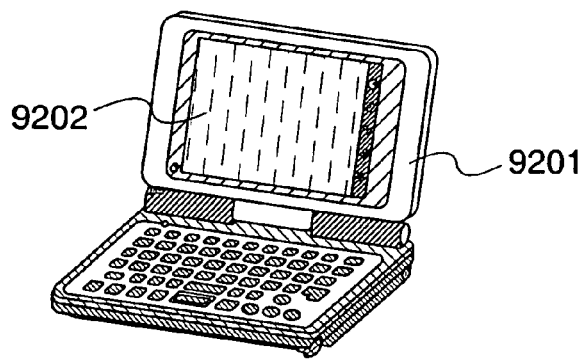
FIGS. 29A to 29E are views each illustrating an electronic appliances to which the present invention is applied.

A portable information terminal device shown in FIG. 29A includes a main body 9201, a display portion 9202, and the like. The display device of the present invention can be applied to the display portion 9202. As a result, the display device can be manufactured by a simplified process at low cost. Thus, a highly reliable portable information terminal device can be provided at a low price.

Figure 29B:
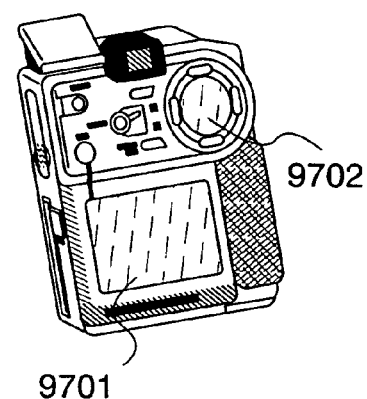

A digital video camera shown in FIG. 29B includes a display portion 9701, a display portion 9702, and the like. The display device of the present invention can be applied to the display portion 9701. As a result, the display device can be manufactured by a simplified process at low cost. Thus, a highly reliable digital video camera can be provided at a low price.

Figure 29C:
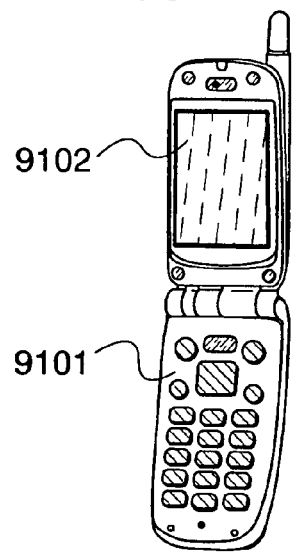

A cellular phone shown in FIG. 29C includes a main body 9101, a display portion 9102, and the like. The display device of the present invention can be applied to the display portion 9102. As a result, the display device can be manufactured by a simplified process at low cost. Thus, a highly reliable cellular phone can be provided at a low price.

Figure 29D:
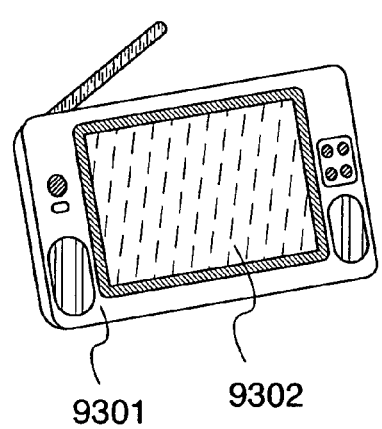

A portable television device shown in FIG. 29D includes a main body 9301, a display portion 9302, and the like. The display device of the present invention can be applied to the display portion 9302. As a result, the display device can be manufactured by a simplified process at low cost. Thus, a highly reliable television device can be provided at a low price. The display device of the present invention can be applied to a wide range of television devices such as a small-size television device mounted on a portable terminal such as a cellular phone, a medium-size television device which can be carried, and a large-size (for example, greater than or equal to 40-inch) television device.

Figure 29E:
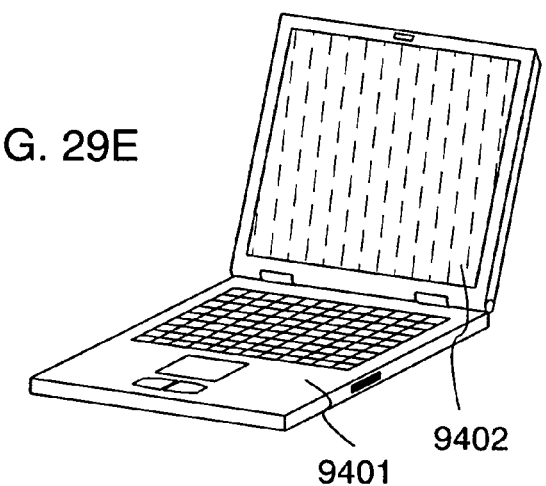

A portable computer shown in FIG. 29E includes a main body 9401, a display portion 9402, and the like. The display device of the present invention can be applied to the display portion 9402. As a result, the display device can be manufactured by a simplified process at low cost. Thus, a highly reliable computer can be provided at a low price.

As described above, by the display device of the present invention, a highly reliable electronic appliance can be provided at a low price.

This embodiment mode can be freely combined with above-described Embodiment Modes 1 to 16, as appropriate.

This application is based on Japanese Patent Application serial no. 2006-205624 filed in Japan Patent Office on Jul. 28, 2006, the entire contents of which are hereby incorporated by reference.

What is claimed is:

1. A method for manufacturing a display device comprising:
   forming a light-absorbing layer;
   forming an insulating layer over the light-absorbing layer;
   selectively emitting a laser light to the light-absorbing layer and the insulating layer to remove an irradiated region of the light-absorbing layer and an irradiated region of the insulating layer, so that an opening is formed in the light-absorbing layer and the insulating layer; and
   forming a conductive film in the opening so as to be in contact with the light-absorbing layer, and
   wherein the light-absorbing layer contains a conductive material.

2. A method for manufacturing a display device comprising:
   forming a light-absorbing layer;
   forming an insulating layer over the light-absorbing layer;
   selectively emitting a laser light to the light-absorbing layer and the insulating layer to remove part of an irradiated region of the light-absorbing layer and an irradiated region of the insulating layer, so that an opening is formed in the light-absorbing layer and the insulating layer; and forming a conductive film in the opening so as to be in contact with the light-absorbing layer, and wherein the light-absorbing layer contains a conductive material.

3. A method for manufacturing a display device comprising:

forming a conductive layer;

forming a light-absorbing layer over the conductive layer;

forming an insulating layer over the light-absorbing layer;

selectively emitting a laser light to the light-absorbing layer and the insulating layer to remove an irradiated region of the light-absorbing layer and an irradiated region of the insulating layer, so that an opening is formed in the light-absorbing layer and the insulating layer; and forming a conductive film in the opening so as to be in contact with the light-absorbing layer and the conductive layer, and wherein the light-absorbing layer contains a conductive material.

4. A method for manufacturing a display device comprising:

forming a conductive layer;

forming a light-absorbing layer over the conductive layer;

forming an insulating layer over the light-absorbing layer;

selectively emitting a laser light to the light-absorbing layer and the insulating layer to remove part of an irradiated region of the light-absorbing layer and an irradiated region of the insulating layer, so that an opening is formed in the light-absorbing layer and the insulating layer; and forming a conductive film in the opening so as to be in contact with the light-absorbing layer, and wherein the light-absorbing layer contains a conductive material.

5. A method for manufacturing a display device comprising:

forming a conductive layer;

forming a light-absorbing layer over the conductive layer;

forming an insulating layer over the light-absorbing layer;

selectively emitting a laser light to the light-absorbing layer and the insulating layer to remove part of the conductive layer, an irradiated region of the light-absorbing layer, and an irradiated region of the insulating layer, so that an opening is formed in the conductive layer, the light-absorbing layer, and the insulating layer; and forming a conductive film in the opening so as to be in contact with the light-absorbing layer and the conductive layer.

6. A method for manufacturing a display device according to claim 5, wherein the light-absorbing layer contains a conductive material.

7. A method for manufacturing a display device according to claim 6, wherein the light-absorbing layer contains chromium, tantalum, silver, molybdenum, nickel, titanium, cobalt, copper, or aluminum.

8. A method for manufacturing a display device according to claim 5, wherein the light-absorbing layer contains a semiconductor material.

9. A method for manufacturing a display device according to claim 8, wherein the light-absorbing layer contains silicon.

10. A method for manufacturing a display device according to any one of claims 1 to 5, wherein the insulating layer transmits the laser light.

11. A method for manufacturing a display device according to any one of claims 1 to 5, wherein the display device is one selected from the group consisting of a portable information terminal, a video camera, a cellular phone, a television, and a computer.

12. A method for manufacturing a display device according to any one of claims 1 to 4, wherein the light-absorbing layer contains chromium, tantalum, silver, molybdenum, nickel, titanium, cobalt, copper, or aluminum.

* * * * *

UNITED STATES PATENT AND TRADEMARK OFFICE
CERTIFICATE OF CORRECTION

PATENT NO. : 7,943,287 B2
APPLICATION NO. : 11/881232
DATED : May 17, 2011
INVENTOR(S) : Yamazaki et al.

It is certified that error appears in the above-identified patent and that said Letters Patent is hereby corrected as shown below:

In The Specification:

Column 19, Line 21-22, Change "mariner" to --manner--.

Column 34, Line 6, Change "L1" to --Li--.

Column 45, Line 29, Change "L1" to --Li--.

Column 48, Line 6, Change "(Th)" to --(Tb)--.

Column 48, Line 50, Change "CuCi" to --CuCl--.

Column 61, Line 14, Change "TFt" to --TFT--.

Signed and Sealed this
Sixth Day of December, 2011

David J. Kappos
*Director of the United States Patent and Trademark Office*